(12) United States Patent
Sado et al.

(10) Patent No.: US 11,456,432 B2
(45) Date of Patent: Sep. 27, 2022

(54) TOP EMISSION ORGANIC ELECTROLUMINESCENT ELEMENT, ORGANIC ELECTROLUMINESCENT LIGHT EMITTING DEVICE, AND ELECTRONIC DEVICE

(71) Applicant: IDEMITSU KOSAN CO.,LTD., Tokyo (JP)

(72) Inventors: Takayasu Sado, Sodegaura (JP);
Tetsuya Masuda, Sodegaura (JP);
Yoshiaki Takahashi, Sodegaura (JP);
Emiko Kambe, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 333 days.

(21) Appl. No.: 16/759,788

(22) PCT Filed: Nov. 1, 2018

(86) PCT No.: PCT/JP2018/040734
§ 371 (c)(1),
(2) Date: Apr. 28, 2020

(87) PCT Pub. No.: WO2019/088231
PCT Pub. Date: May 9, 2019

(65) Prior Publication Data
US 2021/0013439 A1    Jan. 14, 2021

(30) Foreign Application Priority Data
Nov. 1, 2017   (JP) .............................. JP2017-212287

(51) Int. Cl.
*H01L 51/50*   (2006.01)
*H01L 51/00*   (2006.01)
*H01L 51/52*   (2006.01)

(52) U.S. Cl.
CPC ........ *H01L 51/5004* (2013.01); *H01L 51/006* (2013.01); *H01L 51/0058* (2013.01);
(Continued)

(58) Field of Classification Search
CPC ......... H01L 2251/5315; H01L 51/5056; H01L 51/5064; H01L 51/5072; H01L 51/5096
See application file for complete search history.

(56) References Cited

U.S. PATENT DOCUMENTS 11,043,638 B2 *   6/2021   Ogiwara ............. H01L 51/0067
2011/0248250 A1   10/2011  D'Andrade et al.
(Continued)

FOREIGN PATENT DOCUMENTS

EP   2 879 196 A1   6/2015
JP   2012-506632 A   3/2012
(Continued)

OTHER PUBLICATIONS

International Searching Authority, "International Search Report," issued in connection with International Patent Application No. PCT/JP2018/040734, dated Jan. 29, 2019.
(Continued)

*Primary Examiner* — Jaehwan Oh
(74) *Attorney, Agent, or Firm* — Foley & Lardner LLP

(57) ABSTRACT

A top emission organic EL device includes an anode, hole transporting zone, emitting layer, electron transporting zone, and cathode in this order. The hole transporting zone includes: a first layer interposed between the anode and the emitting layer; and a second layer interposed between the first layer and the emitting layer. The first layer contains a first compound and the second layer contains a second compound. A film thickness of the first layer and the second layer satisfies a formula (1) and (2), respectively. A hole mobility $\mu^{H1}$ of the first compound satisfies a formula (3) and a hole mobility $\mu^{H2}$ of the second compound satisfies a formula (4), (Continued)

$$100 \text{ nm} \leq d1 \leq 300 \text{ nm} \quad (1)$$

$$1 \text{ nm} \leq d2 \leq 20 \text{ nm} \quad (2)$$

$$1.0 \times 10^{-4} \text{ [cm}^2\text{/Vs]} \leq \mu^{H1} \leq 1.0 \times 10^{-1} \text{ [cm}^2\text{/Vs]} \quad (3)$$

$$1.0 \times 10^{-10} \text{ [cm}^2\text{/Vs]} \leq \mu^{H2} \leq 1.0 \times 10^{-6} \text{ [cm}^2\text{/Vs]} \quad (4).$$

18 Claims, 4 Drawing Sheets

(52) U.S. Cl.
CPC ...... *H01L 51/0061* (2013.01); *H01L 51/0067* (2013.01); *H01L 51/0072* (2013.01); *H01L 51/0074* (2013.01); *H01L 51/0054* (2013.01); *H01L 51/0073* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5218* (2013.01); *H01L 51/5234* (2013.01); *H01L 2251/5315* (2013.01); *H01L 2251/558* (2013.01)

(56) References Cited

U.S. PATENT DOCUMENTS

| | | |
|---|---|---|
| 2012/0138918 A1 | 6/2012 | Naraoka et al. |
| 2013/0105776 A1 | 5/2013 | Ishizuya |
| 2013/0134402 A1 | 5/2013 | Tanaka et al. |
| 2015/0179943 A1 | 6/2015 | Sato |
| 2015/0243891 A1 | 8/2015 | Kato et al. |
| 2015/0280134 A1* | 10/2015 | Kim .................. H01L 51/0072 548/442 |
| 2016/0079542 A1 | 3/2016 | Itoi |
| 2016/0104854 A1 | 4/2016 | Jeon et al. |
| 2017/0033301 A1* | 2/2017 | Han ..................... C09K 11/025 |
| 2017/0155070 A1 | 6/2017 | Han et al. |
| 2017/0179398 A1* | 6/2017 | Yokoyama ........... C07D 401/10 |
| 2017/0271599 A1* | 9/2017 | Hayashi .............. H01L 51/0058 |
| 2017/0358754 A1* | 12/2017 | Hayashi ................ C07C 211/61 |
| 2018/0123043 A1 | 5/2018 | Kato et al. |
| 2019/0051838 A1* | 2/2019 | Yokoyama ............ H01L 51/006 |
| 2020/0287140 A1* | 9/2020 | Chae ................... H01L 51/0052 |
| 2020/0365813 A1* | 11/2020 | Suruga ................ H01L 51/0069 |
| 2021/0135116 A1* | 5/2021 | Mochizuki ............. C09K 11/06 |
| 2021/0143326 A1* | 5/2021 | Kabasawa ........... C07D 413/10 |
| 2021/0336151 A1* | 10/2021 | Tosu .................... C07D 239/26 |

FOREIGN PATENT DOCUMENTS

| | | |
|---|---|---|
| JP | 2013-118176 A | 6/2013 |
| JP | 2015-122459 A | 7/2015 |
| JP | 2017-188619 A | 10/2017 |
| KR | 10-2011-0086021 A | 7/2011 |
| KR | 10-2013-0095652 A | 8/2013 |
| KR | 10-2016-0043891 A | 4/2016 |
| KR | 10-2017-0061522 A | 6/2017 |
| WO | WO-2011/043083 A1 | 4/2011 |
| WO | WO-2012/005329 A | 1/2012 |
| WO | WO-2014/017484 A1 | 1/2014 |
| WO | WO-2014/034795 A1 | 3/2014 |

OTHER PUBLICATIONS

International Searching Authority, "Written Opinion," issued in connection with International Patent Application No. PCT/JP2018/040734, dated Jan. 29, 2019.

International Preliminary Report on Patentability dated May 5, 2020 for corresponding Patent Application No. PCT/JP2018/040734.

* cited by examiner

TOP EMISSION ORGANIC ELECTROLUMINESCENT ELEMENT, ORGANIC ELECTROLUMINESCENT LIGHT EMITTING DEVICE, AND ELECTRONIC DEVICE

CROSS-REFERENCE TO RELATED APPLICATIONS

The present application claims priority under 37 U.S.C. § 371 to International Patent Application No. PCT/JP2018/040734, filed Nov. 1, 2018, which claims priority to and the benefit of Japanese Patent Application No. 2017-212287, filed on Nov. 1, 2017. The contents of these applications are hereby incorporated by reference in their entireties.

TECHNICAL FIELD

The present invention relates to a top emission organic electroluminescence device, an organic electroluminescence apparatus, and an electronic device.

BACKGROUND ART

An organic electroluminescence device (hereinafter, occasionally referred to as "organic EL device") is structured to include an anode, a cathode, and an emitting layer therebetween, in which holes are injected from the anode and electrons are injected from the cathode into the emitting layer, whereby the holes and the electrons are recombined to emit light.

A study for improving a luminous efficiency of the organic EL device has been actively conducted.

For instance, Patent Literature 1 discloses, as an organic EL device material, a specific material in which a dibenzoheterol group having a substituent is introduced into an amine via a linking group. Patent Literature 1 discloses that the luminous efficiency is improvable by having two or more hole transporting layers between the emitting layer and the anode and using the above specific material.

The organic EL device is classified into a bottom emission organic EL device in which the emitted light is extracted from a lower electrode and a top emission organic EL device in which the emitted light is extracted from an upper electrode.

A known top emission organic EL device has a resonator structure (micro cavity structure) that adjusts an intensity of the extracted light with use of light interference.

Patent Literature 2 discloses a top emission organic EL device including a substrate, a first electrode, at least one organic layer including a blue emitting layer, a second electrode, and a capping layer in this order, the capping layer being made of a material having a specific optical property.

CITATION LIST

Patent Literature(s)

Patent Literature 1 US Patent Application Publication No. 2016/0079542
Patent Literature 2 International Publication No. WO2011/043083

SUMMARY OF THE INVENTION

Problems to be Solved by the Invention

However, in the top emission organic EL device, it is usual to provide a relatively thick hole transporting zone (e.g., a hole transporting layer) in order to adjust cavity. Accordingly, in order to improve the luminous efficiency, in addition to consideration of the film thickness of the hole transporting zone, the light interference effect between the light emitted from the light emitting layer and the reflected light due to the reflection of the emitted light is required to be more effectively expressed.

Recently, the top emission organic EL device is required to further increase the luminous efficiency, although the luminous efficiency is gradually improved.

Moreover, since it is believed in the field of the organic EL device that emission control of blue emitting region (usually wavelength region in a range from 430 nm to 480 nm) is difficult, particularly a highly efficient blue emission is required.

An object of the invention is to provide a top emission organic EL device that emits light at a high efficiency, an organic electroluminescence apparatus (hereinafter sometimes referred to as an organic EL apparatus) mounted with the organic EL device, and an electronic device mounted with the organic electroluminescence device.

Means for Solving the Problems

According to an aspect of the invention, a top emission organic electroluminescence device includes: an anode; a cathode; an emitting layer interposed between the anode and the cathode; a hole transporting zone interposed between the anode and the emitting layer; and an electron transporting zone interposed between the cathode and the emitting layer, in which the hole transporting zone includes a first layer interposed between the anode and the emitting layer, and a second layer interposed between the first layer and the emitting layer, the first layer includes a first compound, the second layer includes a second compound, a film thickness $d1$ of the first layer satisfies a formula (1), a film thickness $d2$ of the second layer satisfies a formula (2), a hole mobility $\mu^{H1}$ of the first compound satisfies a formula (3), and a hole mobility $\mu^{H2}$ of the second compound satisfies a formula (4), $$100 \text{ nm} \leq d1 \leq 300 \text{ nm} \tag{1}$$

$$1 \text{ nm} \leq d2 \leq 20 \text{ nm} \tag{2}$$

$$1.0 \times 10^{-4} \text{ [cm}^2/Vs] \leq \mu^{H1} \leq 1.0 \times 10^{-1} \text{ [cm}^2/Vs] \tag{3}$$

$$1.0 \times 10^{-10} \text{ [cm}^2/Vs] \leq \mu^{H2} \leq 1.0 \times 10^{-6} \text{ [cm}^2/Vs] \tag{4}$$

Another aspect of the invention provides an organic electroluminescence apparatus including: a first device that is the top emission organic EL device according to the above aspect of the invention; a second device that is an organic electroluminescence device different from the fluorescent first device; and a substrate, wherein the first device and the second device are mutually juxtaposed on the substrate, and at least one of the first layer or the second layer of the first device is a common layer provided over the first device and the second device in a shared manner.

Still another aspect of the invention provides an electronic device including the top emission organic electroluminescence device according to the above aspect of the invention.

With the above arrangement, the top emission organic EL device capable of emitting light with a high efficiency can be provided.

With the above arrangement, the organic EL apparatus provided with the top emission organic EL device capable of emitting light with a high efficiency can be provided.

With the above arrangement, the electronic device provided with the top emission organic EL device capable of emitting light with a high efficiency can be provided.

DESCRIPTION OF EMBODIMENT(S)

Top Emission Organic EL Device

First Exemplary Embodiment

Figure 1:
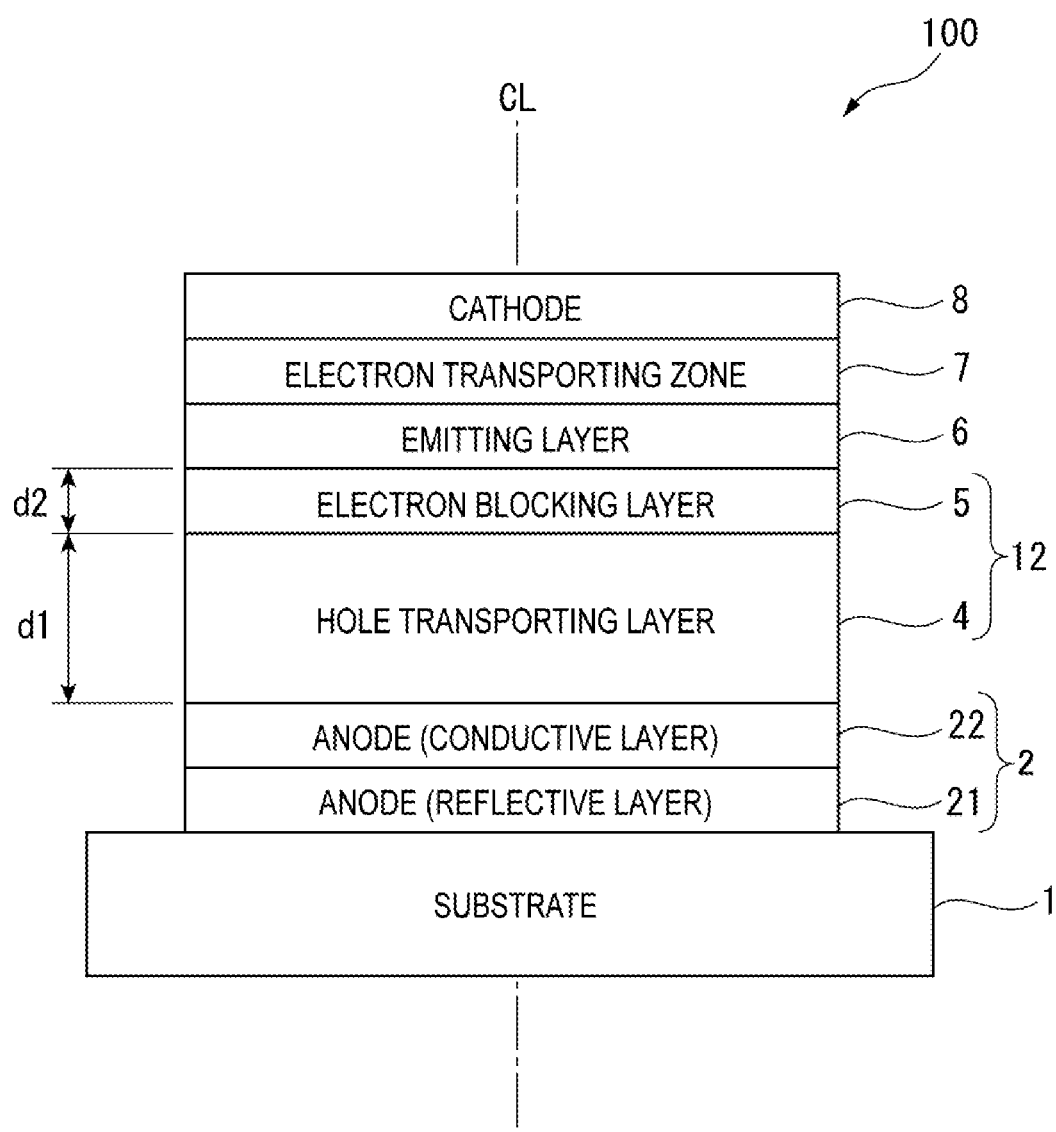
FIG. 1 shows an exemplary top emission organic EL device in a first exemplary embodiment of the invention.

FIG. 1 schematically shows an exemplary top emission organic EL device in a first exemplary embodiment of the invention.

An organic EL device 100 shown in FIG. 1 includes a substrate 1, anode 2, emitting layer 6 between the anode 2 and the cathode 8, hole transporting zone 12 between the anode 2 and the emitting layer 6, and electron transporting zone 7 between the cathode 8 and the emitting layer 6. In the organic EL device 100, these are adjacent to each other. The anode 2 includes a reflective layer 21 and a conductive layer 22.

The hole transporting zone 12 includes: a first layer in a form of the hole transporting layer 4 interposed between the anode 2 and the emitting layer 6; and a second layer in a form of the electron blocking layer 5 interposed between the hole transporting layer 4 and the emitting layer 6. The electron transporting zone 7 preferably includes at least one of the electron injecting layer, the electron transporting layer and a hole blocking layer.

Further, in the organic EL device 100, a film thickness d1 of the hole transporting layer 4 (first layer) satisfies a formula (1) below and a film thickness d2 of the electron blocking layer 5 (second layer) satisfies a formula (2) below.

$$100 \text{ nm} \leq d1 \leq 300 \text{ nm} \tag{1}$$

$$1 \text{ nm} \leq d2 \leq 20 \text{ nm} \tag{2}$$

The hole transporting layer 4 (first layer) contains a first compound. A hole mobility $\mu^{H1}$ of the first compound satisfies a formula (3) below. The electron blocking layer 5 (second layer) contains a second compound. A hole mobility $\mu^{H2}$ of the second compound satisfies a formula (4) below. In other words, in the organic EL device 100, the mobility of holes moving in the hole transporting layer 4 is adjusted to be larger than the mobility of the holes moving in the electron blocking layer 5. The hole mobility should be measured by an electric field strength in Examples herein.

$$1.0 \times 10^{-4} \text{ [cm}^2/Vs] \leq \mu^{H1} \leq 1.0 \times 10^{-1} \text{ [cm}^2/Vs] \tag{3}$$

$$1.0 \times 10^{-10} \text{ [cm}^2/Vs] \mu^{H2} \leq 1.0 \times 10^{-6} \text{ [cm}^2/Vs] \tag{4}$$

In the top emission organic EL device, a drive voltage tends to be increased since the thickness of the hole transporting zone is usually set relatively thick. In order to reduce an increase in the drive voltage, it is conceivable to increase the mobility of a hole transporting material contained in the hole transporting zone. However, even if the mobility of the hole transporting material is simply increased, the recombination region between holes and electrons in the emitting layer expands in a thickness direction of the emitting layer (in a direction from the anode toward the cathode in the emitting layer), so that a desired luminous efficiency is difficult to obtain.

Accordingly, in the organic EL device 100 shown in FIG. 1, the film thickness d1 of the hole transporting layer 4 forming the hole transporting zone 12 and the film thickness d2 of the electron blocking layer 5 are set so as to satisfy the respective formulae (1) and (2). Further, the first compound and the second compound are selected such that the hole mobility $\mu^{H1}$ of the first compound contained in the hole transporting layer 4 is larger than the hole mobility $\mu^{H2}$ of the second compound contained in the electron blocking layer 5 ($\mu^{H1} > \mu^{H2}$).

With $\mu^{H1} > \mu^{H2}$ representing a relationship of the hole mobility between the first compound and the second compound, it is considered that holes injected from the anode 2 move relatively fast in the hole transporting layer 4 and subsequently the holes move relatively slowly in the electron blocking layer 5 to reach the emitting layer 6. As a result, the holes reaching the emitting layer 6 recombine with the electrons in the vicinity of an interface between the electron blocking layer 5 and the emitting layer 6. It is believed that, by reducing the expansion of the recombination region of the holes and the electrons, the expansion of the light emission distribution is reduced to improve the luminous efficiency.

Accordingly, the organic EL device 100 of the exemplary embodiment can emit light with a high efficiency.

Further, the organic EL device 100 of the exemplary embodiment can emit light with a high efficiency without significantly increasing the drive voltage (e.g., with a drive voltage of less than 4.5 V).

When the emitting layer 6 of the organic EL device 100 in the exemplary embodiment contains a material that emits blue light, the organic EL device 100 emits light with a high efficiency in a blue wavelength region.

Preferable aspect(s) of the organic EL device 100 in the exemplary embodiment will be described below. The description of reference numerals is omitted below.

Hole Transporting Zone

In the organic EL device in the exemplary embodiment, the first layer (hole transporting layer in the exemplary embodiment) is preferably adjacent to the second layer (electron blocking layer in the exemplary embodiment) in order to achieve higher efficiency of light emission.

In the organic EL device in the exemplary embodiment, the second layer (electron blocking layer in the exemplary embodiment) is preferably adjacent to the emitting layer in order to achieve higher efficiency of light emission.

Specifically, in the organic EL device in the exemplary embodiment, in order to achieve higher efficiency of light emission, it is more preferable that the first layer (hole transporting layer in the exemplary embodiment) is adjacent to the second layer (electron blocking layer in the exemplary embodiment) and the second layer (electron blocking layer in the exemplary embodiment) is adjacent to the emitting layer. It is also preferable that the first layer in the exemplary embodiment serves as a hole injecting layer.

In the organic EL device of the exemplary embodiment, the film thickness d1 of the first layer (hole transporting layer in the exemplary embodiment) is 100 nm≤d1≤300 nm, preferably 100 nm≤d1≤150 nm.

When the film thickness d1 of the first layer is 100 nm or more, cavity adjustment is easy.

When the film thickness d1 of the first layer is 300 nm or less, the drive voltage is easily reducible.

The film thickness d1 of the first layer is measured as follows.

A central portion (symbol CL in FIGS. 1 to 4) of the organic EL device is cut in a direction perpendicular to a formation surface of the first layer (i.e., in a thickness direction of the first layer). The cut surface is observed with a transmission electron microscope (TEM) to measure the film thickness d1 of the first layer.

The central portion of the organic EL device means a central portion of a shape of the organic EL device projected from a surface from which light is extracted (i.e., from the cathode). For instance, when the projected shape is rectangular, the central portion means an intersection of diagonals of the rectangular shape.

The hole mobility $\mu^{H1}$ of the first compound contained in the first layer is $1.0\times10^{-4}$ [cm$^2$/Vs]$\leq\mu^{H1}\leq1.0\times10^{-1}$ [cm$^2$/Vs], preferably $1.0\times10^{-3}$ [cm$^2$/Vs]$\leq\mu^{H1}\leq1.0\times10^{-1}$ [cm$^2$/Vs].

When the hole mobility $\mu^{H1}$ of the first compound is $1.0\times10^{-4}$ [cm$^2$/Vs] or more, the drive voltage is easily reducible.

When the hole mobility $\mu^{H1}$ of the first compound is $1.0\times10^{-1}$ [cm$^2$/Vs] or less, the effect of reducing the expansion of the recombination region of holes and electrons in the emitting layer is easily obtainable. As a result, the luminous efficiency is easily improvable.

A measurement method of the hole mobility $\mu^{H1}$ of the first compound will be described in detail in later-described Examples.

First Compound

The first compound contained in the first layer is not particularly limited as long as having the hole mobility $\mu^{H1}$ satisfying the formula (3).

The first compound is preferably, for instance, an aromatic amine derivative, more preferably an aromatic amine derivative represented by a formula (A1) below.

[Formula 1]

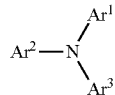

(A1)

In the formula (A1), Ar$^1$ to Ar$^3$ each independently represent a substituted or unsubstituted aromatic hydrocarbon group having 6 to 50 ring carbon atoms, a substituted or unsubstituted aromatic heterocyclic group having 5 to 50 ring atoms, or a group represented by a formula (4-2) below.

[Formula 2]

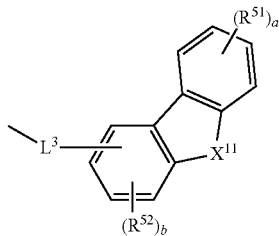

(4-2)

The aromatic hydrocarbon group as Ar$^1$ to Ar$^3$ in the formula (A1) may be non-fused aromatic hydrocarbon group or a fused aromatic hydrocarbon group.

The aromatic heterocyclic group as Ar$^1$ to Ar$^3$ in the formula (A1) may be non-fused aromatic heterocyclic group or a fused aromatic heterocyclic group.

The aromatic hydrocarbon group having 6 to 50 ring carbon atoms as Ar$^1$ to Ar$^3$ in the formula (A1) is exemplified by non-fused aromatic hydrocarbon group or fused aromatic hydrocarbon group, more specifically, a phenyl group, naphthyl group, phenanthryl group, biphenyl group, terphenyl group, quaterphenyl group, fluoranthenyl group, triphenylenyl group, phenanthrenyl group, 9,9-dimethylfluorenyl group, benzo[c]phenanthrenyl group, benzo[a]triphenylenyl group, naphtho[1,2-c]phenanthrenyl group, naphtho[1,2-a]triphenylenyl group, dibenzo[a,c]triphenylenyl group, and benzo[b]fluoranthenyl group.

The aromatic heterocyclic group having 5 to 50 ring atoms as Ar$^1$ to Ar$^3$ in the formula (A1) is exemplified by non-fused aromatic heterocyclic ring and fused aromatic heterocyclic ring, more specifically, a pyrrolyl group, pyrazinyl group, pyridinyl group, indolyl group, isoindolyl group, furyl group, benzofuranyl group, isobenzofuranyl group, dibenzofuranyl group, dibenzothienyl group, quinolyl group, isoquinolyl group, quinoxalinyl group, carbazolyl group, phenanthridinyl group, acridinyl group, phenanthrolinyl group, thienyl group, and a group formed from a pyridine ring, pyrazine ring, pyrimidine ring, pyridazine ring, triazine ring, indole ring, quinoline ring, acridine ring, pyrrolidine ring, dioxane ring, piperidine ring, morpholine ring, piperazine ring, carbazole ring, furan ring, thiophene ring, oxazole ring, oxadiazole ring, benzooxazole ring, thiazole ring, thiadiazole ring, benzothiazole ring, triazole ring, imidazole ring, benzimidazole ring, pyrane ring, dibenzofuran ring, and benzo[c]dibenzofuran ring.

In the formula (A1), the ring carbon atoms of the aromatic hydrocarbon group as Ar$^1$ to Ar$^3$ is preferably in a range from 6 to 30, more preferably in a range from 6 to 20, further preferably in a range from 6 to 12.

In the formula (A1), the ring atoms of the aromatic heterocyclic group as Ar' to Ar$^3$ is preferably in a range from 2 to 30, more preferably in a range from 2 to 20, further preferably in a range from 2 to 12.

In the formula (A1), the aromatic hydrocarbon group or the aromatic heterocyclic group as Ar$^1$ to Ar$^3$ is preferably each independently a substituted or unsubstituted phenyl group, substituted or unsubstituted biphenyl group, substituted or unsubstituted terphenyl group, substituted or unsubstituted fluorenyl group, substituted or unsubstituted carbazolyl group, substituted or unsubstituted dibenzofuranyl group, or substituted or unsubstituted dibenzothienyl group.

In the formula (A1), at least one of Ar$^1$ to Ar$^3$ preferably includes a fused aromatic hydrocarbon group or a fused aromatic heterocyclic group.

In the formula (A1), at least one of $Ar^1$ to $Ar^3$ is also preferably a group represented by the formula (4-2).

In the formula (4-2), $X^{11}$ represents $CR^{53}R^{54}$, $NR^{55}$, an oxygen atom, or a sulfur atom.

In the formula (4-2), $L^3$ is a single bond or a substituted or unsubstituted arylene group having 6 to 50 ring carbon atoms.

When $L^3$ is an arylene group having 6 to 50 ring carbon atoms and having a substituent, the substituent is a halogen atom, a cyano group, a substituted or unsubstituted aromatic hydrocarbon group having 6 to 50 ring carbon atoms, a substituted or unsubstituted and linear or branched alkyl group having 1 to 10 carbon atoms, a substituted or unsubstituted cycloalkyl group having 3 to 10 ring carbon atoms, a substituted or unsubstituted trialkylsilyl group having 3 to 10 carbon atoms, a substituted or unsubstituted triarylsilyl group having 18 to 30 ring carbon atoms, or a substituted or unsubstituted alkylarylsilyl group having 8 to 15 carbon atoms.

In the formula (4-2), $R^{51}$ and $R^{52}$ each independently represent a hydrogen atom or a substituent.

$R^{51}$ and $R^{52}$ as the substituent each independently represent a halogen atom, a cyano group, a substituted or unsubstituted amino group, a substituted or unsubstituted aromatic hydrocarbon group having 6 to 50 ring carbon atoms, a substituted or unsubstituted and linear or branched alkyl group having 1 to 10 carbon atoms, a substituted or unsubstituted cycloalkyl group having 3 to 10 ring carbon atoms, a substituted or unsubstituted trialkylsilyl group having 3 to 10 carbon atoms, a substituted or unsubstituted triarylsilyl group having 18 to 30 ring carbon atoms, or a substituted or unsubstituted alkylarylsilyl group having 8 to 15 carbon atoms.

Adjacent ones of $R^{51}$ or adjacent ones of $R^{52}$ are mutually bonded to form a saturated or unsaturated ring, or not bonded.

In the formula (4-2), when $X^{11}$ is $CR^{53}R^{54}$ or $NR^{55}$, $R^{53}$, $R^{54}$ and $R^{55}$ each independently represent a substituted or unsubstituted and linear or branched alkyl group having 1 to 10 carbon atoms, a substituted or unsubstituted cycloalkyl group having 3 to 10 ring carbon atoms, a substituted or unsubstituted trialkylsilyl group having 3 to 10 carbon atoms, a substituted or unsubstituted triarylsilyl group having 18 to 30 ring carbon atoms, a substituted or unsubstituted alkylarylsilyl group having 8 to 15 carbon atoms, or a substituted or unsubstituted aromatic hydrocarbon group having 6 to 50 ring carbon atoms.

Adjacent ones of $R^{53}$ and $R^{54}$ are mutually bonded to form a saturated or unsaturated ring, or not bonded.

In the formula (4-2), a represents an integer from 0 to 4 and b represents an integer from 0 to 3.

In the formula (4-2), $X^{11}$ is preferably $CR^{53}R^{54}$, $NR^{55}$, or an oxygen atom.

In the formula (4-2), when $L^3$ is an arylene group having 6 to 50 ring carbon atoms and having a substituent, the substituent is preferably a halogen atom, a cyano group, an unsubstituted aromatic hydrocarbon group having 6 to 14 ring carbon atoms, an unsubstituted and linear or branched alkyl group having 1 to 6 carbon atoms, an unsubstituted cycloalkyl group having 3 to 10 ring carbon atoms, an unsubstituted trialkylsilyl group having 3 to 10 carbon atoms, an unsubstituted triarylsilyl group having 18 to 30 ring carbon atoms, or an unsubstituted alkylarylsilyl group having 8 to 15 carbon atoms.

In the formula (4-2), $L^3$ is also preferably an unsubstituted arylene group having 6 to 14 ring carbon atoms.

In the formula (4-2), $R^{51}$ and $R^{52}$ are preferably each independently a halogen atom, a cyano group, an amino group, an unsubstituted aromatic hydrocarbon group having 6 to 14 ring carbon atoms, an unsubstituted and linear or branched alkyl group having 1 to 6 carbon atoms, an unsubstituted cycloalkyl group having 3 to 10 ring carbon atoms, an unsubstituted trialkylsilyl group having 3 to 10 carbon atoms, an unsubstituted triarylsilyl group having 18 to 30 ring carbon atoms, or an unsubstituted alkylarylsilyl group having 8 to 15 carbon atoms.

In the formula (4-2), $R^{51}$ and $R^{52}$ are also preferably each independently a hydrogen atom.

In the formula (4-2), when $X^{11}$ is $CR^{53}R^{54}$ or $NR^{55}$, $R^{53}$, $R^{54}$ and $R^{55}$ are preferably each independently an unsubstituted and linear or branched alkyl group having 1 to 6 carbon atoms, an unsubstituted cycloalkyl group having 3 to 10 ring carbon atoms, an unsubstituted trialkylsilyl group having 3 to 10 carbon atoms, an unsubstituted triarylsilyl group having 18 to 30 ring carbon atoms, an unsubstituted alkylarylsilyl group having 8 to 15 carbon atoms, or an unsubstituted aromatic hydrocarbon group having 6 to 14 ring carbon atoms.

In the formula (4-2), when $X^{11}$ is $CR^{53}R^{54}$ or $NR^{55}$, $R^{53}$, $R^{54}$ and $R^{55}$ are more preferably each independently an unsubstituted and linear or branched alkyl group having 1 to 6 carbon atoms, an unsubstituted cycloalkyl group having 3 to 10 ring carbon atoms, or an unsubstituted aromatic hydrocarbon group having 6 to 14 ring carbon atoms.

Examples of the aromatic amine derivative represented by the formula (A1) are shown below. The first compound contained in the first layer of the invention is not limited to the examples.

[Formula 3]

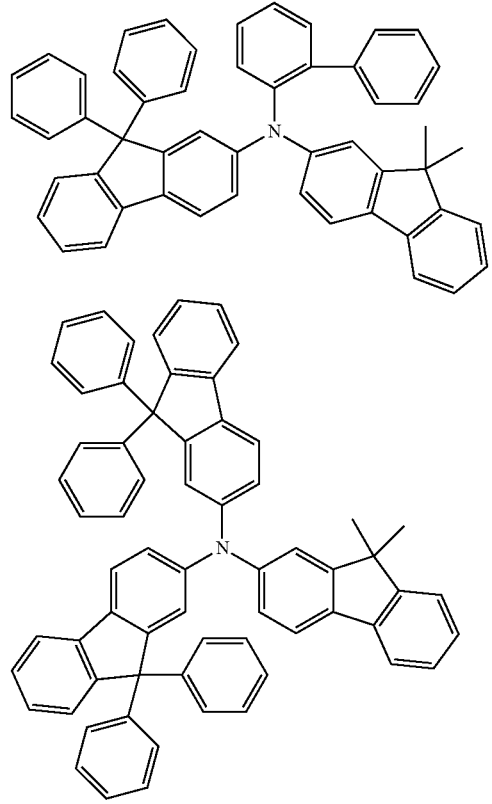

-continued

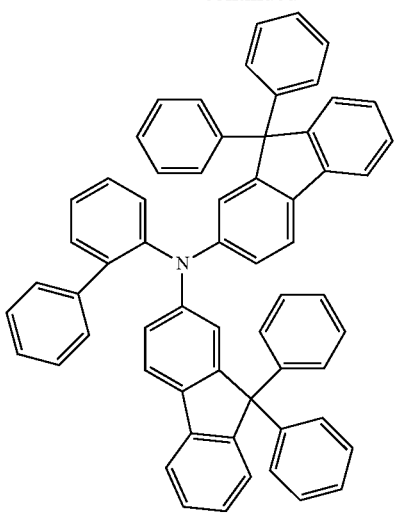

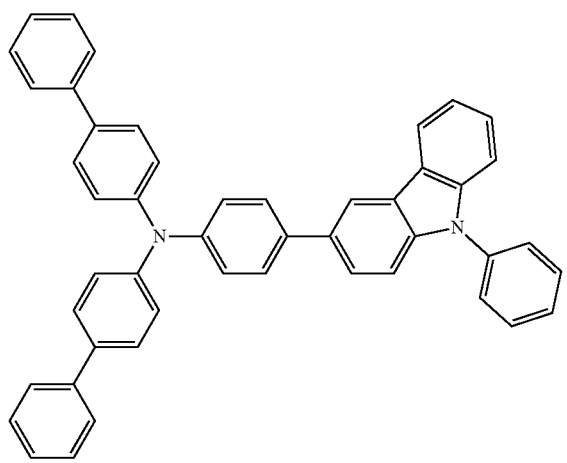

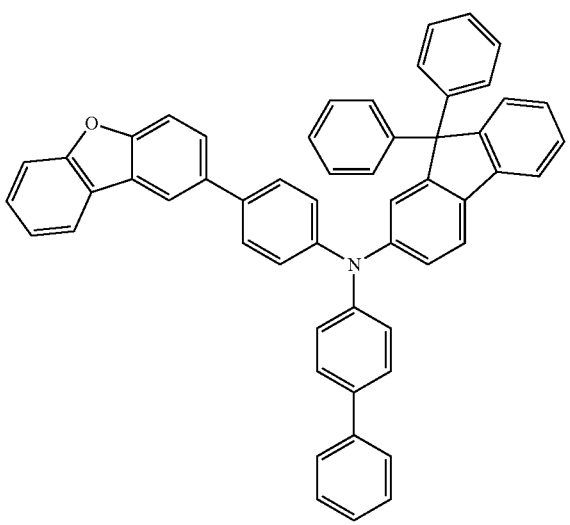

-continued

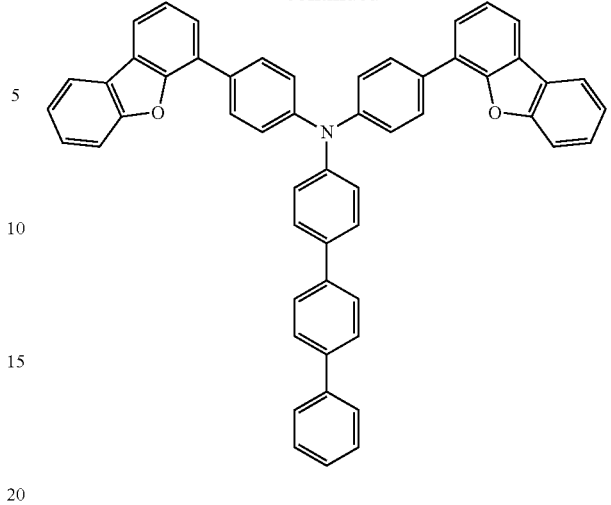

The first layer may contain one of the examples of the first compound alone or may contain two or more thereof.

A content of the first compound in the first layer is preferably 90 mass % or more, more preferably 95 mass % or more, further preferably 99 mass % or more, particularly preferably 100 mass % or more.

The content of the first compound when the first layer is a common layer is also preferably in the same range as above.

The common layer herein means a layer provided in a shared manner over the organic EL device of the exemplary embodiment and an organic EL device different from the organic EL device of the exemplary embodiment.

In the organic EL device of the exemplary embodiment, the film thickness d2 of the second layer (the electron blocking layer in the exemplary embodiment) is 1 nm≤d2≤20 nm, preferably 5 nm≤d2≤10 nm.

When the film thickness d2 of the second layer is 1 nm or more, the effect of reducing the expansion of the recombination region of holes and electrons in the emitting layer is easily obtainable. As a result, the luminous efficiency is easily improvable.

When the film thickness d2 of the second layer is 20 nm or less, the drive voltage is easily reducible.

The film thickness d2 of the second layer is measured by the same method for the film thickness d1 of the first layer.

The hole mobility $\mu^{H2}$ of the second compound contained in the second layer is $1.0 \times 10^{-10}$ [cm$^2$/Vs]≤$\mu^{H2}$ $1.0 \times 10^{-6}$ [cm$^2$/Vs], preferably $1.0 \times 10^{-8}$ [cm$^2$/Vs]≤$\mu^{H2}$≤$1.0 \times 10^{-6}$ [cm$^2$/Vs].

When the hole mobility $\mu^{H2}$ of the second compound is $1.0 \times 10^{-10}$ [cm$^2$/Vs] or more, the drive voltage is easily reducible.

When the hole mobility $\mu^{H2}$ of the second compound is $1.0 \times 10^{-6}$ [cm$^2$/Vs] or less, the effect of reducing the expansion of the recombination region of holes and electrons in the emitting layer is easily obtainable. As a result, the luminous efficiency is easily improvable.

A measurement method of the hole mobility $\mu^{H2}$ of the second compound will be described in detail in later-described Examples.

Second Compound

The second compound contained in the second layer is not particularly limited as long as having the hole mobility $\mu^{H2}$ satisfying the formula (4). The first compound and the second compound are mutually different in a molecular structure.

The second compound contained in the second layer is exemplified by an aromatic amine derivative, more specifically, the aromatic amine derivative represented by the formula (A1).

In other words, in the exemplary embodiment, among the aromatic amine derivative represented by the formula (A1), the compound having the hole mobility $\mu^{H1}$ satisfying the formula (3) is used as the first compound, and the compound having the hole mobility $\mu^{H2}$ satisfying the formula (4) is used as the second compound.

The second compound is preferably an aromatic amine derivative having a substituted or unsubstituted carbazolyl group, more preferably an aromatic amine derivative in which a nitrogen atom at a position 9 of the carbazolyl group is bonded to a nitrogen atom of an amino group by a single bond or a linking group, further preferably an aromatic amine derivative represented by a formula (A2).

[Formula 4]

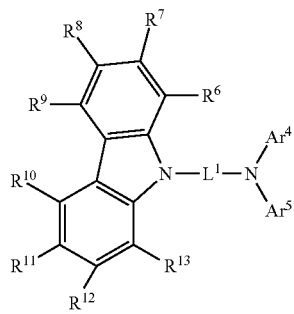

(A2)

In the formula (A2), $Ar^4$ and $Ar^5$ each independently represent the same as $Ar^1$ to $Ar^3$ in the formula (A1).

Examples of the aromatic hydrocarbon group having 6 to 50 ring carbon atoms represented by $Ar^4$ and $Ar^5$ in the formula (A2) are the same as those of the aromatic hydrocarbon group having 6 to 50 ring carbon atoms represented by $Ar^1$ to $Ar^3$ in the formula (A1). Preferable examples thereof (preferable examples of the ring carbon atoms and preferable examples of the group) are also the same.

Examples of the aromatic heterocyclic group having 5 to 50 ring atoms represented by $Ar^4$ and $Ar^5$ in the formula (A2) are the same as those of the aromatic heterocyclic group having 5 to 50 ring atoms represented by $Ar^1$ to $Ar^3$ in the formula (A1). Preferable examples thereof (preferable examples of the ring atoms and preferable examples of the group) are also the same.

In the formula (A2), $R^6$ to $R^{13}$ each independently represent a hydrogen atom or a substituent. $R^6$ to $R^{13}$ as the substituent each independently represent a halogen atom, substituted or unsubstituted alkyl group having 1 to 50 carbon atoms, substituted or unsubstituted aralkyl group having 2 to 50 carbon atoms, substituted or unsubstituted alkenyl group having 2 to 50 carbon atoms, cyano group, —C(=O)$R^{114}$, —COO$R^{115}$, —N($R^{116}$)($R^{117}$) substituted or unsubstituted alkoxy group having 1 to 50 carbon atoms, substituted or unsubstituted aryloxy group having 6 to 50 ring carbon atoms, substituted or unsubstituted alkylsulfonyl having 1 to 50 carbon atoms, hydroxyl group, —N($R^{118}$)—C(=O)$R^{119}$, substituted or unsubstituted aromatic hydrocarbon group having 6 to 50 ring carbon atoms, or substituted or unsubstituted aromatic heterocyclic group having 5 to 50 ring atoms. Moreover, in the formula (A2), $R^6$ to $R^{13}$ as the substituents may form a ring. In the formula (A2), $L^1$ is a single bond or a linking group. $L^1$ as the linking group is preferably a substituted or unsubstituted divalent aromatic group (preferably an arylene group), or a group formed by bonding two to four substituted or unsubstituted divalent aromatic groups (preferably arylene groups).

$R^{114}$ to $R^{119}$ in the formula (A2) each independently represent a hydrogen atom or a substituent. $R^{114}$ to $R^{119}$ as the substituent is preferably each independently a substituted or unsubstituted alkyl group having 1 to 50 carbon atoms, substituted or unsubstituted aryl group having 6 to 50 ring carbon atoms, or substituted or unsubstituted heterocyclic group having 5 to 50 ring atoms.

$R^6$ to $R^{13}$ in the formula (A2) are preferably each independently a hydrogen atom, substituted or unsubstituted alkyl group having 1 to 50 carbon atoms, substituted or unsubstituted aryl group having 6 to 50 ring carbon atoms, or substituted or unsubstituted heterocyclic group having 5 to 50 ring atoms, more preferably a hydrogen atom, substituted or unsubstituted aryl group having 6 to 50 ring carbon atoms, or substituted or unsubstituted heterocyclic group having 5 to 50 ring atoms.

The second compound is further preferably an aromatic amine derivative represented by a formula (A3) below.

[Formula 5]

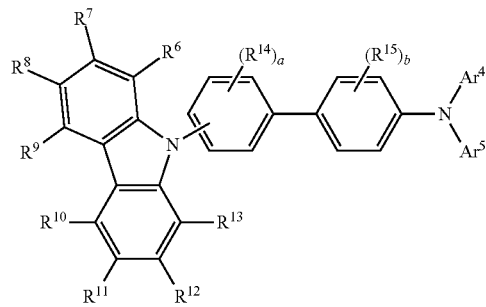

(A3)

In the formula (A3), $R^6$ to $R^{15}$ represent the same as $R^6$ to $R^{13}$ in the formula (A2) and $Ar^4$ and $Ar^5$ represent the same as $Ar^4$ and $Ar^5$ in the formula (A2). In the formula (A3), a is an integer of 4 and b is an integer of 4.

The second compound preferably has a 4-dibenzofuranyl group in a molecule.

Examples of the compound represented by the formula (A2) are shown below. It should be noted that the second compound in the invention is by no means limited to the examples below.

[Formula 6]

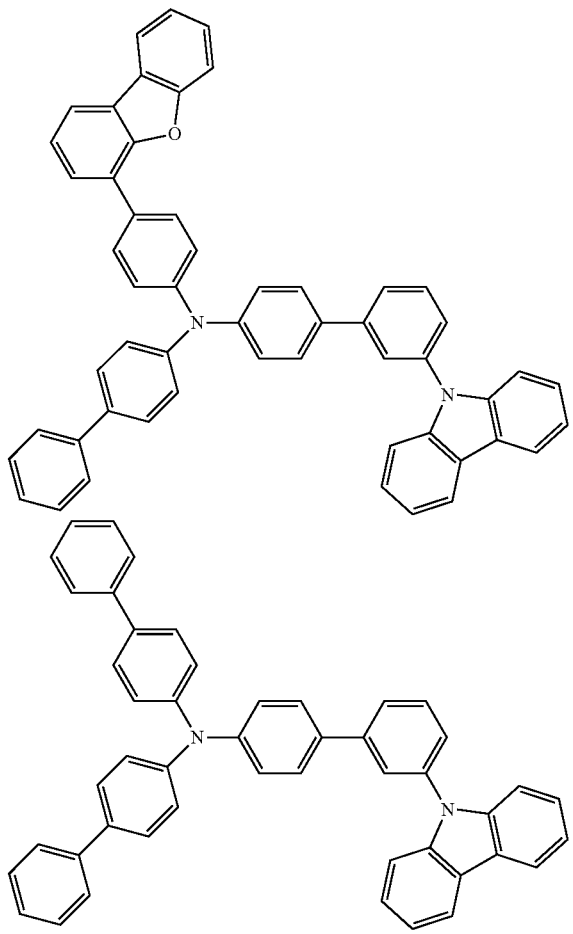

The second layer may include only one type of the second compound or may include two or more types of the second compound.

A content of the second compound in the entire second layer is preferably 90 mass % or more, more preferably 95 mass % or more, further preferably 99 mass % or more, particularly preferably 100 mass % or more.

The content of the second compound when the second layer is a common layer is also preferably in the same range as above.

In the organic EL device in the exemplary embodiment, the hole transporting zone preferably further includes a third layer containing a third compound between the first layer (the hole transporting layer in the exemplary embodiment) and the anode.

The third layer is exemplified by a hole injecting layer. With this layer, a hole injecting function is more efficiently expressed.

The third compound contained in the third layer is not particularly limited.

When the third layer is the hole injecting layer, the third compound is preferably a highly hole-injectable substance. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, the examples of the highly hole-injectable substance further include: an aromatic amine compound, which is a low-molecule compound, such that 4,4',4''-tris (N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl(abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylam ino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl) amino]-9-phenylcarbazole (abbreviation: PCzPCN1).

A high polymer compound (e.g., oligomer, dendrimer and polymer) is also usable. Examples of the high polymer compound include poly(N-vinylcarbazole) (abbreviation: PVK), poly(4-vinyltriphenylamine) (abbreviation: PVTPA), poly[N-(4-{N'-[4-(4-diphenylam ino)phenyl]phenyl-N'-phenylamino}phenyl)methacrylamido] (abbreviation: PTPDMA), and poly[N, N'-bis(4-butylphenyl)-N, N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly (styrene sulfonic acid)(PAni/PSS) are also usable.

The third layer may include only one type of the third compound or may include two or more types of the third compound.

A content of the third compound in the entire third layer is preferably 80 mass % or more, more preferably 90 mass % or more, further preferably 95 mass % or more.

The content of the third compound when the third layer is a common layer is also preferably in the same range as above.

Emitting Layer

The emitting layer preferably includes a host material and a dopant material. It should be noted that the host material is sometimes referred to as a matrix material.

The dopant material is sometimes referred to as a luminescent material, a guest material or an emitter.

Host Material

A triplet exciton level T1 of the host material is preferably 2.0 eV or less, more preferably 1.9 eV or less, further preferably 1.8 eV or less. The lower limit of the triplet exciton level T1 is preferably 1.6 eV or more.

When the triplet exciton level T1 of the host material is 2.0 eV or less, a high efficiency achievable by trapping the triplet exciton in the emitting layer is easily expressed.

It should be noted that the triplet exciton level T1 is defined to be a triplet exciton level T1 at 77[K].

The triplet exciton level T1 of the host material is measured using a spectrophotofluorometer (F-7000 manufactured by Hitachi High-Tech Science Corporation). A conversion equation of the triplet exciton level T1 is shown below.

$$T1 \text{ (eV)} = 1239.85/\lambda\text{edge} \qquad \text{Conversion Equation:}$$

"λedge" means a wavelength value (unit: nm) in a phosphorescence spectrum expressed by plotting a phosphorescence intensity on the vertical axis and a wavelength on the horizontal axis, the wavelength value being taken at an intersection of a tangent drawn to the rising edge of the phosphorescence spectrum on the short wavelength side and the horizontal axis.

The host material is not particularly limited. Examples of the host material include: 1) a metal complex such as an aluminum complex, beryllium complex, or zinc complex; 2) a heterocyclic compound such as an oxadiazole derivative, benzimidazole derivative, or phenanthroline derivative; 3) a fused aromatic compound such as a carbazole derivative, anthracene derivative, phenanthrene derivative, pyrene derivative, or chrysene derivative; and 4) an aromatic amine compound such as a triarylamine derivative or a fused polycyclic aromatic amine derivative.

Among the examples, in order to achieve the triplet exciton level T1 of the host material being 2.0 eV or less, the host material is preferably, for instance, a fused aromatic compound, more preferably an anthracene derivative, further preferably an anthracene derivative represented by a formula (11) below.

[Formula 7]

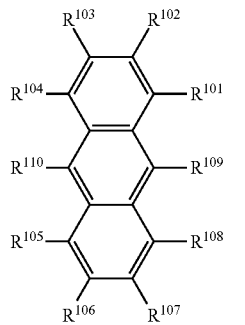

(11)

In the formula (11), $R^{101}$ to $R^{110}$ each independently represent a hydrogen atom or a substituent. $R^{101}$ to $R^{110}$ as the substituent each independently represent a substituted or unsubstituted alkyl group having 1 to 50 carbon atoms, substituted or unsubstituted alkenyl group having 2 to 50 carbon atoms, substituted or unsubstituted alkynyl group having 2 to 50 carbon atoms, substituted or unsubstituted cycloalkyl group having 3 to 50 ring carbon atoms, substituted or unsubstituted alkoxy group having 1 to 50 carbon atoms, substituted or unsubstituted alkylthio group having 1 to 50 carbon atoms, substituted or unsubstituted aryloxy group having 6 to 50 ring carbon atoms, substituted or unsubstituted arylthio group having 6 to 50 ring carbon atoms, substituted or unsubstituted aralkyl group having 7 to 50 carbon atoms, —Si($R^{121}$)($R^{122}$)($R^{123}$), —C(=O)$R^{124}$, —COO$R^{125}$, —N($R^{126}$)($R^{127}$), halogen atom, cyano group, nitro group, substituted or unsubstituted aryl group having 6 to 50 ring carbon atoms, substituted or unsubstituted heterocyclic group having 5 to 50 ring atoms, or a group represented by -$L^{101}$-$Ar^{101}$.

Among $R^{101}$ to $R^{110}$, two or more adjacent substituents (preferably two or three substituents) may be mutually bonded to form a saturated or unsaturated ring. The number of the formed saturated or unsaturated ring is preferably 1 or more (preferably in a range from 1 to 3). The saturated or unsaturated ring is preferably a substituted or unsubstituted five-membered ring or six-membered ring, more preferably a substituted or unsubstituted benzene ring.

$R^{121}$ to $R^{127}$ in the formula (11) each independently represent a hydrogen atom or a substituent. $R^{121}$ to $R^{127}$ as the substituent is each independently a substituted or unsubstituted alkyl group having 1 to 50 carbon atoms, substituted or unsubstituted aryl group having 6 to 50 ring carbon atoms, or substituted or unsubstituted heterocyclic group having 5 to 50 ring atoms.

At least one of $R^{101}$ to $R^{110}$ is a group represented by -$L^{101}$-$Ar^{101}$. $L^{101}$ is a single bond or a linking group. $L^{101}$ as the linking group is a substituted or unsubstituted arylene group having 6 to 30 ring carbon atoms or a substituted or unsubstituted heteroarylene group having 5 to 30 ring atoms. $Ar^{101}$ is a substituted or unsubstituted aryl group having 6 to 50 ring carbon atoms or a substituted or unsubstituted heterocyclic group having 5 to 50 ring atoms.

When two or more of $L^{101}$ are present, the two or more of $L^{101}$ may be mutually the same or different. When two or more of $Ar^{101}$ are present, the two or more of $Ar^{101}$ may be mutually the same or different. When two or more of $R^{121}$ to $R^{127}$ are present, the two or more of $R^{121}$ to $R^{127}$ may be mutually the same or different.

$R^{101}$ to $R^{110}$ in the formula (11) are preferably each independently a hydrogen atom, substituted or unsubstituted alkyl group having 1 to 50 carbon atoms, substituted or unsubstituted aryl group having 6 to 50 ring carbon atoms, substituted or unsubstituted heterocyclic group having 5 to 50 ring atoms, or a group represented by -$L^{101}$-$Ar^{101}$, more preferably a hydrogen atom, substituted or unsubstituted aryl group having 6 to 50 ring carbon atoms, substituted or unsubstituted heterocyclic group having 5 to 50 ring atoms, or a group represented by -$L^{101}$-$Ar^{101}$.

In the formula (11), among $R^{101}$ to $R^{110}$, $R^{109}$ and $R^{110}$ are preferably each independently a group represented by -$L^{101}$-$Ar^{101}$. At least one of $R^{109}$ and $R^{110}$ is preferably a group represented by -$L^{101}$-$Ar^{101}$.

In the formula (11), when $Ar^{101}$ in the "group represented by -$L^{101}$-$Ar^{101}$" for at least one of $R^{101}$ to $R^{110}$ (preferably at least one of $R^{109}$ and $R^{110}$) is an aryl group, $Ar^{101}$ is preferably a substituted or unsubstituted phenyl group or a substituted or unsubstituted naphthyl group.

In the formula (11), when $Ar^{101}$ in the "group represented by -$L^{101}$-$Ar^{101}$" for at least one of $R^{101}$ to $R^{110}$ (preferably at least one of $R^{109}$ and $R^{110}$) is a heterocyclic group, $Ar^{101}$ is preferably a substituted or unsubstituted dibenzofuranyl group, substituted or unsubstituted dibenzothienyl group, substituted or unsubstituted naphthobenzofuranyl group, or substituted or unsubstituted naphthobenzothienyl group.

A part or all of the hydrogen atom(s) in the formula (11) is preferably deuterium.

In the organic EL device of the exemplary embodiment, a ratio ($\mu^{He}/\mu^{Hh}$) of the electron mobility $\mu^{He}$ of the host material to the hole mobility $\mu^{Hh}$ of the host material is preferably 10000 or more, more preferably 50000 or more, further preferably 100000 or more. Although the ratio ($\mu^{He}/\mu^{Hh}$) is preferably larger, the upper limit of the ratio is preferably 500000 or less in terms of a balance between holes and electrons in the emitting layer.

When the ratio ($\mu^{He}/\mu^{Hh}$) is 10000 or more, the effect of reducing the expansion of the recombination region of holes and electrons in the emitting layer is easily obtainable. As a result, the luminous efficiency is easily improvable.

A measurement method of the hole mobility $\mu^{Hh}$ and the electron mobility $\mu^{He}$ of the host material will be described in detail in later-described Examples.

Examples of the compound represented by the formula (11) are shown below. It should be noted that the host material contained in the emitting layer in the invention is by no means limited to the examples below.

[Formula 8]

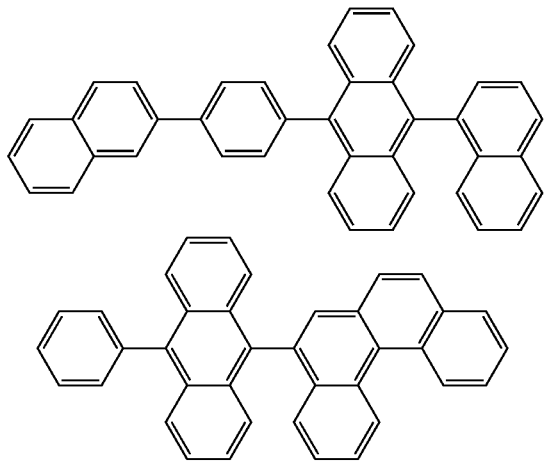

The emitting layer may include only one type of the host material or may include two or more types of the host material.

A content of the host material is not particularly limited. The content of the host material in the entire emitting layer is preferably 80 mass % or more, more preferably from 90 mass % to 99.9 mass %, further preferably 95 mass % to 99.9 mass %.

Dopant Material

The emitting layer preferably includes a dopant material. The dopant material is a highly emittable substance and can be exemplified by various materials. For instance, as the dopant material, a fluorescent material that emits fluorescence and a phosphorescent material that emits phosphorescence are usable. The fluorescent material is a compound that can emit light in a singlet state while the phosphorescent material is a compound that can emit light in a triplet state.

Among the above examples, the dopant material is preferably the fluorescent material, more preferably a fluorescent material that emits a blue light (hereinafter, sometimes referred to as a blue fluorescent material).

Examples of the blue fluorescent material usable in the emitting layer include a pyrene derivative, styrylamine derivative, chrysene derivative, fluoranthene derivative, fluorene derivative, diamine derivative, triarylamine derivative and boron derivative. A green fluorescent material usable in the emitting layer is exemplified by an aromatic amine derivative. A red fluorescent material usable in the emitting layer is exemplified by a tetracene derivative and a diamine derivative.

A blue phosphorescent material usable in the emitting layer is exemplified by a metal complex such as an iridium complex, osmium complex, and platinum complex. A green phosphorescent material usable in the emitting layer is exemplified by an iridium complex. A red phosphorescent material usable in the emitting layer is exemplified by a metal complex such as an iridium complex, platinum complex, terbium complex and europium complex.

A compound represented by a formula (10) below is usable as the dopant material.

[Formula 9]

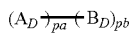

(10)

In the formula (10), $A_D$ is a substituted or unsubstituted aromatic hydrocarbon group having 12 to 50 ring carbon atoms, or a substituted or unsubstituted aromatic heterocyclic group having 15 to 50 ring atoms.

Examples of the aromatic hydrocarbon group having 12 to 50 ring carbon atoms for $A_D$ include groups derived from naphthalene, anthracene, benzanthracene, phenanthrene, chrysene, pyrene, fluoranthene, benzofluoranthene, perylene, picene, triphenylene, florene, benzoflorene, stilbene, naphthacene, acenaphthofluoranthene and the like, and further a benzotized group and a ring-extended group of the aromatic hydrocarbon group.

The aromatic heterocyclic group having 15 to 50 ring atoms in $A_D$ is exemplified by a heterocyclic group and a ring-extended group exemplarily shown in a "description on formulae" later.

The "ring-extended group" refers to a group obtained by fusing at least one ring selected from the group consisting of an aromatic hydrocarbon ring having 6 to 50 ring carbon atoms and an aromatic heterocyclic ring having 5 to 50 ring atoms to a benzene ring or a heterocyclic ring of the aromatic hydrocarbon group or the aromatic heterocyclic group exemplarily shown as $A_D$. The above is also applicable to the description below.

In the formula (10), $B_D$ is a group represented by a formula (10A) below.

In the formula (10), pa is an integer from 1 to 4, and pb is an integer from 0 to 4.

[Formula 10]

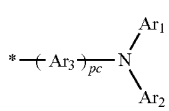

(10A)

In the formula (10A), $Ar_1$ and $Ar_2$ each independently represent: a substituted or unsubstituted aromatic hydrocarbon group having 6 to 50 ring carbon atoms, a substituted or unsubstituted alkyl group having 1 to 50 carbon atoms, a substituted or unsubstituted cycloalkyl group having 3 to 50 carbon atoms, a substituted or unsubstituted alkenyl group having 2 to 20 carbon atoms, a substituted or unsubstituted alkynyl group having 2 to 20 carbon atoms, or a substituted or unsubstituted heterocyclic group having 5 to 50 ring atoms.

In the formula (10A), $Ar_3$ is a divalent group derived from one of a substituted or unsubstituted aromatic hydrocarbon group having 6 to 50 ring carbon atoms, a substituted or unsubstituted alkyl group having 1 to 50 carbon atoms, a substituted or unsubstituted cycloalkyl group having 3 to 50 carbon atoms, a substituted or unsubstituted alkenyl group having 2 to 20 carbon atoms, a substituted or unsubstituted alkynyl group having 2 to 20 carbon atoms, and a substituted or unsubstituted heterocyclic group having 5 to 50 ring atoms.

pc is an integer from 0 to 4.

In the formula (10A), * represents a bonding position between the group represented by the formula (10A) and the aromatic hydrocarbon group or the aromatic heterocyclic group represented by $A_D$.

In the formulae (10) and (10A): when a plurality of $A_D$ are present, the plurality of $A_D$ may be mutually the same or different; when a plurality of $B_D$ are present, the plurality of $B_D$ may be mutually the same or different; when a plurality of $Ar_1$ are present, the plurality of $Ar_1$ may be mutually the same or different; when a plurality of $Ar_2$ are present, the plurality of $Ar_2$ may be mutually the same or different; and when a plurality of $Ar_3$ are present, the plurality of $Ar_3$ may be mutually the same or different.

Examples of the compound represented by the formula (10) are compounds represented by formulae below. However, the dopant material is not limited to the examples. $A_D$ and $A_{D1}$ to $A_{D4}$ each independently represent the same as $A_D$ described above. $B_{D1}$ to $B_{D4}$ each independently represent the same as $B_D$ described above. A plurality of $A_{D3}$ in one formula are mutually the same or different. A plurality of $B_{D4}$ in one formula are mutually the same or different.

[Formula 11]

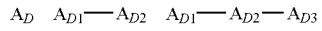
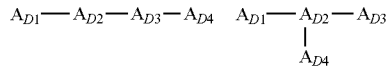
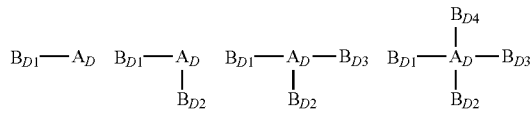
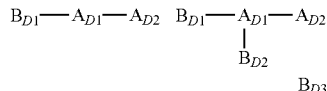

[Formula 12]

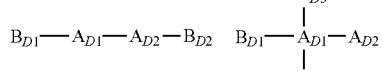
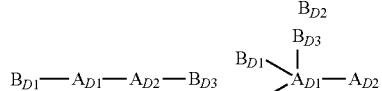
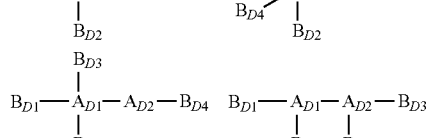
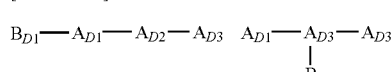

[Formula 13]

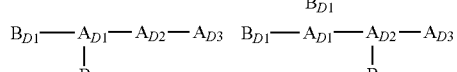
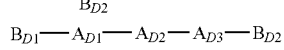
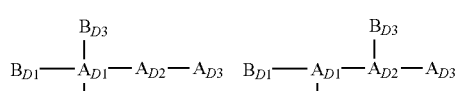
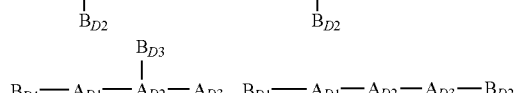

[Formula 14]

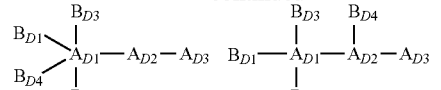
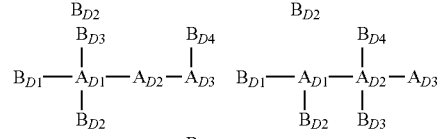
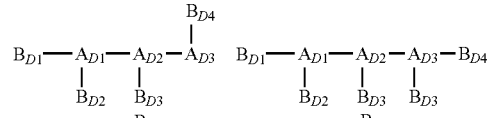
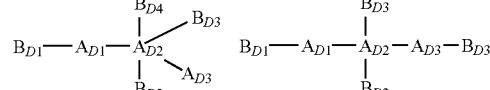
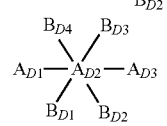

[Formula 15]

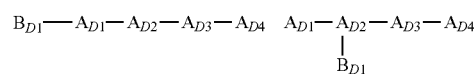
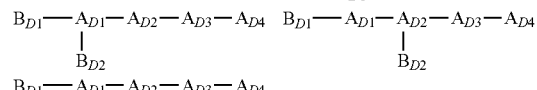
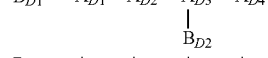
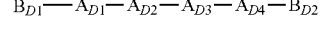
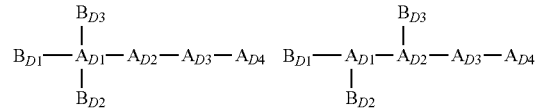
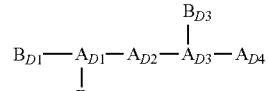
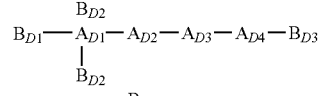
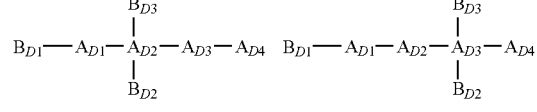

[Formula 16]

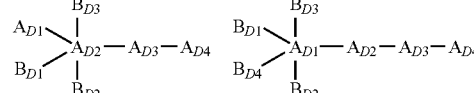
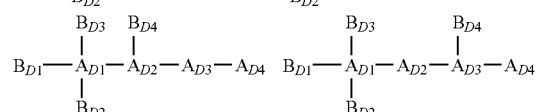
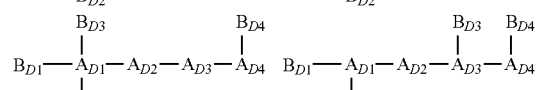
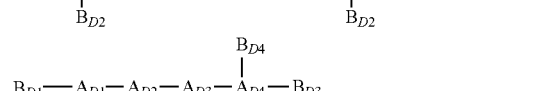
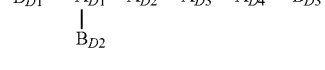

-continued

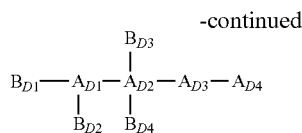

[Formula 17]

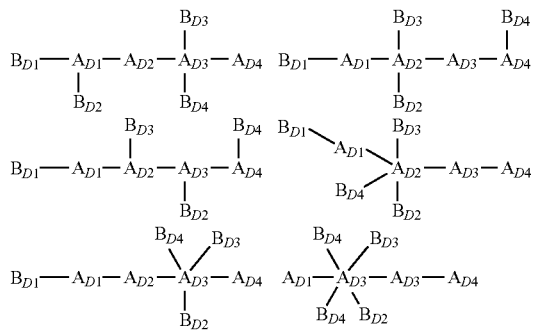

The aromatic hydrocarbon group for $A_D$ is preferably an aromatic hydrocarbon group having 12 to 30 ring carbon atoms, more preferably an aromatic hydrocarbon group having 12 to 24 ring carbon atoms, further preferably an aromatic hydrocarbon group having 18 to 20 ring carbon atoms.

Examples of the aromatic hydrocarbon group for $A_D$ include a naphthylphenyl group, naphthyl group, acenaphthylenyl group, anthryl group, benzanthryl group, aceanthryl group, phenanthryl group, benzo[c]phenanthryl group, phenalenyl group, fluorenyl group, picenyl group, pentaphenyl group, pyrenyl group, chrysenyl group, benzo[g]chrysenyl group, s-indecenyl group, as-indecenyl group, fluoranthenyl group, benzo[k]fluoranthenyl group, triphenylenyl group, benzo[b]triphenylenyl group, benzofluorenyl group, styrylphenyl group, naphthacenyl group, perylenyl group, and a ring-extended group thereof, among which an anthryl group, picenyl group, pyrenyl group, chrysenyl group, fluoranthenyl group, benzo[k]fluoranthenyl group, benzofluorenyl group, styrylphenyl group, naphthacenyl group, perylenyl group and a benzotized group thereof or a ring-extended group thereof are preferable, among which an anthryl group, pyrenyl group, chrysenyl group, benzo[k]fluoranthenyl group, benzofluorenyl group, styrylphenyl group, acenaphtho[1,2-k]fluoranthenyl group and a benzotized group thereof or a ring-extended group thereof are more preferable, among which an anthryl group, pyrenyl group, chrysenyl group, benzo[k]fluoranthenyl group, benzofluorenyl group, acenaphtho[1,2-k]fluoranthenyl group, and naphthacenyl group are particularly preferable.

The aromatic heterocyclic group for $A_D$ is preferably an aromatic heterocyclic group having 15 to 30 ring atoms, more preferably an aromatic heterocyclic group having 15 to 24 ring atoms, further preferably an aromatic heterocyclic group having 18 to 20 ring atoms.

In the formula (10A), the aromatic hydrocarbon group for $Ar_1$ and $Ar_2$ is preferably each independently an aromatic hydrocarbon group having 6 to 24 ring carbon atoms, more preferably an aromatic hydrocarbon group having 6 to 12 ring carbon atoms.

Examples of the aromatic hydrocarbon group each independently for $Ar_1$ and $Ar_2$ in the formula (10A) include a phenyl group, naphthylphenyl group, biphenylyl group, terphenylyl group, naphthyl group, acenaphthylenyl group, anthryl group, benzanthryl group, aceanthryl group, phenanthryl group, benzo[c]phenanthryl group, phenalenyl group, fluorenyl group, picenyl group, pentaphenyl group, pyrenyl group, chrysenyl group, benzo[g]chrysenyl group, s-indecenyl group, as-indecenyl group, fluoranthenyl group, benzo[k]fluoranthenyl group, triphenylenyl group, benzo[b]triphenylenyl group, benzofluorenyl group, styrylphenyl group, naphthacenyl group, perylenyl group, and a benzotized group or a ring-extended group thereof, among which a phenyl group, biphenylyl group, terphenylyl group, and naphthyl group are preferable, among which a phenyl group, biphenylyl group, and terphenylyl group are more preferable, among which a phenyl group is particularly preferable.

In $Ar_1$ and $Ar_2$ in the formula (10A), examples of a substituted aromatic hydrocarbon group include a phenylnaphthyl group, naphthylphenyl group, tolyl group, xylyl group, silylphenyl group, trimethylsilylphenyl group, 9,9-dimethylfluorenyl group, 9,9-diphenylfluorenyl group, 9,9'-spirobifluorenyl group, and cyanophenyl group. Among the examples, a tolyl group, xylyl group, trimethylsilylphenyl group, 9,9-dimethylfluorenyl group, 9,9-diphenylfluorenyl group, 9,9'-spirobifluorenyl group, cyanophenyl group, silylphenyl group and the like are preferable.

In the formula (10A), the divalent group derived from the aromatic hydrocarbon group for $Ar_3$ is preferably a divalent group derived from an aromatic hydrocarbon group having 6 to 24 ring carbon atoms, more preferably a divalent group derived from an aromatic hydrocarbon group having 6 to 12 ring carbon atoms.

Examples of the divalent group derived from the aromatic hydrocarbon group for $Ar_3$ in the formula (10A) include a divalent group derived from one of a phenyl group, naphthylphenyl group, biphenylyl group, terphenylyl group, naphthyl group, acenaphthylenyl group, anthryl group, benzanthryl group, aceanthryl group, phenanthryl group, benzo[c]phenanthryl group, phenalenyl group, fluorenyl group, picenyl group, pentaphenyl group, pyrenyl group, chrysenyl group, benzo[g]chrysenyl group, s-indecenyl group, as-indecenyl group, fluoranthenyl group, benzo[k]fluoranthenyl group, triphenylenyl group, benzo[b]triphenylenyl group, benzofluorenyl group, styrylphenyl group, naphthacenyl group, perylenyl group, and a benzotized group or a ring-extended group thereof, among which a divalent group derived from one of a phenyl group, biphenylyl group, terphenylyl group, and naphthyl group are preferable, among which a divalent group derived from one of a phenyl group, biphenylyl group, and terphenylyl group are more preferable, among which a phenylene group is particularly preferable.

In $Ar_3$ in the formula (10A), examples of a divalent group derived from a substituted aromatic hydrocarbon group include a divalent group derived from one of a phenylnaphthyl group, naphthylphenyl group, tolyl group, xylyl group, silylphenyl group, trimethylsilylphenyl group, 9,9-dimethylfluorenyl group, 9,9-diphenylfluorenyl group, 9,9'-spirobifluorenyl group, and cyanophenyl group. Among the examples, a divalent group derived from one of a tolyl group, xylyl group, trimethylsilylphenyl group, 9,9-dimethylfluorenyl group, 9,9-diphenylfluorenyl group, 9,9'-spirobifluorenyl group, cyanophenyl group, silylphenyl group and the like is preferable.

In the formula (10A), the alkyl group for $Ar_1$ and $Ar_2$ is preferably each independently an alkyl group having 1 to 10 carbon atoms, more preferably an alkyl group having 1 to 5 carbon atoms.

Examples of the alkyl group for $Ar_1$ and $Ar_2$ in the formula (10A) include a methyl group, ethyl group, n-propyl group, isopropyl group, n-butyl group, isobutyl group, s-butyl group, t-butyl group, pentyl group (including an isomer thereof), hexyl group (including an isomer thereof), heptyl group (including an isomer thereof), octyl group (including an isomer thereof), nonyl group (including an isomer thereof), decyl group (including an isomer thereof), undecyl group (including an isomer thereof) and dodecyl group (including an isomer thereof), among which a methyl group, ethyl group, n-propyl group, isopropyl group, n-butyl group, isobutyl group, s-butyl group, t-butyl group, and pentyl group (including an isomer thereof) are preferable, among which a methyl group, ethyl group, n-propyl group, isopropyl group, n-butyl group, isobutyl group, s-butyl group, and t-butyl group are more preferable, among which a methyl group, ethyl group, isopropyl group and t-butyl group are particularly preferable.

In the formula (10A), the divalent group derived from the alkyl group for $Ar_3$ is preferably a divalent group derived from an aromatic hydrocarbon group having 1 to 10 carbon atoms, more preferably a divalent group derived from an alkyl group having 1 to 5 carbon atoms.

Examples of the divalent group derived from the alkyl group for $Ar_3$ in the formula (10A) include a divalent group derived from one of a methyl group, ethyl group, n-propyl group, isopropyl group, n-butyl group, isobutyl group, s-butyl group, t-butyl group, pentyl group (including an isomer thereof), hexyl group (including an isomer thereof), heptyl group (including an isomer thereof), octyl group (including an isomer thereof), nonyl group (including an isomer thereof), decyl group (including an isomer thereof), undecyl group (including an isomer thereof) and dodecyl group (including an isomer thereof), among which a divalent group derived from one of a methyl group, ethyl group, n-propyl group, isopropyl group, n-butyl group, isobutyl group, s-butyl group, t-butyl group, and pentyl group (including an isomer thereof) are preferable, among which a divalent group derived from one of a methyl group, ethyl group, n-propyl group, isopropyl group, n-butyl group, isobutyl group, s-butyl group, and t-butyl group are more preferable, among which a divalent group derived from one of a methyl group, ethyl group, isopropyl group and t-butyl group is particularly preferable.

In the formula (10A), the alkyl group for $Ar_1$ and $Ar_2$ may be each independently a cycloalkyl group having 3 to 50 ring carbon atoms.

In the formula (10A), the cycloalkyl group for $Ar_1$ and $Ar_2$ is preferably each independently a cycloalkyl group having 3 to 6 ring carbon atoms, more preferably a cycloalkyl group having 5 to 6 ring carbon atoms. In the formula (10A), examples of the cycloalkyl group for $Ar_1$ and $Ar_2$ include a cyclopropyl group, cyclobutyl group, cyclopentyl group, cyclohexyl group, cycloheptyl group, cyclooctyl group, and adamantyl group, among which a cyclopentyl group and a cyclohexyl group are preferable.

In the formula (10A), the divalent group derived from the alkyl group for $Ar_3$ may be a divalent group derived from a cycloalkyl group having 3 to 50 ring carbon atoms.

In the formula (10A), the divalent group derived from the cycloalkyl group for $Ar_3$ is preferably a divalent group derived from a cycloalkyl group having 3 to 6 ring carbon atoms, more preferably a divalent group derived from a cycloalkyl group having 5 to 6 ring carbon atoms. In the formula (10A), examples of the divalent group derived from the cycloalkyl group for $Ar_3$ include a divalent group derived from one of a cyclopropyl group, cyclobutyl group, cyclopentyl group, cyclohexyl group, cycloheptyl group, cyclooctyl group, and adamantyl group, among which a divalent group derived from one of a cyclopentyl group and a cyclohexyl group is preferable.

In the formula (10A), the alkenyl group for $Ar_1$ and $Ar_2$ is preferably each independently an alkenyl group having 2 to 20 carbon atoms, more preferably an alkenyl group having 2 to 10 carbon atoms. In the formula (10A), examples of the alkenyl group for $Ar_1$ and $Ar_2$ include a vinyl group, allyl group, 1-butenyl group, 2-butenyl group, 3-butenyl group, 1,3-butanedienyl group, 1-methylvinyl group, 1-methylallyl group, 1,1-dimethyllallyl group, 2-methylallyl group, and 1,2-dimethyllallyl group.

In the formula (10A), examples of a substituted alkenyl group for $Ar_1$ and $Ar_2$ include a styryl group, 2,2-diphenylvinyl group, 1,2-diphenylvinyl group, 1-phenylallyl group, 2-phenylallyl group, 3-phenylallyl group, 3,3-diphenylallyl group, 1-phenyl-1-butenyl group, and 3-phenyl-1-butenyl group.

In the formula (10A), the divalent group derived from the alkenyl group for $Ar_3$ is preferably a divalent group derived from an alkenyl group having 2 to 20 carbon atoms, more preferably a divalent group derived from an alkenyl group having 2 to 10 carbon atoms. In the formula (10A), examples of a divalent group derived from an alkenyl group for $Ar_3$ include a divalent group derived from one of a vinyl group, allyl group, 1-butenyl group, 2-butenyl group, 3-butenyl group, 1,3-butanedienyl group, 1-methylvinyl group, 1-methylallyl group, 1,1-dimethyllallyl group, 2-methylallyl group, and 1,2-dimethyllallyl group.

In the formula (10A), examples of a divalent group derived from a substituted alkenyl group for $Ar_3$ include a divalent group derived from one of a styryl group, 2,2-diphenylvinyl group, 1,2-diphenylvinyl group, 1-phenylallyl group, 2-phenylallyl group, 3-phenylallyl group, 3,3-diphenylallyl group, 1-phenyl-1-butenyl group, and 3-phenyl-1-butenyl group.

In the formula (10A), the alkynyl group for $Ar_1$ and $Ar_2$ is preferably each independently an alkynyl group having 2 to 20 carbon atoms, more preferably an alkynyl group having 2 to 10 carbon atoms. In the formula (10A), examples of the alkynyl group for $Ar_1$ and $Ar_2$ include a propargyl group and 3-pentynyl group.

In the formula (10A), the divalent group derived from the alkynyl group for $Ar_3$ is preferably a divalent group derived from an alkynyl group having 2 to 20 carbon atoms, more preferably a divalent group derived from an alkynyl group having 2 to 10 carbon atoms. In the formula (10A), examples of the divalent group derived from the alkynyl group for $Ar_3$ include a divalent group derived from one of a propargyl group, 3-pentynyl group and the like.

In the formula (10A), the heterocyclic group for $Ar_1$ and $Ar_2$ is preferably each independently a heterocyclic group having 5 to 24 ring atoms, more preferably a heterocyclic-group having 5 to 18 ring atoms. In the formula (10A), examples of the heterocyclic group for $Ar_1$ and $Ar_2$ include a heterocyclic group having 1 to 5 hetero atoms (e.g., nitrogen atom, oxygen atom and sulfur atom).

In the formula (10A), examples of the heterocyclic group each independently for $Ar_1$ and $Ar_2$ include a pyrrolyl group, furyl group, thienyl group, pyridyl group, pyridazinyl group, pyrimidinyl group, pyrazinyl group, triazinyl group, imidazolyl group, oxazolyl group, thiazolyl group, pyrazolyl group, isooxazolyl group, isothiazolyl group, oxadiazolyl group, thiadiazole group, triazolyl group, tetrazolyl group, indolyl group, isoindolyl group, benzofuranyl group, isobenzofuranyl group, benzothiophenyl group, isobenzothiophenyl group, indolizinyl group, quinolizinyl group, quinolyl group, isoquinolyl group, cinnolyl group, phthalazinyl group, quinazolinyl group, quinoxalinyl group, benzimidazolyl group, benzoxazolyl group, benzothiazolyl group, indazolyl group, benzisoxazolyl group, benzisothiazolyl group, dibenzofuranyl group, dibenzothiophenyl group, carbazolyl group, phenanthridinyl group, acridinyl group, phenanthrolinyl group, phenazinyl group, phenothiazinyl group, phenoxazinyl group, and xanthenyl group, among which a furyl group, thienyl group, pyridyl group, pyridazinyl group, pyrimidinyl group, pyrazinyl group, triazinyl group, benzofuranyl group, benzothiophenyl group, dibenzofuranyl group, and dibenzothiophenyl group are preferable, among which a benzofuranyl group, benzothiophenyl group, dibenzofuranyl group, and dibenzothiophenyl group are more preferable.

In the formula (10A), the divalent group derived from the heterocyclic group for $Ar_3$ is preferably a divalent group derived from a heterocyclic group having 5 to 24 ring atoms, more preferably a divalent group derived from a heterocyclic group having 5 to 18 ring atoms. In the formula (10A), examples of the divalent group derived from the heterocyclic group for $Ar_3$ include a divalent group derived from a heterocyclic group having 1 to 5 hetero atoms (e.g., nitrogen atom, oxygen atom and sulfur atom).

In the formula (10A), the examples of the divalent group derived from the heterocyclic group for $Ar_3$ further include a divalent group derived from one of a pyrrolyl group, furyl group, thienyl group, pyridyl group, pyridazinyl group, pyrimidinyl group, pyrazinyl group, triazinyl group, imidazolyl group, oxazolyl group, thiazolyl group, pyrazolyl group, isooxazolyl group, isothiazolyl group, oxadiazolyl group, thiadiazole group, triazolyl group, tetrazolyl group, indolyl group, isoindolyl group, benzofuranyl group, isobenzofuranyl group, benzothiophenyl group, isobenzothiophenyl group, indolizinyl group, quinolizinyl group, quinolyl group, isoquinolyl group, cinnolyl group, phthalazinyl group, quinazolinyl group, quinoxalinyl group, benzimidazolyl group, benzoxazolyl group, benzothiazolyl group, indazolyl group, benzisoxazolyl group, benzisothiazolyl group, dibenzofuranyl group, dibenzothiophenyl group, carbazolyl group, phenanthridinyl group, acridinyl group, phenanthrolinyl group, phenazinyl group, phenothiazinyl group, phenoxazinyl group, and xanthenyl group, among which a divalent group derived from one of a furyl group, thienyl group, pyridyl group, pyridazinyl group, pyrimidinyl group, pyrazinyl group, triazinyl group, benzofuranyl group, benzothiophenyl group, dibenzofuranyl group, and dibenzothiophenyl group are preferable, among which a divalent group derived from one of a benzofuranyl group, benzothiophenyl group, dibenzofuranyl group, and dibenzothiophenyl group are more preferable.

In the compound represented by the formula (10), a substituent meant by "a substituted or unsubstituted" compound is a group selected from the group consisting of an alkyl group having 1 to 50 (preferably 1 to 10, more preferably 1 to 5) carbon atoms, an alkenyl group having 2 to 20 (preferably 2 to 10) carbon atoms, an alkynyl group having 2 to 20 (preferably 2 to 10) carbon atoms, a cycloalkyl group having 3 to 50 (preferably 3 to 6, more preferably 5 or 6) ring carbon atoms, an aromatic hydrocarbon group having 6 to 50 (preferably 6 to 24, more preferably 6 to 12) ring carbon atoms, an aralkyl group having 7 to 50 (preferably 7 to 24, more preferably 7 to 12) carbon atoms, an amino group, a monoalkylamino group or a dialkylamino group having an alkyl group having 1 to 50 (preferably 1 to 10, more preferably 1 to 5) carbon atoms, a monoarylamino group or a diarylamino group having an aromatic hydrocarbon group having 6 to 50 (preferably 6 to 24, more preferably 6 to 12) ring carbon atoms, an alkoxy group having an alkyl group having 1 to 50 (preferably 1 to 10, more preferably 1 to 5) carbon atoms, an aryloxy group having an aromatic hydrocarbon group having 6 to 50 (preferably 6 to 24, more preferably 6 to 12) ring carbon atoms, an alkylthio group having an alkyl group having 1 to 50 (preferably 1 to 10, more preferably 1 to 5) carbon atoms, an arylthio group having an aromatic hydrocarbon group having 6 to 50 (preferably 6 to 24, more preferably 6 to 12) ring carbon atoms, a mono-substituted silyl group, di-substituted silyl group, or tri-substituted silyl group having a group selected from an alkyl group having 1 to 50 (preferably 1 to 10, more preferably 1 to 5) carbon atoms and an aromatic hydrocarbon group having 6 to 50 (preferably 6 to 24, more preferably 6 to 12) ring carbon atoms, a heterocyclic group having 5 to 50 (preferably 5 to 24, more preferably 5 to 18) ring atoms and containing 1 to 5 (preferably 1 to 3, more preferably 1 or 2) hetero atoms (e.g., nitrogen atom, oxygen atom, sulfur atom), a haloalkyl group having 1 to 50 (preferably 1 to 10, more preferably 1 to 5) carbon atoms, <<nret>>
a halogen atom (fluorine atom, chlorine atom, bromine atom, iodine atom, preferably fluorine atom), a cyano group, and a nitro group.

Among the examples of the substituent, particularly, a substituent selected from the group consisting of an alkyl group having 1 to 5 carbon atoms, a cycloalkyl group having 5 or 6 carbon atoms, an aromatic hydrocarbon group having 6 to 12 ring carbon atoms, a heterocyclic group having 5 to 24 ring atoms and containing 1 to 3 hetero atoms (nitrogen atom, oxygen atom, sulfur atom) is preferable.

In the compound represent by the formula (10):

The alkyl group having 1 to 50 carbon atoms as a substituent meant by "substituted or unsubstituted" represents the same group described as the alkyl group for $Ar_1$ and $Ar_2$ in the formula (10A). The alkenyl group having 2 to 20 carbon atoms as a substituent meant by "substituted or unsubstituted" represents the same group described as the alkenyl group for $Ar_1$ and $Ar_2$ in the formula (10A).

The alkynyl group having 2 to 20 carbon atoms as a substituent meant by "substituted or unsubstituted" represents the same group described as the alkynyl group for $Ar_1$ and $Ar_2$ in the formula (10A).

The cycloalkyl group having 3 to 50 ring carbon atoms as a substituent meant by "substituted or unsubstituted" represents the same group described as the cycloalkyl group for $Ar_1$ and $Ar_2$ in the formula (10A).

The aromatic hydrocarbon group having 6 to 50 ring carbon atoms as a substituent meant by "substituted or unsubstituted" represents the same group described as the aromatic hydrocarbon group for $Ar_1$ and $Ar_2$ in the formula (10A).

The aralkyl group having 6 to 50 ring carbon atoms as a substituent meant by "substituted or unsubstituted" has an aromatic hydrocarbon group having 6 to 50 ring carbon atoms and an alkyl group having 1 to 50 carbon atoms. Examples of the moiety in a form of the alkyl group (also referred to as the alkyl-group moiety) represents the same as those of the alkyl group for $Ar_1$ and $Ar_2$ in the formula (10A). Examples of the moiety in a form of the aromatic hydrocarbon group (also referred to as the aromatic-hydrocarbon-group moiety) represents the same as those of the aromatic hydrocarbon group for $Ar_1$ and $Ar_2$ in the formula (10A).

In the monoalkylamino group or dialkylamino group as a substituent meant by "substituted or unsubstituted", examples of the alkyl-group moiety represents the same group described as the alkyl group for $Ar_1$ and $Ar_2$ in the formula (10A).

In the monoarylamino group or diarylamino group as a substituent meant by "substituted or unsubstituted", examples of the aryl-group moiety represents the same group described as the aromatic hydrocarbon group for $Ar_1$ and $Ar_2$ in the formula (10A).

In the alkoxy group as a substituent meant by "substituted or unsubstituted", examples of the alkyl-group moiety represents the same group described as the alkyl group for $Ar_1$ and $Ar_2$ in the formula (10A). The alkoxy group is preferably, for instance, a methoxy group and an ethoxy group.

In the aryloxy group as a substituent meant by "substituted or unsubstituted", examples of the aryl-group (aromatic-hydrocarbon-group) moiety represents the same group described as the aromatic hydrocarbon group for $Ar_1$ and $Ar_2$ in the formula (10A). The aryloxy group is exemplified by a phenoxy group.

In the alkylthio group as a substituent meant by "substituted or unsubstituted", examples of the alkyl-group moiety represents the same group described as the alkyl group for $Ar_1$ and $Ar_2$ in the formula (10A).

In the arylthio group as a substituent meant by "substituted or unsubstituted", examples of the aryl-group moiety represents the same group described as the aromatic hydrocarbon group for $Ar_1$ and $Ar_2$ in the formula (10A).

Examples of the mono-substituted silyl group, di-substituted silyl group, or tri-substituted silyl group as a substituent meant by "substituted or unsubstituted" include an alkylsilyl group having 1 to 50 carbon atoms and an arylsilyl group having 6 to 50 ring carbon atoms.

Examples of the alkylsilyl group having 1 to 50 carbon atoms include monoalkylsilyl group, dialkylsilyl group, and trialkylsilyl group. Examples of each of the alkyl group represent the same as those of the group described as the alkyl group for $Ar_1$ and $Ar_2$ in the formula (10A). Examples of the arylsilyl group having 6 to 50 ring carbon atoms include a monoarylsilyl group, diarylsilyl group, and triarylsilyl group. Examples of each aryl group represent the same as the examples of the group described as the aromatic hydrocarbon group for $Ar_1$ and $Ar_2$ in the formula (10A). Specific examples thereof include a trimethylsilyl group, triethylsilyl group, t-butyldimethylsilyl group, vinyldimethylsilyl group, propyldimethylsilyl group, isopropyldimethylsilyl group, triphenylsilyl group, phenyldimethylsilyl group, t-butyldiphenylsilyl group, and tritolylsilyl group.

The heterocyclic group as a substituent meant by "substituted or unsubstituted" represents the same group described as the heterocyclic group for $Ar_1$ and $Ar_2$ in the formula (10A).

Examples of the haloalkyl group as a substituent meant by "substituted or unsubstituted" include a halogenated alkyl group for $Ar_1$ and $Ar_2$ in the formula (10A), specifically, for instance, a trifluoromethyl group.

An emission color of the dopant material is not necessarily limited. However, when the dopant material is a fluorescent material, a main peak wavelength of emission spectrum is preferably in a range from 400 nm to 700 nm, more preferably in a range from 400 nm to 600 nm, further preferably in a range from 400 nm to 500 nm.

Herein, the main peak wavelength refers to the maximum emission intensity in the emission spectrum measured for a toluene solution in which the fluorescent material is dissolved at a concentration of $10^{-6}$ mol/l to $10^{-5}$ mol/l. As a measuring apparatus, a spectrofluorometer (manufactured by Hitachi High-Tech Science, F-7000) is used.

The light emitting layer may contain only one type of the dopant material or two or more types of the dopant material.

A content of the dopant material is not particularly limited. The content of the dopant material in the entire emitting layer is, for example, preferably 0.1 mass % to 20 mass %, more preferably 0.1 mass % to 10 mass %, further preferably 0.1 mass % to 5 mass %.

Electron Transporting Zone

In the organic EL device of the exemplary embodiment, the electron transporting zone preferably includes a fourth layer interposed between the cathode and the emitting layer, and a fifth layer interposed between the fourth layer and the emitting layer.

Specifically, it is preferable that the fourth layer is the electron transporting layer and the fifth layer is the hole blocking layer. The specific combination of the layers will be described in a second exemplary embodiment described later (see FIG. 2). When the fourth layer is the electron transporting layer, it is preferable that the electron transporting layer also serves as an electron injecting layer.

Also, it is preferable that the fourth layer contains the fourth compound, the fifth layer contains the fifth compound, and the electron mobility $\mu^{E4}$ of the fourth compound is higher than the electron mobility $\mu^{E5}$ of the fifth compound ($\mu^{E4} > \mu^{E5}$).

Accordingly, the effect of controlling the electron injection to the emitting layer is exhibited.

In the organic EL device of the exemplary embodiment, the electron affinity (affinity) Af of the fourth compound contained in the fourth layer is preferably 2.0 eV or more, more preferably 2.2 eV or more. The upper limit of the electron affinity Af is preferably 3.0 eV or less.

When the electron affinity Af of the fourth compound is 2.0 eV or more, the effect of controlling the electron injection to the emitting layer is exhibited.

The electron affinity Af can be measured by DPV (differential pulse voltammetry).

Specifically, the electron affinity Af is calculated according to the following formula described in (1) Organic Electronics, 6 (2005) p. 11-20, and (2) Organic Electronics, 10 (2009) p. 515-520.

Calculation formula:
$$Af\ (eV) = -1.19 \times (Ere - Efc) - 4.78\ eV$$

Ere: first reduction potential of the compound to be measured (eV)

Efc: first oxidation potential of ferrocene (eV)

The fourth compound contained in the fourth layer is not particularly limited as long as the relationship of mobility ($\mu^{E4} > \mu^{E5}$) is satisfied.

The fourth compound is, for example, preferably a nitrogen-containing heterocyclic derivative, and more preferably a nitrogen-containing heterocyclic derivative represented by a formula (12) below.

$$HAr\text{-}L^2\text{-}Ar^6\text{---}Ar^7 \quad (12)$$

In the formula (12), HAr is a substituted or unsubstituted nitrogen-containing heterocyclic group having 3 to 40 ring carbon atoms.

In the formula (12), $L^2$ is a single bond, a substituted or unsubstituted divalent aromatic hydrocarbon group having 6 to 50 ring carbon atoms, or a substituted or unsubstituted divalent aromatic heterocyclic group having 5 to 50 ring atoms.

In the formula (12), $Ar^6$ is a substituted or unsubstituted divalent aromatic hydrocarbon group having 6 to 50 ring carbon atoms.

In the formula (12), $Ar^7$ is a substituted or unsubstituted aromatic hydrocarbon group having 6 to 50 ring carbon atoms, or a substituted or unsubstituted aromatic heterocyclic group having 5 to 50 ring atoms.

Further, in the formula (12), the nitrogen-containing heterocyclic group, the aromatic hydrocarbon group and the aromatic heterocyclic group mentioned in the explanation of HAr, $L^2$, $Ar^6$ and $Ar^7$ may have a substituent.

In the formula (12), the nitrogen-containing heterocyclic group represented by HAr is preferably selected from the group consisting of a substituted or unsubstituted pyridine ring, a substituted or unsubstituted pyrimidine ring, a substituted or unsubstituted triazine ring, and a substituted or unsubstituted benzimidazole ring.

In the formula (12), examples of the aromatic hydrocarbon group having 6 to 50 ring carbon atoms represented by $L^2$ include a divalent group derived from the aromatic hydrocarbon group having 6 to 50 ring carbon atoms represented by $Ar^1$ to $Ar^3$ in the formula (A1). Preferable examples (preferable examples of ring carbon atoms and preferable example of the group that is a divalent group) are the same.

In the formula (12), examples of the aromatic heterocyclic group having 5 to 50 ring atoms represented by $L^2$ include a divalent group derived from the aromatic heterocyclic group having 5 to 50 ring atoms represented by $Ar^1$ to $Ar^3$ in the formula (A1). Preferable examples (preferable examples of ring atoms and preferable example of the group that is a divalent group) are the same.

In the formula (12), examples of the aromatic hydrocarbon group having 6 to 50 ring carbon atoms represented by $Ar^6$ include a divalent group derived from the aromatic hydrocarbon group having 6 to 50 ring carbon atoms represented by $Ar^1$ to $Ar^3$ in the formula (A1). Preferable examples (preferable examples of ring carbon atoms and preferable example of the group that is a divalent group) are the same.

In the formula (12), examples of the aromatic hydrocarbon group having 6 to 50 ring carbon atoms represented by $Ar^7$ include the aromatic hydrocarbon group having 6 to 50 ring carbon atoms represented by $Ar^1$ to $Ar^3$ in the formula (A1). Preferable examples (preferable examples of ring carbon atoms and preferable example of the group) are the same.

In the formula (12), examples of the aromatic heterocyclic group having 5 to 50 ring atoms represented by $Ar^1$ include the aromatic heterocyclic group having 5 to 50 ring atoms represented by $Ar^1$ to Ara in the formula (A1). Preferable examples (preferable examples of ring atoms and preferable example of the group) are the same.

The fourth layer may contain only one type of the fourth compound or two or more types of the fourth compound.

The content of the fourth compound in the entire fourth layer is, for example, preferably 80 mass % to 100 mass %, more preferably 60 mass % to 80 mass %, further preferably 40 mass % to 60 mass %.

It is preferable that the content of the fourth compound when the fourth layer is the common layer also falls within the same range as described above.

The fifth compound contained in the fifth layer is not particularly limited as long as the above relationship of the electron mobility is satisfied ($\mu^{E4} > \mu^{E5}$). The fourth compound and the fifth compound are mutually different in a molecular structure.

The fifth compound is, for example, preferably a nitrogen-containing heterocyclic derivative, and more preferably a nitrogen-containing heterocyclic derivative represented by the formula (12).

Specifically, in the exemplary embodiment, the fourth compound and the fifth compound can be selected in use among the nitrogen-containing heterocyclic derivatives represented by the formula (12) such that the electron mobility $\mu^{E4}$ of the fourth compound is larger than the electron mobility $\mu^{E5}$ of the fifth compound.

For instance, when the following compounds ET1 to ET6 are used as the fourth compound contained in the fourth layer, the following compounds HB1 to HB5 are preferably used as the fifth compound contained in the fifth layer. It should be noted that a combination of the fourth compound and the fifth compound is not limited to these specific examples.

[Formula 18]

ET1

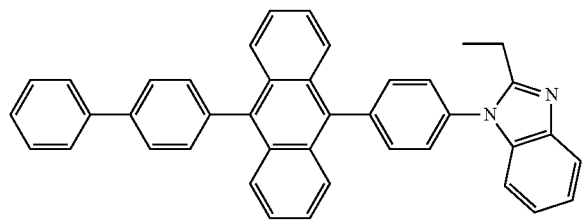

ET2

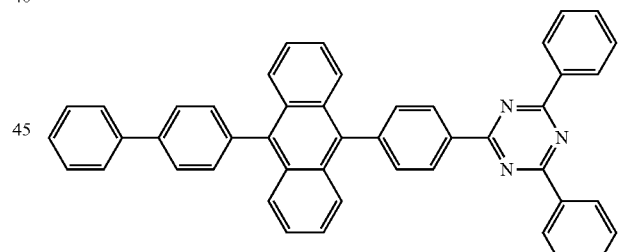

ET3

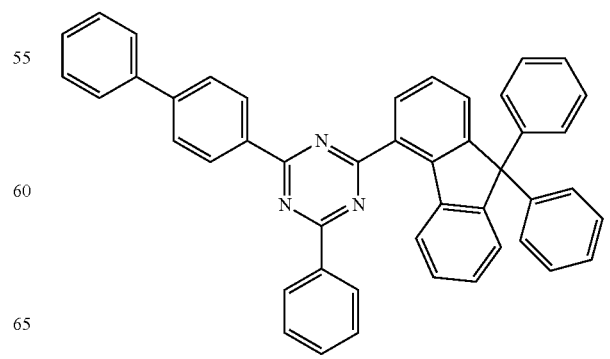

ET4
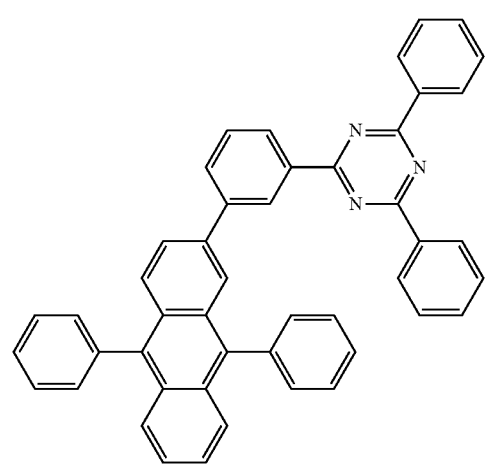
ET5
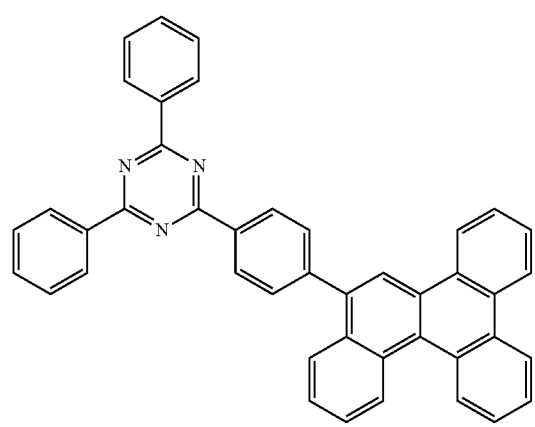
ET6
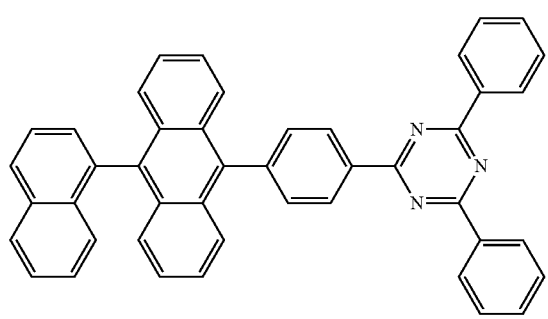
[Formula 19]
HB1
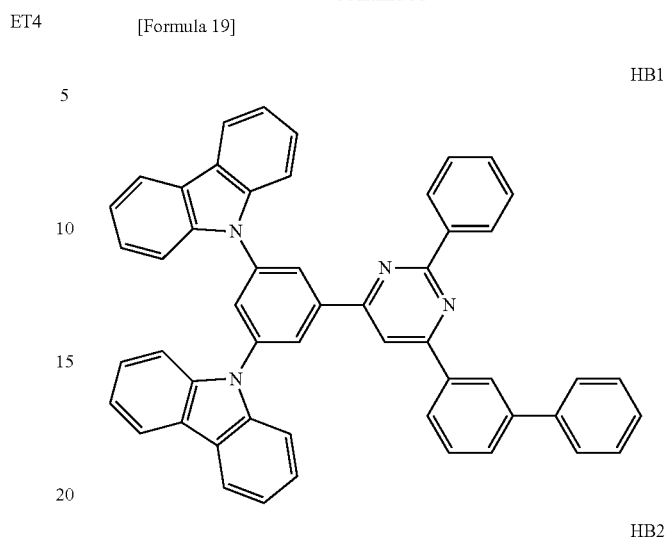
HB2
HB3
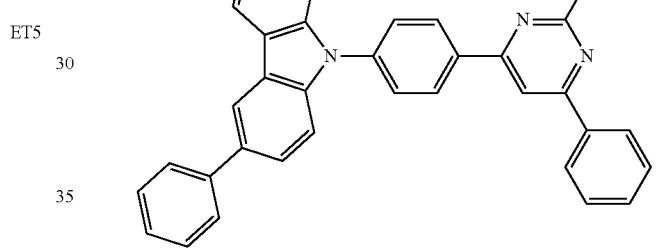
HB4
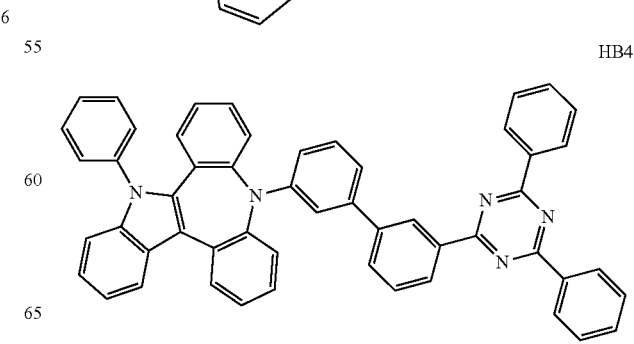

HB5

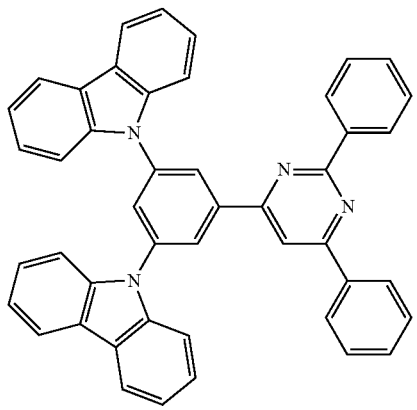

The fifth layer may include only one type of the fifth compound or may include two or more types of the fifth compound.

A content of the fifth compound in the entire fifth layer is preferably 90 mass % or more, more preferably 95 mass % or more, further preferably 99 mass % or more, particularly preferably 100 mass % or more.

The content of the fifth compound when the fifth layer is a common layer is also preferably in the same range as above.

In the organic EL device in the exemplary embodiment, the electron transporting zone preferably further includes a sixth layer containing a sixth compound between the fourth layer (the electron transporting layer in the exemplary embodiment) and the cathode. The sixth layer is exemplified by an electron injecting layer. With this layer, an electron injecting function is more efficiently expressed.

The sixth compound contained in the sixth layer is not particularly limited.

When the sixth layer is the electron injecting layer, the sixth compound is preferably a substance having a high electron injecting property. Examples of the sixth compound include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx).

In addition, an organic metal complex may be used for the sixth compound. The organic metal complex may be at least one organic metal complex selected from an organic metal complex including an alkali metal, an organic metal complex including an alkaline-earth metal, and an organic metal complex including rare-earth metal (e.g., ytterbium, europium, gadonium, and erbium).

The sixth layer may include only one type of the sixth compound or may include two or more types of the sixth compound.

A content of the sixth compound in the entire sixth layer is preferably 90 mass % or more, more preferably 95 mass % or more, further preferably 99 mass % or more, particularly preferably 100 mass % or more.

The content of the sixth compound when the sixth layer is a common layer is also preferably in the same range as above.

The organic EL device of the exemplary embodiment preferably emits blue light.

When the organic EL device of the exemplary embodiment emits blue light, the organic EL device preferably has a main peak wavelength in the range from 430 nm to 480 nm.

When the organic EL device of the exemplary embodiment emits green light, the organic EL device preferably has a main peak wavelength in the range from 520 nm to 570 nm.

When the organic EL device of the exemplary embodiment emits red light, the organic EL device preferably has a main peak wavelength in the range from 600 nm to 650 nm.

The main peak wavelength is measured as follows.

Voltage is applied on an organic EL device such that a current density is 10 $mA/cm^2$, where spectral radiance spectrum is measured by a spectroradiometer CS-2000 (manufactured by Konica Minolta, Inc.).

In the obtained spectral radiance spectrum, the peak wavelength of the emission spectrum at which the emission intensity is maximized is measured, and this is taken as the main peak wavelength (unit: nm).

Substrate

An organic EL element is produced on a substrate.

The substrate is used as a support for the organic EL device. The substrate may or may not be light transmissive. For instance, glass, quartz, plastics and the like are usable as the substrate. A flexible substrate is also usable. The flexible substrate means a bendable substrate. Examples of the flexible substrate include plastic substrates formed of polycarbonate or polyvinyl chloride.

Anode

The anode has a reflective layer. The reflective layer is preferably formed of a metallic material having light reflectivity. The light reflectivity means the property of reflecting 50% or more (preferably 80% or more) of the light emitted from the emitting layer.

Examples of metal materials include single materials such as Al, Ag, Ta, Zn, Mo, W, Ni and Cr, or alloy materials containing these metals as main components (preferably 50 mass % or more of the whole), amorphous alloys such as NiP, NiB, CrP, and CrB, and microcrystalline alloys such as NiAl and silver alloys.

Also, as the metallic material, APC (silver, palladium and copper alloy), ARA (silver, rubidium and gold alloy), MoCr (molybdenum and chromium alloy), NiCr (nickel and chromium alloy) and the like may be used.

The reflective layer may be a single layer or a plurality of layers.

The anode may be formed only of the reflective layer, but may be a multilayer structure having the reflective layer and a conductive layer (preferably a transparent conductive layer). When the anode has the reflective layer and the conductive layer, it is preferred that the conductive layer is disposed between the reflective layer and the hole transporting zone. In addition, the anode may have a multilayer structure in which the reflective layer is disposed between two conductive layers (a first conductive layer and a second conductive layer). In such a multilayer structure, the first conductive layer and the second conductive layer may be formed of the same material or may be formed of different materials.

It is preferable to use metal, an alloy, an electroconductive compound, and a mixture thereof, which have a large work function (specifically, 4.0 eV or more) for the conductive layer. Specific examples of the material include indium oxide-tin oxide (ITO: Indium Tin Oxide), indium oxide-tin oxide containing silicon or silicon oxide, indium oxide-zinc oxide, and indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the conductive layer may be formed by a vacuum deposition method, a coating method, an inkjet method, a spin coating method or the like.

For example, when a hole injection layer is formed in contact with a conductive layer, the hole injection layer is formed using a composite material that facilitates hole injection regardless of the work function of the conductive layer. Accordingly, a material usable as an electrode material (e.g., metal, an alloy, an electroconductive compound, a mixture thereof, and the elements belonging to the group 1 or 2 of the periodic table) is also usable for the conductive layer.

The elements belonging to the group 1 or 2 of the periodic table, which are a material having a small work function, specifically, an alkali metal such as lithium (Li) and cesium (Cs), an alkaline earth metal such as magnesium (Mg), calcium (Ca) and strontium (Sr), an alloy containing the alkali metal and the alkaline earth metal (e.g., MgAg, AlLi), a rare earth metal such as europium (Eu) and ytterbium (Yb), and an alloy containing the rare earth metal are usable for the conductive layer. It should be noted that the vacuum deposition method and the sputtering method are usable for forming the conductive layer using the alkali metal, alkaline earth metal and the alloy thereof. Further, when a silver paste is used for the conductive layer, the coating method and the inkjet method are usable.

Cathode

The cathode is preferably formed of a light-transmissive or semi-transmissive metallic material that transmits light from the emitting layer. The light-transmissive or semi-transmissive property means the property of allowing transmissivity of 50% or more (preferably 80% or more) of the light emitted from the emitting layer.

It is preferable to use metal, an alloy, an electroconductive compound, and a mixture thereof, which have a small work function (specifically, 3.8 eV or less) for the cathode. Examples of materials for the cathode include elements belonging to the group 1 or 2 of the periodic table, specifically, an alkali metal such as lithium (Li) and cesium (Cs), an alkaline earth metal such as magnesium (Mg), calcium (Ca) and strontium (Sr), an alloy containing the alkali metal and the alkaline earth metal (e.g., MgAg, AlLi), a rare earth metal such as europium (Eu) and ytterbium (Yb), and an alloy containing the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Mg, Ag, ITO, graphene, and indium oxide-tin oxide containing silicon or silicon oxide may be used for forming the cathode regardless of the work function. The conductive materials can be deposited as a film by sputtering, ink jet printing, spin coating and the like.

Capping Layer

The top emission type organic EL device usually has a capping layer on the top of the cathode.

As the capping layer, for example, a high polymer compound, metal oxide, metal fluoride, metal boride, silicon nitride, silicon compound (silicon oxide or the like), and the like can be used.

In addition, an aromatic amine derivative, an anthracene derivative, a pyrene derivative, a fluorene derivative, or a dibenzofuran derivative can also be used for the capping layer.

In addition, a laminate in which layers containing these substances are stacked can also be used as the capping layer.

Method of Forming Each Layer of Organic EL Device

As a method for forming each layer of the organic EL device in the exemplary embodiment, any methods of dry film-forming such as vacuum deposition, sputtering, plasma or ion plating and wet film-forming such as spin coating, dipping, flow coating or ink-jet are applicable.

In the wet film-forming, a material forming each layer is dissolved or dispersed in an appropriate solvent to form a thin film. The solvent is not particularly limited. Examples of the solvent include ethanol, chloroform, tetrahydrofuran, and dioxane.

In the formation of any of the layers, appropriate resins and additives may be used to improve film formability and to prevent pinholes in the film.

Film Thickness of Each Layer Of Organic EL Device

The film thickness (film thickness other than the first layer and the second layer) is not particularly limited, but is preferably set to an appropriate film thickness. When the film thickness is too thick, a large applied voltage is required to obtain a constant light output, resulting in poor efficiency. When the film thickness is too thin, pinholes and the like occur, and sufficient luminance cannot be obtained even when an electric field is applied.

For example, the film thickness of the hole blocking layer is preferably in a range from 1 nm to 20 nm. The film thickness of the other layers (layers other than the first layer and the second layer) is usually in a range from 5 nm to 1000 nm, and more preferably in a range from 10 nm to 200 nm.

Use of Organic EL Device

The organic EL device of the exemplary embodiment can be used in electronic devices such as display devices and light emitting devices. Examples of the display device include a display component (e.g., an organic EL panel module), TV, mobile phone, tablet and personal computer. Examples of the light-emitting unit include an illuminator and a vehicle light.

Herein, when a numerical range is represented by "a to b", a lower limit is the value (a) and an upper limit is the value (b).

Herein, the ring carbon atoms refer to the number of carbon atoms among atoms forming a ring of a compound (e.g., a monocyclic compound, fused-ring compound, crosslinking compound, carbon ring compound, and heterocyclic compound) in which the atoms are bonded to each other to form the ring. When the ring is substituted by a substituent(s), carbon atom(s) contained in the substituent(s) is not counted in the ring carbon atoms. Unless specifically described, the same applies to the "ring carbon atoms" described later. For instance, a benzene ring has 6 ring carbon atoms, a naphthalene ring has 10 ring carbon atoms, a pyridinyl group has 5 ring carbon atoms, and a furanyl group has 4 ring carbon atoms. When a benzene ring and/or a naphthalene ring is substituted by a substituent (e.g., an alkyl group), the number of carbon atoms of the alkyl group is not counted in the number of the ring carbon atoms. When a fluorene ring is substituted by a substituent (e.g., a fluorene ring) (i.e., a spirofluorene ring is included), the number of carbon atoms of the fluorene ring as the substituent is not counted in the number of the ring carbon atoms of the fluorene ring.

Herein, the ring atoms refer to the number of atoms forming a ring of a compound (e.g., a monocyclic compound, fused-ring compound, crosslinking compound, carbon ring compound, and heterocyclic compound) in which the atoms are bonded to each other to form the ring (e.g., monocyclic ring, fused ring, ring assembly). Atom(s) not forming a ring and atom(s) included in a substituent when the ring is substituted by the substituent are not counted in the number of the ring atoms. Unless specifically described, the same applies to the "ring atoms" described later. For instance, a pyridine ring has six ring atoms, a quinazoline ring has ten ring atoms, and a furan ring has five ring atoms. A hydrogen atom(s) and/or an atom(s) of a substituent which are bonded to carbon atoms of a pyridine ring and/or quinazoline ring are not counted in the ring atoms. When a fluorene ring is substituted by a substituent (e.g., a fluorene ring) (i.e., a spirofluorene ring is included), the number of atoms of the fluorene ring as the substituent is not counted in the number of the ring atoms of the fluorene ring.

Next, each substituent described in the general formula will be described (description of each substituent).

Examples of the aryl group having 6 to 50 ring carbon atoms (occasionally referred to as an aromatic hydrocarbon group) in the exemplary embodiment are a phenyl group, biphenyl group, terphenyl group, naphthyl group, anthryl group, phenanthryl group, fluorenyl group, pyrenyl group, chrysenyl group, fluoranthenyl group, benz[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

Herein, the aryl group preferably has 6 to 30 ring carbon atoms, more preferably 6 to 20 ring carbon atoms, further preferably 6 to 14 ring carbon atoms, still further preferably 6 to 12 ring carbon atoms. Among the aryl group, a phenyl group, biphenyl group, naphthyl group, phenanthryl group, terphenyl group and fluorenyl group are particularly preferable. A carbon atom in a position 9 of each of 1-fluorenyl group, 2-fluorenyl group, 3-fluorenyl group and 4-fluorenyl group is preferably substituted by a substituted or unsubstituted alkyl group having 1 to 30 carbon atoms or a substituted or unsubstituted aryl group having 6 to 18 ring carbon atoms described later herein.

The heteroaryl group (occasionally referred to as heterocyclic group, heteroaromatic ring group or aromatic heterocyclic group) having 5 to 50 ring atoms herein preferably contains a hetero atom, at least one atom selected from the group consisting of nitrogen, sulfur, oxygen, silicon, selenium atom and germanium atom, and more preferably contains at least one atom selected from the group consisting of nitrogen, sulfur and oxygen.

Examples of the heterocyclic group having 5 to 50 ring atoms in the exemplary embodiment are a pyridyl group, pyrimidinyl group, pyrazinyl group, pyridazinyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothienyl group, benzoxazolyl group, benzothiazolyl group, benzisoxazolyl group, benzisothiazolyl group, benzoxadiazolyl group, benzothiadiazolyl group, dibenzofuranyl group, dibenzothienyl group, piperidinyl group, pyrrolidinyl group, piperazinyl group, morpholyl group, phenazinyl group, phenothiazinyl group, and phenoxazinyl group.

Herein, the heterocyclic group preferably has 5 to 30 ring atoms, more preferably 5 to 20 ring atoms, further preferably 5 to 14 ring atoms. Among the above heterocyclic group, a 1-dibenzofuranyl group, 2-dibenzofuranyl group, 3-dibenzofuranyl group, 4-dibenzofuranyl group, 1-dibenzothienyl group, 2-dibenzothienyl group, 3-dibenzothienyl group, 4-dibenzothienyl group, 1-carbazolyl group, 2-carbazolyl group, 3-carbazolyl group, 4-carbazolyl group, and 9-carbazolyl group are further preferable. A nitrogen atom in position 9 of 1-carbazolyl group, 2-carbazolyl group, 3-carbazolyl group and 4-carbazolyl group is preferably substituted by the substituted or unsubstituted aryl group having 6 to 30 ring carbon atoms or the substituted or unsubstituted heterocyclic group having 5 to 30 ring atoms described herein.

Herein, the heterocyclic group may be a group derived from any one of moieties represented by formulae (XY-1) to (XY-18) below.

[Formula 20]

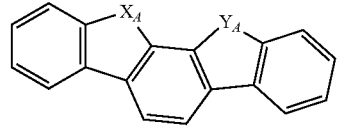

(XY-1)

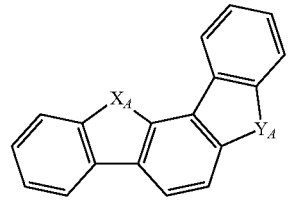

(XY-2)

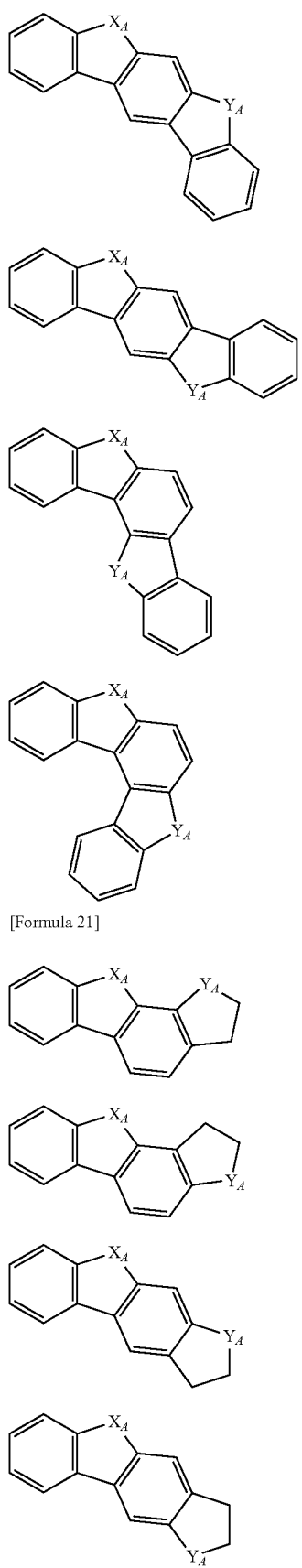
[Formula 21]
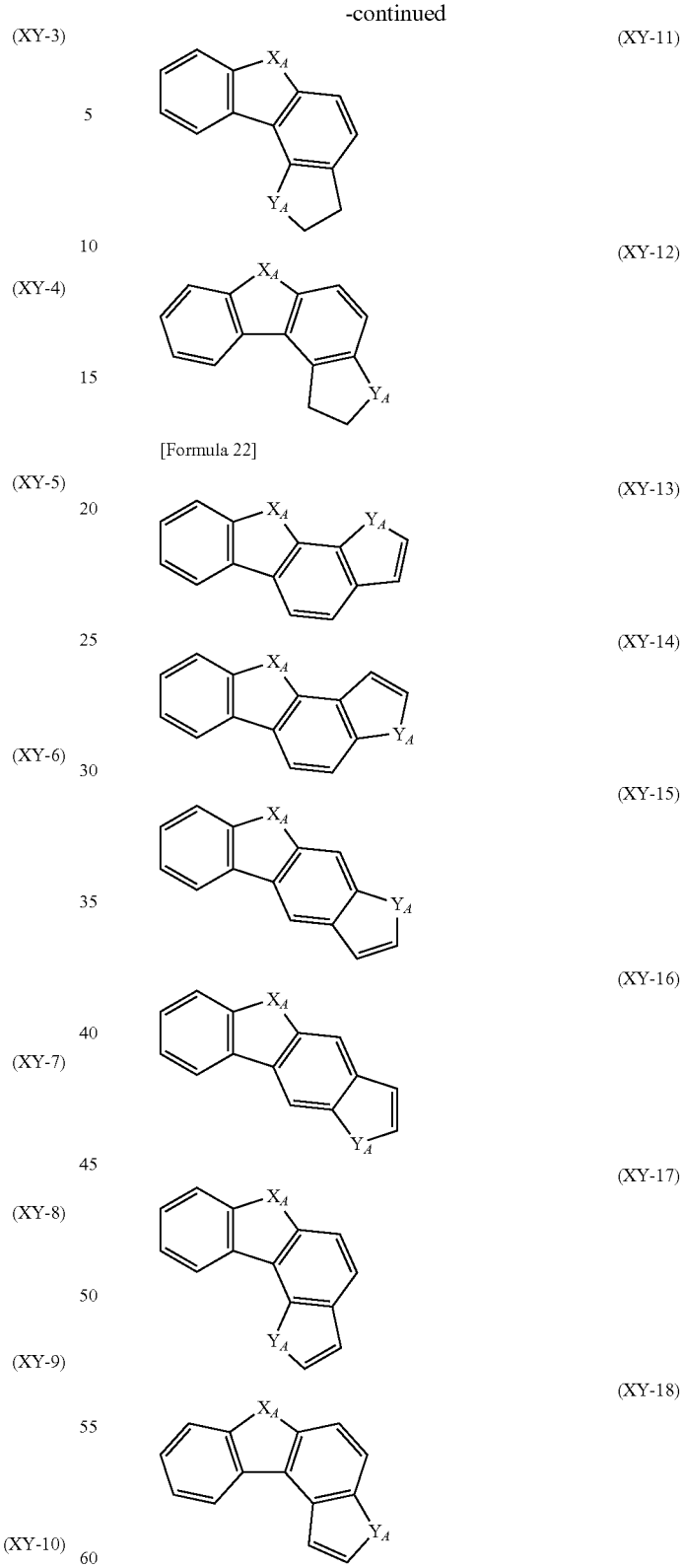
[Formula 22]
In the formulae (XY-1) to (XY-18), $X_A$ and $Y_A$ each independently represent a hetero atom, and preferably represent an oxygen atom, sulfur atom, selenium atom, silicon atom or germanium atom. Each of the moieties represented by the respective formulae (XY-1) to (XY-18) has a bond at any position to provide a heterocyclic group. The heterocyclic group may be substituted.

Herein, examples of the substituted or unsubstituted carbazolyl group may include a group in which a carbazole ring is further fused with a ring(s) as shown in the following formulae. Such a group may have a substituent. Moreover, the position of the bond may be changed as needed

[Formula 23]

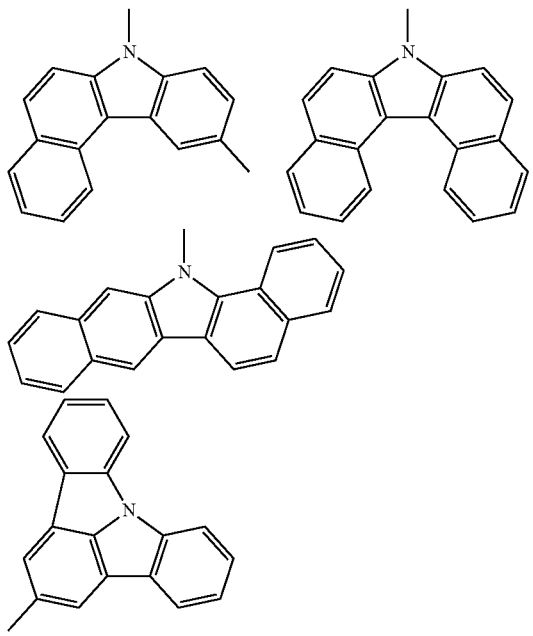

The alkyl group having 1 to 50 carbon atoms herein may be linear, branched or cyclic. Also, the alkyl group may be an alkyl halide group.

Examples of the linear or branched alkyl group include: a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, amyl group, isoamyl group, 1-methylpentyl group, 2-methylpentyl group, 1-pentylhexyl group, 1-butylpentyl group, 1-heptyloctyl group, and 3-methylpentyl group.

Herein, the linear or branched alkyl group preferably has 1 to 10 carbon atoms, more preferably 1 to 6 carbon atoms. Among the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group and neopentyl group are preferable.

Herein, examples of the cyclic alkyl group include a cycloalkyl group having 3 to 50 ring carbon atoms.

Examples of the cycloalkyl group having 3 to 50 ring carbon atoms herein are a cyclopropyl group, cyclobutyl group, cyclopentyl group, cyclohexyl group, 4-metylcyclohexyl group, adamantyl group and norbornyl group. The cycloalkyl group preferably has 3 to 10 ring carbon atoms, more preferably 5 to 8 ring carbon atoms. Among the cycloalkyl group, a cyclopentyl group and a cyclohexyl group are more preferable.

Herein, the alkyl halide group provided by substituting the alkyl group with a halogen atom is exemplified by an alkyl halide group provided by substituting the alkyl group having 1 to 50 carbon atoms with at least one halogen atom, preferably at least one fluorine atom.

Herein, examples of the alkyl halide group having 1 to 50 carbon atoms include a fluoromethyl group, difluoromethyl group, trifluoromethyl group, fluoroethyl group, trifluoromethylmethyl group, trifluoroethyl group, and pentafluoroethyl group.

Herein, examples of a substituted silyl group include an alkylsilyl group having 3 to 50 carbon atoms and an arylsilyl group having 6 to 50 ring carbon atoms.

Herein, the alkylsilyl group having 3 to 50 carbon atoms is exemplified by a trialkylsilyl group having the above examples of the alkyl group having 1 to 50 carbon atoms. Specific examples of the alkylsilyl group are a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyl dimethylsilyl group, propyldimethylsilyl group, and triisopropylsilyl group. Three alkyl groups in the trialkylsilyl group may be mutually the same or different.

Herein, examples of the arylsilyl group having 6 to 50 ring carbon atoms include a dialkylarylsilyl group, alkyldiarylsilyl group and triarylsilyl group.

The dialkylarylsilyl group is exemplified by a dialkylarylsilyl group including two of the alkyl groups listed as the examples of the alkyl group having 1 to 50 carbon atoms and one of the aryl groups listed as the examples of the aryl group having 6 to 50 ring carbon atoms. The dialkylarylsilyl group preferably has 8 to 30 carbon atoms.

The alkyldiarylsilyl group is exemplified by an alkyldiarylsilyl group including one of the alkyl groups listed as the examples of the alkyl group having 1 to 50 carbon atoms and two of the aryl groups listed as the examples of the aryl group having 6 to 50 ring carbon atoms. The alkyldiarylsilyl group preferably has 13 to 30 carbon atoms.

The triarylsilyl group is exemplified by a triarylsilyl group including three of the aryl group listed as the examples of the aryl group having 6 to 50 ring carbon atoms. The triarylsilyl group preferably has 18 to 30 carbon atoms.

Herein, the alkyl sulfonyl group is represented by —SO$_2$R$_w$, where R$_w$ represents a substituted or unsubstituted alkyl group.

Examples of the substituted or unsubstituted alkylsulfonyl group having 1 to 50 carbon atoms herein include a group represented by the above —SO$_2$R$_w$, where R$_w$ is substituted or unsubstituted alkyl group having 1 to 50 carbon atoms.

Herein, an aryl group in an aralkyl group (occasionally referred to as an arylalkyl group) is an aromatic hydrocarbon group or a heterocyclic group.

The aralkyl group having 7 to 50 carbon atoms herein is preferably a group having an aryl group having 6 to 30 ring carbon atoms and is represented by —Z$_3$-Z$_4$. Z$_3$ is exemplified by an alkylene group corresponding to the above alkyl group having 1 to 30 carbon atoms. Z$_4$ is exemplified by the above aryl group having 6 to 30 ring carbon atoms. In this aralkyl group, an aryl moiety has 6 to 30 carbon atoms, preferably 6 to 20 carbon atoms, more preferably 6 to 12 carbon atoms and an alkyl moiety has 1 to 30 carbon atoms, preferably 1 to 20 carbon atoms, more preferably 1 to 10 carbon atoms, further preferably 1 to 6 carbon atoms. Examples of the aralkyl group are a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

The alkoxy group having 1 to 50 carbon atoms herein is represented by —$OZ_1$. $Z_1$ is exemplified by the above alkyl group having 1 to 50 carbon atoms. Examples of the alkoxy group include a methoxy group, ethoxy group, propoxy group, butoxy group, pentyloxy group and hexyloxy group. The alkoxy group preferably has 1 to 30 carbon atoms, more preferably 1 to 20 carbon atoms.

A halogenated alkoxy group provided by substituting an alkoxy group with a halogen atom is exemplified by one provided by substituting an alkoxy group having 1 to 50 carbon atoms with one or more fluorine atoms.

Herein, an aryl group in an aryloxy group (sometime referred to as an arylalkoxy group) also includes a heteroaryl group.

The arylalkoxy group having 6 to 50 ring carbon atoms herein is represented by —$OZ_2$. $Z_2$ is exemplified by the above aryl group having 6 to 50 ring carbon atoms. The arylalkoxy group preferably has 6 to 30 ring carbon atoms, more preferably 6 to 20 ring carbon atoms. The arylalkoxy group is exemplified by a phenoxy group.

Herein, the substituted amino group is represented by —NHRv or —N(Rv)$_2$. Rv is exemplified by the above alkyl group having 1 to 50 carbon atoms and aryl group having 6 to 50 ring carbon atoms.

Herein, the alkenyl group having 2 to 50 carbon atoms is linear or branched. Examples of the alkenyl group include a vinyl group, propenyl group, butenyl group, oleyl group, eicosapentaenyl group, docosahexaenyl group, styryl group, 2,2-diphenylvinyl group, 1,2,2-triphenylvinyl group, and 2-phenyl-2-propenyl group.

The alkynyl group having 2 to 50 carbon atoms herein may be linear or branched. Examples of the alkynyl group having 2 to 50 carbon atoms are an ethynyl group, a propynyl group and a 2-phenylethynyl group.

Herein, the alkylthio group having 1 to 50 ring carbon atoms and the arylthio group having 6 to 50 ring carbon atoms are represented by —$SR_v$. Rv is exemplified by the above alkyl group having 1 to 50 carbon atoms or the aryl group having 6 to 50 ring carbon atoms. The alkylthio group preferably has 1 to 30 carbon atoms, more preferably 1 to 20 carbon atoms. The arylthio group preferably has 6 to 30 ring carbon atoms, more preferably 6 to 20 ring carbon atoms.

Herein, examples of the halogen atom include a fluorine atom, a chlorine atom, a bromine atom and an iodine atom, among which a fluorine atom is preferable.

Herein, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a ring including a saturated ring, unsaturated ring, or aromatic ring.

Herein, a hydrogen atom includes isotope having different numbers of neutrons, specifically, protium, deuterium and tritium.

Herein, the substituent meant by "substituted or unsubstituted" is at least one group selected from the group consisting of an aryl group having 6 to 50 ring carbon atoms, heteroaryl group having 5 to 50 ring atoms, alkyl group having 1 to 50 carbon atoms (linear or branched alkyl group), cycloalkyl group having 3 to 50 ring carbon atoms, alkyl halide group having 1 to 50 carbon atoms, alkylsilyl group having 3 to 50 carbon atoms, arylsilyl group having 6 to 50 ring carbon atoms, alkoxy group having 1 to 50 carbon atoms, aryloxy group having 6 to 50 carbon atoms, substituted amino group, alkylthio group having 1 to 50 carbon atoms, arylthio group having 6 to 50 ring carbon atoms, aralkyl group having 7 to 50 carbon atoms, alkenyl group having 2 to 50 carbon atoms, halogen atom, alkynyl group having 2 to 50 carbon atoms, cyano group, hydroxyl group, nitro group, and carboxy group.

Herein, the substituent meant by "substituted or unsubstituted" is preferably at least one group selected from the group consisting of an aryl group having 6 to 50 ring carbon atoms, heteroaryl group having 5 to 50 ring atoms, alkyl group having 1 to 50 carbon atoms (linear or branched alkyl group), halogen atom, and cyano group, further preferably the specific preferable examples described in the description of the substituents.

Herein, the substituent meant by "substituted or unsubstituted" is preferably at least one group selected from the group consisting of an aryl group having 6 to 30 ring carbon atoms, heteroaryl group having 5 to 30 ring atoms, alkyl group having 1 to 30 carbon atoms (linear or branched alkyl group), halogen atom, and cyano group, further preferably the specific preferable examples described in the description of the substituents.

Herein, the substituent meant by "substituted or unsubstituted" may be further substituted by at least one group selected from the group consisting of an aryl group having 6 to 50 ring carbon atoms, heteroaryl group having 5 to 50 ring atoms, alkyl group having 1 to 50 carbon atoms (linear or branched alkyl group), cycloalkyl group having 3 to 50 ring carbon atoms, alkyl halide group having 1 to 50 carbon atoms, alkylsilyl group having 3 to 50 carbon atoms, arylsilyl group having 6 to 50 ring carbon atoms, alkoxy group having 1 to 50 carbon atoms, aryloxy group having 6 to 50 carbon atoms, substituted amino group, alkylthio group having 1 to 50 carbon atoms, arylthio group having 6 to 50 ring carbon atoms, aralkyl group having 7 to 50 carbon atoms, alkenyl group having 2 to 50 carbon atoms, alkynyl group having 2 to 50 carbon atoms, halogen atom, cyano group, hydroxyl group, nitro group, and carboxy group. In addition, adjacent two or more of the substituents may be bonded to each other to form a ring.

Herein, the substituent for the substituent meant by the description of "substituted or unsubstituted" is preferably at least one group selected from the group consisting of an aryl group having 6 to 50 ring carbon atoms, heteroaryl group having 5 to 50 ring atoms, alkyl group having 1 to 50 carbon atoms (linear or branched alkyl group), halogen atom, and cyano group, further preferably the preferable examples of each of the substituents in the description.

Herein, the substituent for the substituent meant by the description of "substituted or unsubstituted" is preferably at least one group selected from the group consisting of an aryl group having 6 to 30 ring carbon atoms, heteroaryl group having 5 to 30 ring atoms, alkyl group having 1 to 30 carbon atoms (linear or branched alkyl group), halogen atom, and cyano group, further preferably the preferable examples of each of the substituents in the description.

"Unsubstituted" in "substituted or unsubstituted" means that a group is not substituted by the above-described substituents but bonded with a hydrogen atom.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group.

Herein, "XX to YY atoms" in the description of "substituted or unsubstituted ZZ group having XX to YY atoms" represent atoms of an unsubstituted ZZ group and does not include atoms of a substituent(s) of the substituted ZZ group.

The same description as the above applies to "substituted or unsubstituted" in compounds or moieties thereof described herein.

Herein, when the substituents are bonded to each other to form a ring, the ring is structured to be a saturated ring, an unsaturated ring, an aromatic hydrocarbon ring or a hetero ring.

Herein, examples of the aromatic hydrocarbon group and the heterocyclic group in the linking group include a divalent or multivalent group obtained by eliminating one or more atoms from the above monovalent groups.

Second Exemplary Embodiment

Figure 2:
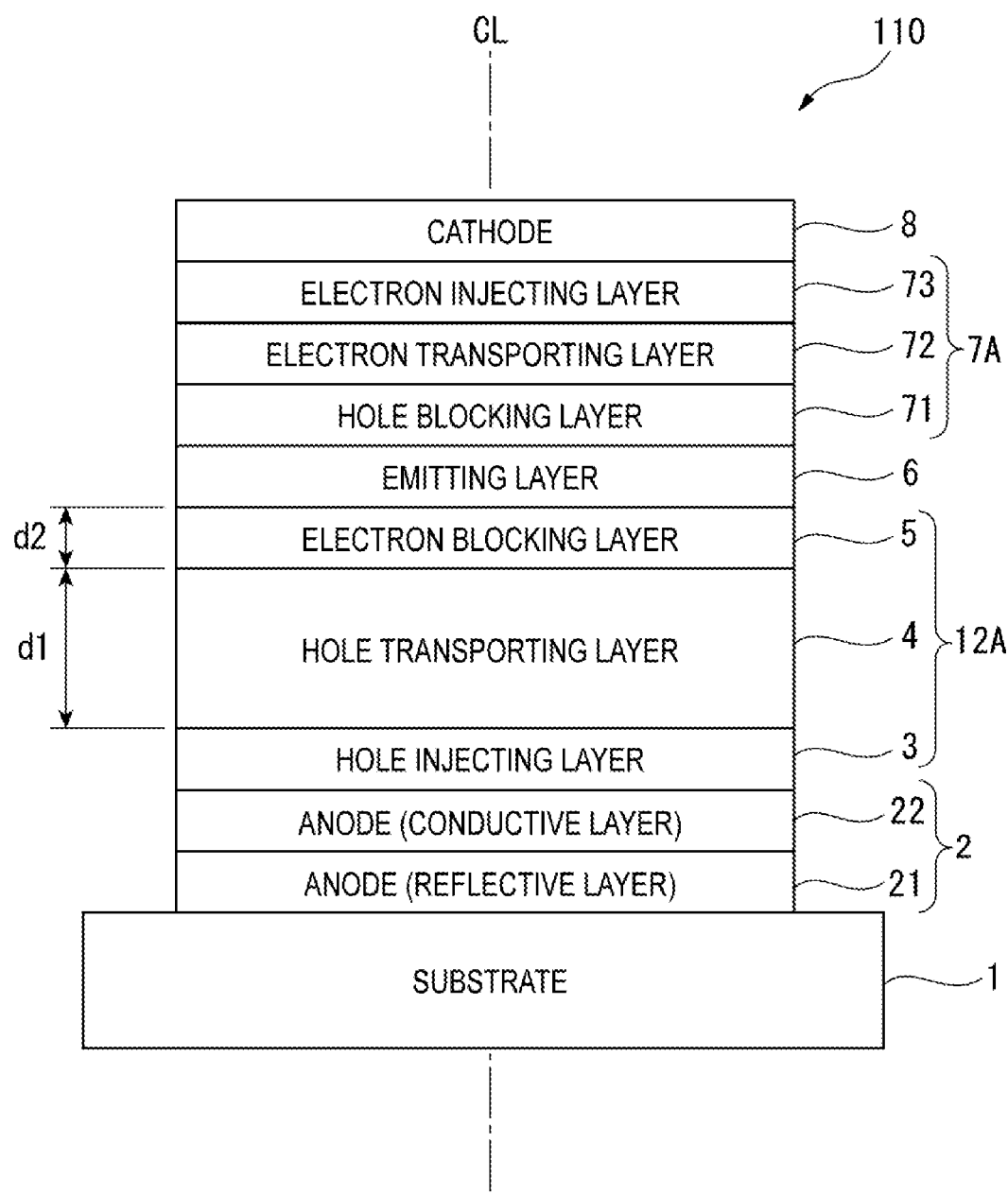
FIG. 2 shows an exemplary top emission organic EL device in a second exemplary embodiment of the invention.

FIG. 2 schematically shows an exemplary top emission organic EL device in a second exemplary embodiment of the invention.

An organic EL device 110 shown in FIG. 2 is the same as the organic EL device 100 except that the hole transporting zone and the electron transporting zone are different from those in the organic EL device 100 shown in FIG. 1. A hole transporting zone 12A of the organic EL device 110 in the exemplary embodiment includes a hole injecting layer 3 (third layer), the hole transporting layer 4 (first layer), and the electron blocking layer 5 (second layer) in this order from a side of the anode 2. An electron transporting zone 7A includes an electron injecting layer 73 (sixth layer), an electron transporting layer 72 (fourth layer), and a hole blocking layer 71 (fifth layer) in this order from a side of the cathode 8.

Further, in the organic EL device 110 shown in FIG. 2, a relationship between the electron mobility $\mu^{E4}$ of the fourth compound contained in the electron transporting layer 72 and the electron mobility $\mu^{E5}$ of the fifth compound contained in the hole blocking layer 71 is defined as $\mu^{E4} > \mu^{E5}$, with reference to the organic EL device 100 shown in FIG. 1.

Accordingly, it is considered that electrons injected from the cathode 8 to the electron injecting layer 73 move relatively fast in the electron transporting layer 72 and move relatively slowly in the subsequent hole blocking layer 71 to reach the emitting layer 6 With this arrangement, it is considered that the electron injection to the emitting layer can be controlled. As a result, the electrons reaching the emitting layer 6 recombine with holes in the vicinity of the interface between the electron blocking layer 5 and the emitting layer 6.

In addition, since the organic EL device 110 has the hole injecting layer 3 between the hole transporting layer 4 and the anode 2 and has the electron injecting layer 73 between the electron transporting layer 72 and the cathode 8, the hole injection function and the electron injection function are more efficiently expressed.

Accordingly, the organic EL device 110 of the exemplary embodiment emits light with higher efficiency.

When the emitting layer 6 of the organic EL device 110 in the exemplary embodiment contains a material that emits blue light, the organic EL device 110 emits light with a high efficiency in a blue wavelength region.

Further, the organic EL device 110 of the exemplary embodiment can emit light at a high efficiency without significantly increasing the drive voltage (e.g., with a drive voltage of less than 4.5 V).

An exemplary organic EL apparatus according to a third exemplary embodiment of the invention will be described.

Organic EL Apparatus

Third Exemplary Embodiment

Figure 3:
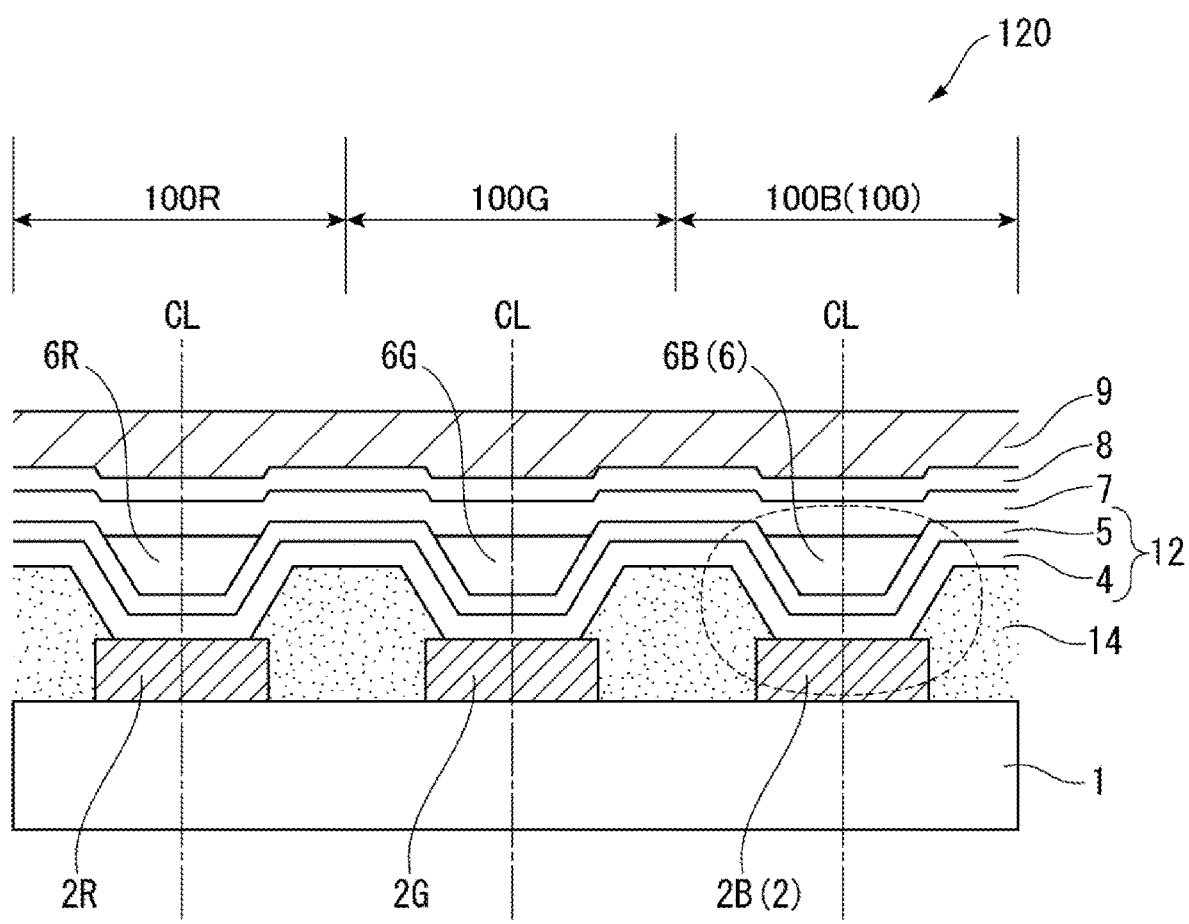
FIG. 3 shows an exemplary top emission organic EL device in a third exemplary embodiment of the invention.
Figure 4:
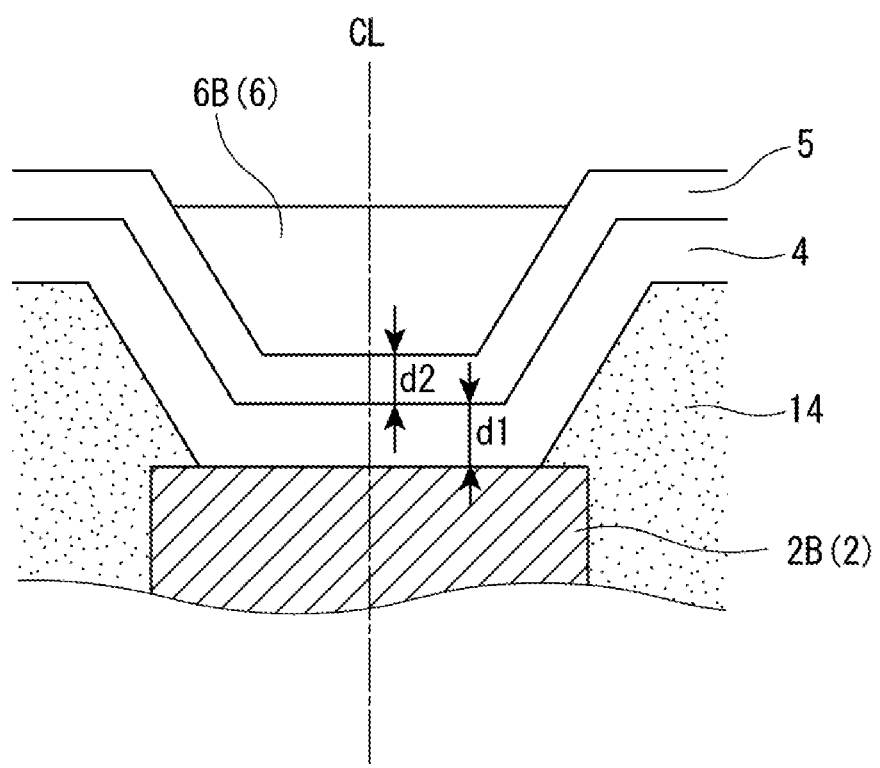
FIG. 4 is an enlarged view showing a relevant part of a blue pixel in FIG. 3.

FIG. 3 schematically shows an exemplary organic EL apparatus in the third exemplary embodiment of the invention. FIG. 4 is an enlarged view showing a relevant part of a blue pixel in FIG. 3.

The organic EL apparatus 120 in the third exemplary embodiment includes a blue pixel 100B (first device), a green pixel 100G (second device), and a red pixel 100R (third device) that are juxtaposed to each other on the substrate 1. The green pixel 100G and the red pixel 100R are organic EL devices that emit fluorescence.

The blue pixel 100B in the third exemplary embodiment corresponds to the organic EL device 100 of the first exemplary embodiment described above, and is a fluorescent organic EL element that emits blue light. The green pixel 100G and the red pixel 100R preferably has the same structure as the blue pixel 100B except fo the emitting layer.

In the organic EL apparatus 120 shown in FIG. 3, the layers forming the hole transporting zone 12 (i.e., the hole transporting layer 4 and the electron blocking layer 5) are common layers. Specifically, the hole transporting layer 4 and the electron blocking layer 5 are the common layers provided over the blue pixel 100B, the green pixel 100G and the red pixel 100R in a shared manner.

Moreover, in the exemplary embodiment, the electron transporting zone 7, cathode 8, and the capping layer 9 provided on the cathode 8 are also the common layers provided over the blue pixel 100B, the green pixel 100G and the red pixel 100R in a shared manner.

The blue pixel 100B includes an anode 2B, the hole transporting zone 12, a blue emitting layer 6B (corresponding to the emitting layer 6 in the first exemplary embodiment), the electron transporting zone 7, the cathode 8, and the capping layer 9 in this order from a side of the substrate 1. The anode 2B (corresponding to the anode 2 in the first exemplary embodiment) includes the reflective layer 21 and the conductive layer 22. Anodes 2G and 2R below also each include the reflective layer 21 and the conductive layer 22.

The green pixel 100G includes the anode 2G, the hole transporting zone 12, a green emitting layer 6G, the electron transporting zone 7, the cathode 8, and the capping layer 9 in this order from a side of the substrate 1.

The red pixel 100R includes the anode 2R, the hole transporting zone 12, a red emitting layer 6R, the electron transporting zone 7, the cathode 8, and the capping layer 9 in this order from a side of the substrate 1.

An insulative film 14 is formed between the anodes of adjacent pixels to maintain insulation between the pixels.

The organic EL apparatus 120 in the exemplary embodiment is provided with the blue pixel 100B corresponding to the organic EL device 100 of the first exemplary embodiment. Specifically, in the blue pixel 100B, the film thickness d1 of the hole transporting layer 4 and the film thickness d2 of the electron blocking layer 5 are adjusted in a specific range, and the first compound and the second compound are selected such that the hole mobility $\mu^{H1}$ of the first compound contained in the hole transporting layer 4 is larger than the hole mobility $\mu^{H2}$ of the second compound contained in the electron blocking layer 5 ($\mu^{H1} > \mu^{H2}$).

Accordingly, the organic EL apparatus 120 can emit light with a high efficiency, particularly in the blue pixel 100B.

The film thickness d1 of the hole transporting layer 4 and the film thickness d2 of the electron blocking layer 5 in the blue pixel 100B each mean a thickness at a central portion of each of the hole transporting layer 4 and the electron blocking layer 5 when a central portion (denoted by CL in FIG. 4) of the blue pixel 100B is cut in a thickness direction of the hole transporting layer 4 as shown in FIG. 4.

Also in the red pixel 100R and the green pixel 100G, the film thickness d1 of the hole transporting layer 4 and the film thickness d2 of the electron blocking layer 5 are provided so as to satisfy the respective formulae (1) and (2), and the first compound and the second compound are selected such that the hole mobility $\mu^{H1}$ of the first compound contained in the hole transporting layer 4 is larger than the hole mobility $\mu^{H2}$ of the second compound contained in the electron blocking layer 5 ($\mu^{H} > \mu^{H2}$), whereby light can be emitted with a high efficiency.

Moreover, in the organic EL apparatus 120, at least the layers forming the hole transporting zone 12 (i.e., the hole transporting layer 4 and the electron blocking layer 5) are the common layers, a manufacturing process can be simplified and a manufacturing cost can be reduced.

Manufacturing Method of Organic EL Apparatus

The organic EL apparatus 120 in the exemplary embodiment is manufactured, for example, as follows.

On the substrate 1, the reflective layer 21 in a form of APC (Ag—Pd—Cu) layer that is silver alloy layer and the conductive layer 22 (transparent conductive layer) in a form of indium oxide-zinc oxide (IZO: registered trademark) film or a tin oxide are formed in this order. Subsequently, the conductive material layer (silver alloy layer and transparent conductive layer) is patterned by etching using a resist pattern as a mask using a normal lithography technique to form an anode. Next, an insulative film 14 made of a photosensitive resin such as polyimide is formed by coating on the anode by spin coating. Subsequently, a blue emitting region, a green emitting region and a red emitting region are patterned by exposing the anode 2 through exposure, development, and curing.

There are three types of electrodes, one for blue pixels, one for green pixels, and one for red pixels, which correspond to the blue emitting region, the green emitting region and the red emitting region, respectively. The anode for the blue pixel corresponds to the anode 2B formed in the blue emitting region, the anode for the green pixel corresponds to the anode 2G formed in the green emitting region, and the anode for the red pixel corresponds to the anode 2R formed in the red emitting region. The anodes are washed in isopropyl alcohol for 5 minutes followed by a UV ozone cleaning for 30 minutes.

Subsequently, the hole injecting layer 3 is laminated on the anodes. When the hole injecting layer 3 is formed, the hole injecting layer 3 is laminated over the blue emitting region, the green emitting region, and the red emitting region.

Further, on the hole injecting layer 3, the hole transporting layer 4 is laminated over the blue emitting region, the green emitting region, and the red emitting region.

Further, on the hole transporting layer 4, the electron blocking layer 5 is laminated over the blue emitting region, the green emitting region, and the red emitting region.

Further, each emitting layer is formed on the electron blocking layer 5 at a position corresponding to each position of the anodes for the blue pixel, green pixel and red pixel. When the vacuum evaporation method is used, the blue emitting layer 6B, the green emitting layer 6G and the red emitting layer 6R are finely patterned using a shadow mask.

Next, the electron transporting zone 7 is formed. For example, when the electron transporting zone 7 is formed of the hole blocking layer, the electron transporting layer and the electron injecting layer, the hole blocking layer is laminated on each emitting layer over the blue emitting region, the green emitting region and the red emitting region.

Further, on the hole blocking layer, the electron transporting layer is laminated over the blue emitting region, the green emitting region, and the red emitting region.

Further, on the electron transporting layer, the electron injecting layer is laminated over the blue emitting region, the green emitting region, and the red emitting region.

Subsequently, for example, Mg and Ag are vapor deposited to form the cathode 8 made of a semi-transmissive MgAg alloy.

Further, on the cathode 8, the capping layer 9 is laminated over the blue emitting region, the green emitting region, and the red emitting region. The capping layer 9 can be formed by a vacuum deposition method, a coating method, an inkjet method, a spin coating method or the like.

As described above, the organic EL apparatus 120 including the blue pixel 100B, the green pixel 100G, and the red pixel 100R is obtained. The organic EL apparatus 120 may be an active matrix type or a passive matrix type.

Modification OF Embodiment(s)

In the organic EL device in the above exemplary embodiment, the emitting layer is not limited to a single layer, but may be provided by laminating a plurality of emitting layers. When the organic EL device has a plurality of emitting layers, each of the plurality of emitting layers may be a fluorescent emitting layer or a phosphorescent emitting layer.

When the organic EL device includes the plurality of emitting layers, the plurality of emitting layers may be adjacent to each other, or provide a so-called tandem-type organic EL device in which a plurality of emitting units are layered through an intermediate layer.

In the organic EL apparatus of the above exemplary embodiment, the blue pixel, the green pixel and the red pixel may be phosphorescent organic EL devices.

In the organic EL apparatus in the above exemplary embodiment, the blue pixel corresponds to the organic EL device of the invention. However, the organic EL apparatus of the invention only requires that one of the blue pixel, green pixel and red pixel include the organic EL device of the invention.

The electron transporting zone may consist of, for example, the electron transporting layer, a combination of the hole blocking layer and the electron transporting layer, a combination of the electron transporting layer and the electron injecting layer, or a combination of the hole blocking layer, the electron transporting layer and the electron injecting layer.

Likewise, the hole transporting zone may consist of, for example, the electron blocking layer, a combination of the electron blocking layer and the hole transporting layer, a combination of the hole transporting layer and the hole injecting layer, or a combination of the electron blocking layer, the hole transporting layer and the hole injecting layer.

The electron transporting zone and the hole transporting zone each may be formed as the common layer or different layers in the blue pixel 100B, the red pixel 100R and the green pixel 100G. The electron transporting zone and the hole transporting zone may each be formed of a layer suitable for the luminescent color.

Electronic Device

An electronic device according to an exemplary embodiment of the invention is provided with the top emission organic EL device of the invention.

Moreover, an electronic device according to another exemplary embodiment of the invention is provided with the organic EL apparatus of the invention.

These electronic devices can be used not only as light emitting devices but also as display devices.

The invention is not limited to the above exemplary embodiments. It should be noted that the invention may include any modification and improvement as long as such modification and improvement are compatible with the invention.

EXAMPLE(S)

Example(s) of the invention will be described below. However, the invention is not limited to Example(s).

Compounds

Compounds used for manufacturing an organic EL device will be shown below.

[Formula 24]

HA1

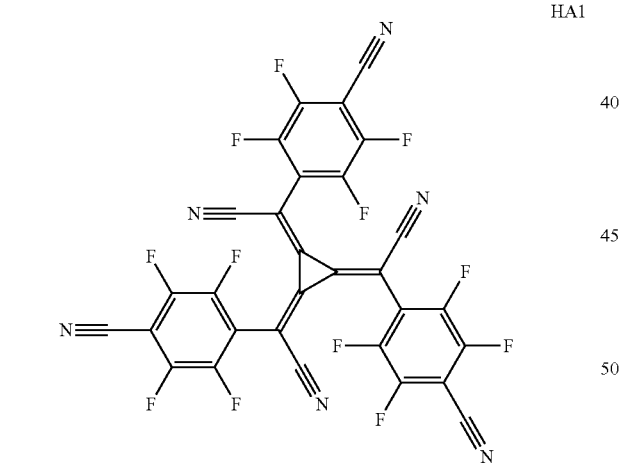

BD1

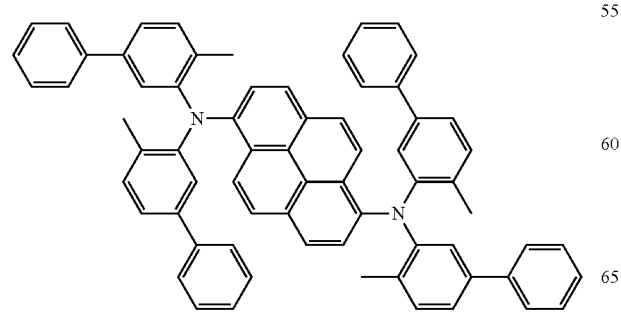

[Formula 25]

HT1

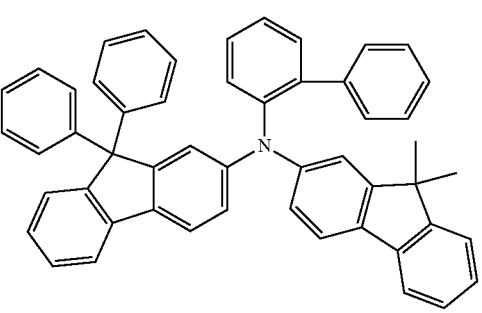

HT2

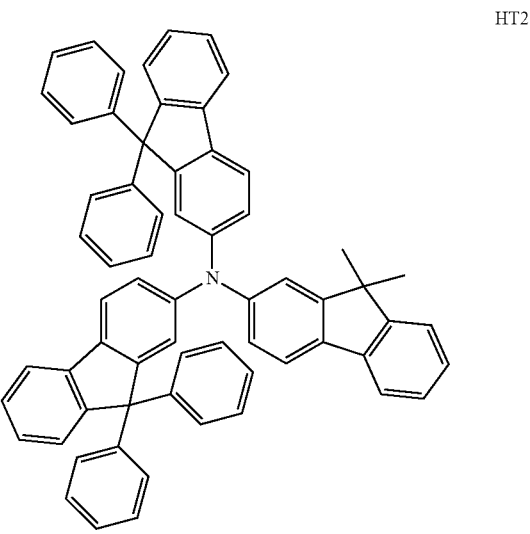

HT3

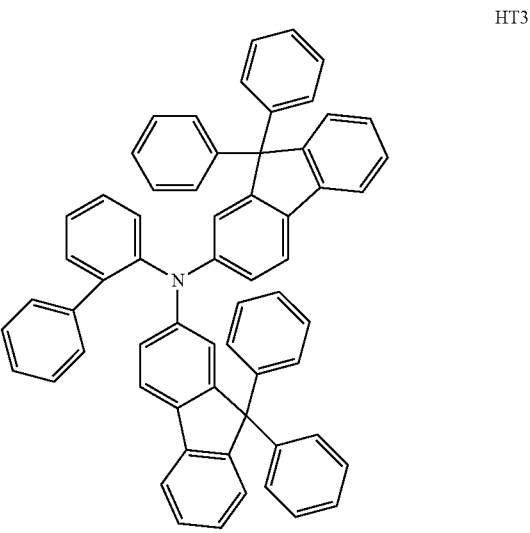

-continued
[Formula 26]
HT4
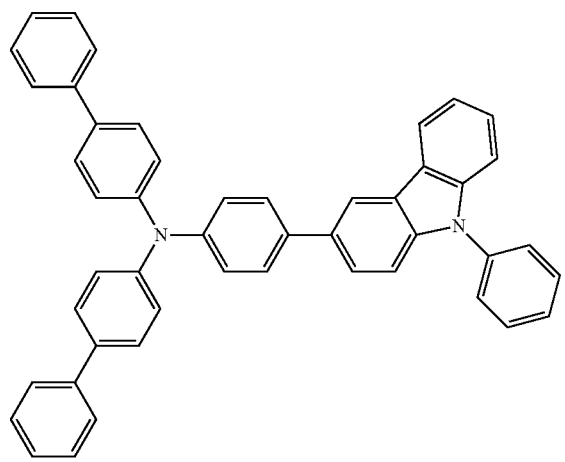
HT5
[Formula 27]
EB1
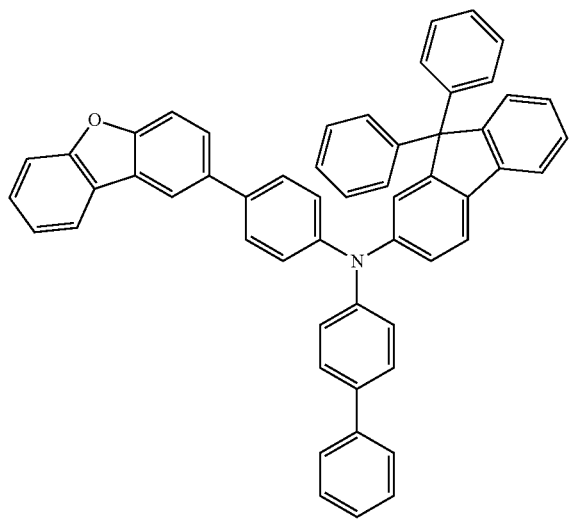
EB2
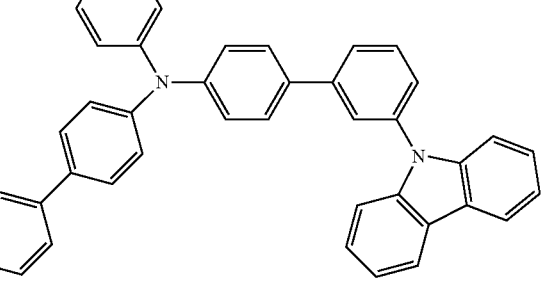
[Formula 28]
EBC-1
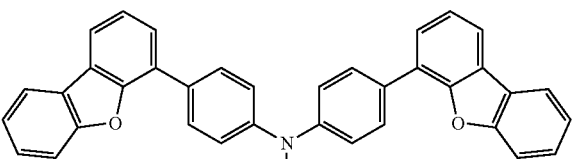
BHC-1
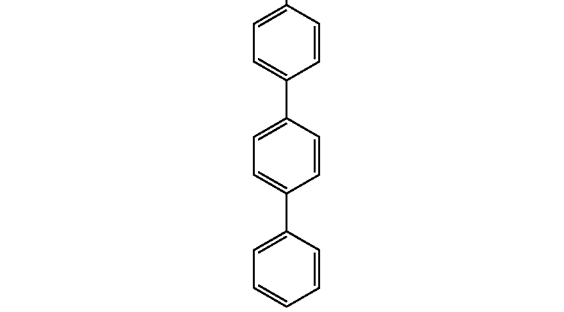
[Formula 29]
BH1
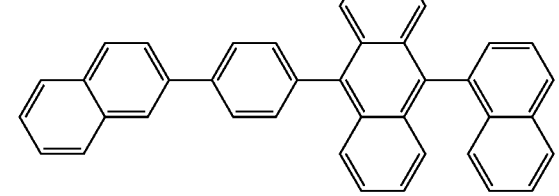

BH2
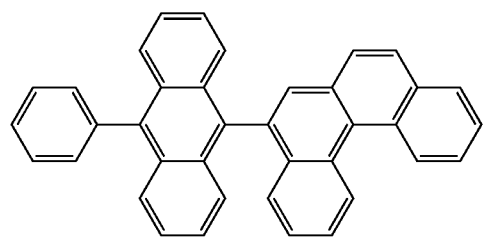
[Formula 30]
HB1
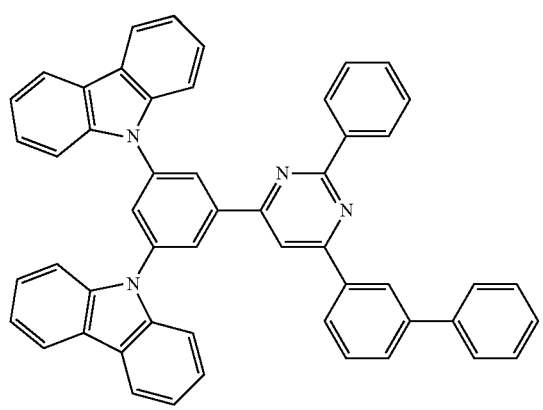
[Formula 31]
HB3
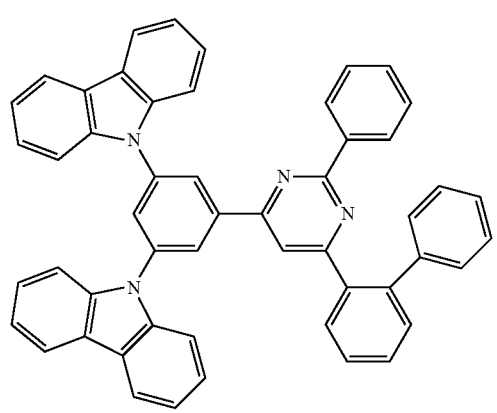
HB4
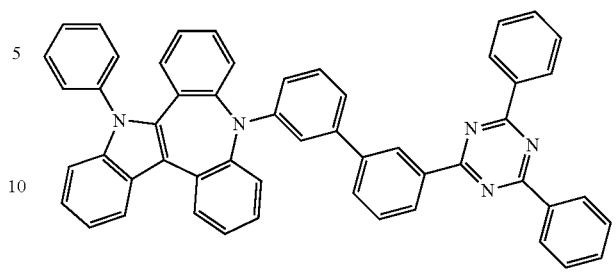
[Formula 32]
HB5
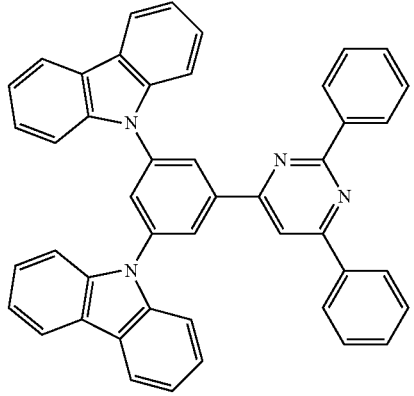
ET1
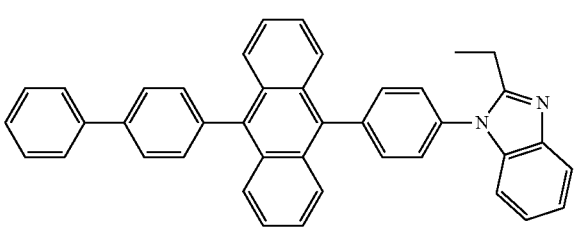
[Formula 33]
ET2
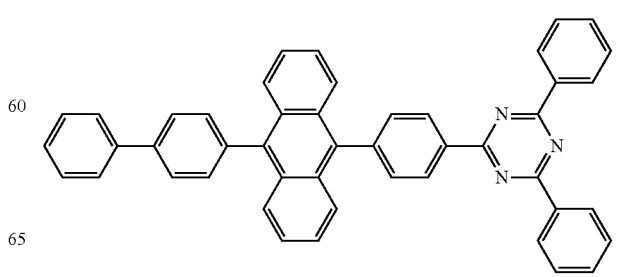

ET3

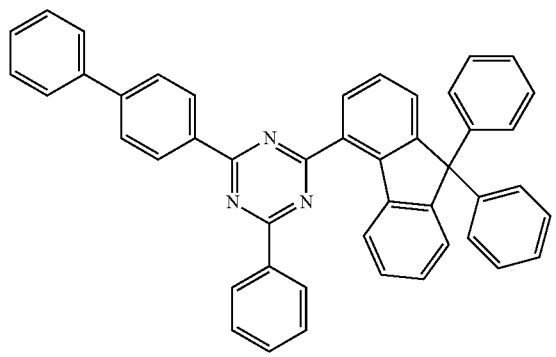

[Formula 34]

ET4

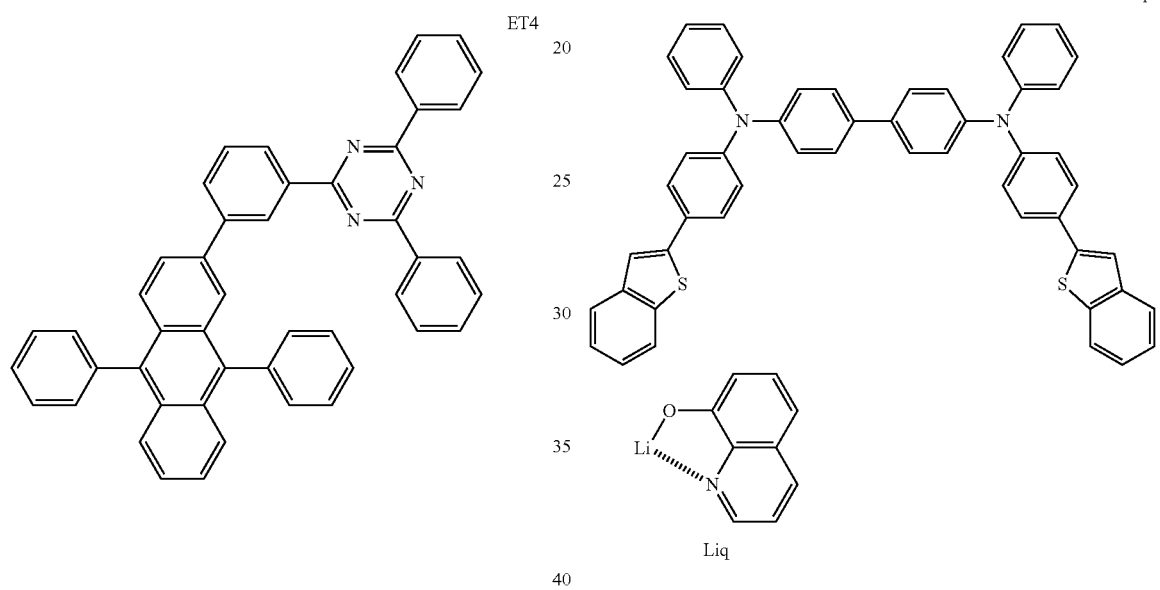

[Formula 35]

ET6

[Formula 36]

Cap1

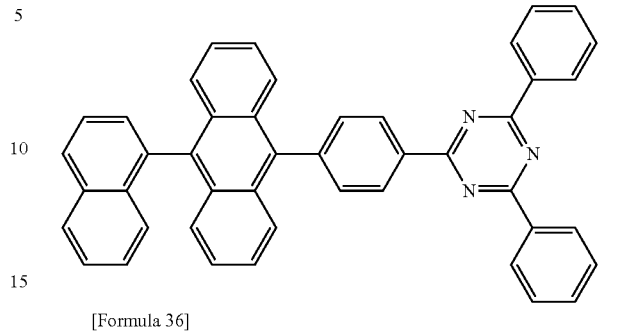

Liq

ET5

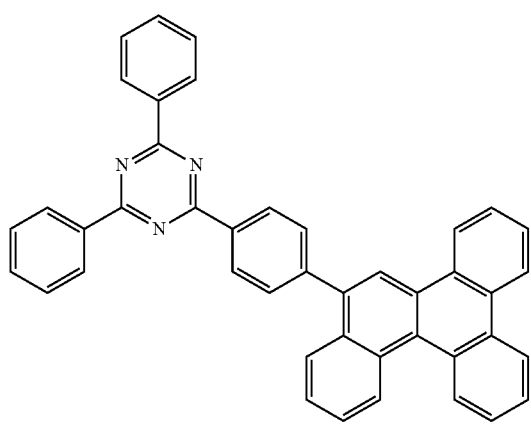

Properties of Compounds

Compounds, which are shown in Tables 1 to 5, used for manufacturing organic EL device were measured in terms of hole mobility and electron mobility. Results are shown in Tables 1 to 5.

Moreover, a triplet exciton level T1 of a compound BH1 and a compound BH2 used as the host material was measured according to a known method. As a result, the triplet exciton level T1 of each of the compounds was 2.0 eV or less.

Further, an electron affinity Af of compounds ET1 to ET6 were measured according to a known method. As a result, the electron affinity Af of each of the compounds was 2.0 eV or more.

Hole Mobility

Hole mobility $\mu^H$ was measured according to impedance spectroscopy.

An anode was formed by sputtering an indium oxide-tin oxide (ITO: Indium Tin Oxide) film having a thickness of 130 nm on a glass substrate (25 mm×75 mm×0.7 mm thickness) to be a substrate for manufacturing a device. According to vacuum deposition, a layer of a compound A-1 with a film thickness of 5 nm, a layer of compound A-2 with a film thickness of 10 nm, a layer of a compound to be measured with a film thickness of 200 nm (a measurement target layer) and an Al film (cathode) having a film thickness of 80 nm were laminated on the anode in this order to manufacture a device for measuring hole mobility.

Next, a DC voltage in which an alternating voltage of 100 mV was loaded was applied to the device for measuring the hole mobility, and the complex modulus was measured. Assuming that a frequency at which an imaginary part of the modulus was maximum is $f_{max}$ (Hz), a response time T (seconds) was calculated as $T=1/(2\pi f_{max})$, and this value was used to determine a field intensity dependency of the hole mobility $\mu^H$. The hole mobility $\mu^H$ at the field intensity of 0.25 MV/cm is described below.

A conversion equation of the hole mobility $\mu^H$ [cm$^2$/Vs] is shown below.

$$\mu^H = d^2/(V \cdot t_{IS})$$    Conversion Equation:

d: Film thickness [cm] of the measurement target layer
V: Voltage [V]
$t_{IS}$: Response time [s]

Electron Mobility

According to vacuum deposition, on a glass substrate (25 mm×75 mm×1.1 mm thickness) for manufacturing a device, an Al film (anode) with a film thickness of 80 nm, a layer (measurement target layer) with a film thickness of 200 nm formed of the measurement target compound, a layer formed of a compound B-1 with a film thickness of 10 nm, a LiF film with a film thickness of 1 nm, and an Al film (cathode) with a film thickness of 80 nm were laminated in this order to form a device for measuring electron mobility. The electron mobility $\mu^E$ of the device for measuring the electron mobility was measured in the same manner as the hole mobility $\mu^H$.

Compounds used for manufacturing an organic EL device will be shown below.

[Formula 37]

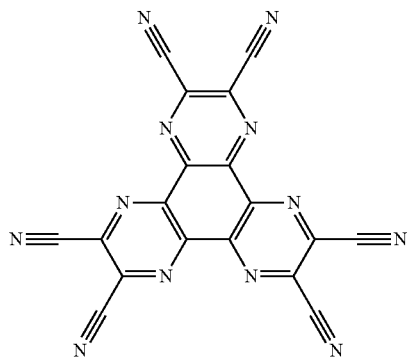

A-1

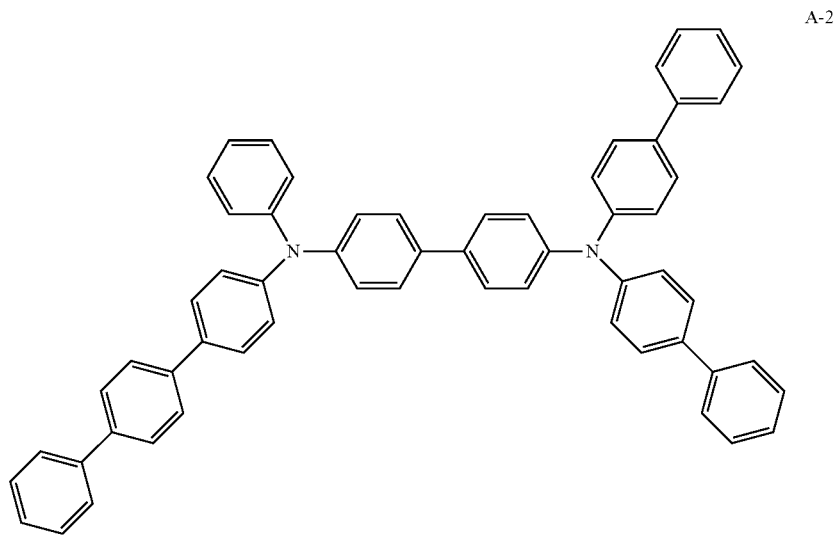

A-2

[Formula 38]

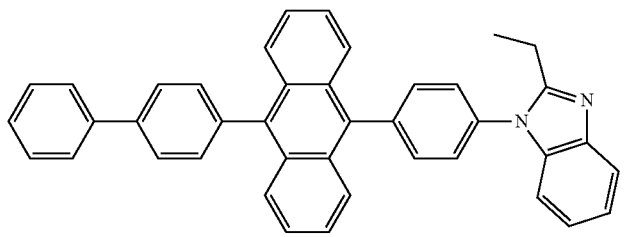

B-1

TABLE 1

| No. | Hole Mobility $\mu^H$ [cm$^2$/Vs] |
|---|---|
| HT1 | $7.5 \times 10^{-3}$ |
| HT2 | $3.9 \times 10^{-3}$ |
| HT3 | $1.6 \times 10^{-3}$ |
| HT4 | $5.6 \times 10^{-4}$ |
| HT5 | $1.1 \times 10^{-3}$ |

TABLE 2

| No. | Hole Mobility $\mu^H$ [cm$^2$/Vs] |
|---|---|
| EB1 | $5.5 \times 10^{-7}$ |
| EB2 | $4.9 \times 10^{-7}$ |
| EBC-1 | $1.8 \times 10^{-4}$ |

TABLE 3

| No. | Electron Mobility $\mu^E$ Hole Mobility $\mu^H$ [cm$^2$/Vs] | Ratio $\mu^E/\mu^H$ |
|---|---|---|
| BH1 | $\mu^E$: $3.5 \times 10^{-4}$<br>$\mu^H$: $1.4 \times 10^{-9}$ | 250000 |
| BH2 | $\mu^E$: $1.1 \times 10^{-4}$<br>$\mu^H$: $3.7 \times 10^{-9}$ | 29730 |
| BHC-1 | $\mu^E$: $2.8 \times 10^{-4}$<br>$\mu^H$: $4.4 \times 10^{-8}$ | 6364 |

TABLE 4

| No. | Electron Mobility $\mu^E$ [cm$^2$/Vs] |
|---|---|
| HB1 | $3.6 \times 10^{-5}$ |
| HB2 | $3.9 \times 10^{-5}$ |
| HB3 | $3.2 \times 10^{-5}$ |
| HB4 | $2.4 \times 10^{-5}$ |
| HB5 | $3.8 \times 10^{-5}$ |

TABLE 5

| No. | Electron Mobility $\mu^E$ [cm$^2$/Vs] |
|---|---|
| ET1 | $2.5 \times 10^{-4}$ |
| ET2 | $3.5 \times 10^{-3}$ |
| ET3 | $4.3 \times 10^{-4}$ |
| ET4 | $1.2 \times 10^{-3}$ |

TABLE 5-continued

| No. | Electron Mobility $\mu^E$ [cm$^2$/Vs] |
|---|---|
| ET5 | $1.7 \times 10^{-4}$ |
| ET6 | $5.0 \times 10^{-5}$ |

Manufacturing of Organic EL Device

The organic EL device was manufactured as follows.

Example 1

Firstly, an APC (Ag—Pd—Cu) layer (reflective layer) having a film thickness of 100 nm, which was silver alloy layer, and an indium zinc oxide (IZO: registered trademark) film (transparent conductive layer) having a thickness of 10 nm were sequentially formed by sputtering on a glass substrate (25 mm×75 mm×0.7 mm thickness) to be a substrate for manufacturing a device. Thus, a conductive material layer formed of the APC layer and the IZO film was obtained.

Subsequently, the conductive material layer was patterned by etching using a resist pattern as a mask using a normal lithography technique to form a lower electrode (anode).

Next, a compound HT1 and a compound HA1 were co-deposited on the lower electrode by vacuum deposition to form a hole injecting layer (third layer) having a film thickness of 10 nm. The concentration of the compound HT1 was 97 mass % and the concentration of the compound HA1 was 3 mass % in the hole injecting layer.

Next, the compound HT1 (first compound) was vapor-deposited on the hole injecting layer to form a hole transporting layer (first layer) having a thickness of 121 nm.

Next, a compound EB1 (second compound) was vapor-deposited on the hole transporting layer to form an electron blocking layer (second layer) with a thickness of 5 nm.

Next, a compound BH1 (host material) and a compound BD1 (luminescent material) were co-deposited on the electron blocking layer to form a blue emitting layer having a thickness of 20 nm. The concentration of the compound BH1 was 96 mass %, and the concentration of the compound BD1 was 4 mass % in the blue emitting layer.

Next, a compound HB1 (fifth compound) was deposited on the blue emitting layer to form a hole blocking layer (fifth layer) having a thickness of 5 nm.

Next, on the hole blocking layer, a compound ET1 (fourth compound) and Liq were co-deposited to form an electron transporting layer (fourth layer) having a thickness of 20 nm. The concentration of the compound ET1 was 50 mass %, and the concentration of Liq was 50 mass % in the electron transporting layer.

Next, Liq (sixth compound) was deposited on the electron transporting layer to form an electron injecting layer (sixth layer) made of a 1 nm-thick Liq film.

Next, Mg and Ag were co-deposited on this electron injecting layer so as to have a mixing ratio (mass % ratio) of 1:9, so that an upper electrode (cathode) made of a semi-transparent MgAg alloy (total film thickness 15 nm) was formed.

Next, the compound Cap1 was deposited on the entire surface of the upper electrode to form a capping layer having a thickness of 65 nm.

A device arrangement of the organic EL device in Example 1 is roughly shown as follows.

APC(100)/IZO(10)/HT1:HA1(10,97%:3%)/HT1(121)/ EB1(5)/BH1:BD1(20,96%:4%)/HB1(5)/ET1:Liq(20,50%: 50%)/Liq(1)/MgAg(15)/Cap1(65)

Numerals in parentheses represent a film thickness (unit: nm). Similarly, in parentheses, the numbers shown as percentages are the ratio (mass %) between the compound HT1 and the compound HA1 in the hole injecting layer, the ratio (mass %) between the compound BH1 and the compound BD1 in the emitting layer, and the ratio (mass %) between the compound ET1 and Liq in the electron transporting layer. The above is also applicable to the description below.

Example 2

The organic EL device in Example 2 was manufactured in the same manner as in Example 1 except that the compound HT1 was changed to a compound HT2 in the hole injecting layer and the compound in the hole transporting layer was changed as shown in Table 6

A device arrangement of the organic EL device in Example 2 is roughly shown as follows.

APC(100)/IZO(10)/HT2:HA1(10,97%:3%)/HT2(121)/ EB1(5)/BH1:BD1(20,96%:4%)/HB1(5)/ET1:Liq(20,50%: 50%)/Liq(1)/MgAg(15)/Cap1(65)

Example 3

The organic EL device in Example 3 was manufactured in the same manner as in Example 1 except that the compound HT1 was changed to a compound HT3 in the hole injecting layer and the compound in the hole transporting layer was changed as shown in Table 6.

A device arrangement of the organic EL device in Example 3 is roughly shown as follows.

APC(100)/IZO(10)/HT3:HA1(10,97%:3%)/HT3(121)/ EB1(5)/BH1:BD1(20,96%:4%)/HB1(5)/ET1:Liq(20,50%: 50%)/Liq(1)/MgAg(15)/Cap1(65)

Example 4

The organic EL device in Example 4 was manufactured in the same manner as in Example 1 except that the compound HT1 was changed to a compound HT4 in the hole injecting layer and the compounds in the hole transporting layer, the electron blocking layer, the emitting layer, the hole blocking layer and the electron transporting layer were changed as shown in Table 6.

A device arrangement of the organic EL device in Example 4 is roughly shown as follows.

APC(100)/IZO(10)/HT4:HA1(10,97%:3%)/HT4(121)/ EB2(5)/BH2:BD1(20,96%:4%)/HB2(5)/ET2: Liq(20,50%: 50%)/Liq(1)/MgAg(15)/Cap1(65)

Example 5

The organic EL device in Example 5 was manufactured in the same manner as in Example 1 except that the compound HT1 was changed to a compound HT5 in the hole injecting layer and the compounds in the hole transporting layer, the electron blocking layer, the emitting layer, the hole blocking layer and the electron transporting layer were changed as shown in Table 6.

A device arrangement of the organic EL device in Example 5 is roughly shown as follows.

APC(100)/IZO(10)/HT5:HA1(10,97%:3%)/HT5(121)/ EB2(5)/BH2:BD1(20,96%:4%)/HB3(5)/ET3: Liq(20,50%: 50%)/Liq(1)/MgAg(15)/Cap1(65)

Example 6

The organic EL device in Example 6 was manufactured in the same manner as in Example 1 except that the compound HT1 was changed to the compound HT5 in the hole injecting layer and the compounds in the hole transporting layer, the electron blocking layer, the emitting layer, the hole blocking layer and the electron transporting layer were changed as shown in Table 6.

A device arrangement of the organic EL device in Example 6 is roughly shown as follows.

APC(100)/IZO(10)/HT5:HA1(10,97%:3%)/HT5(121)/ EB2(5)/BH2:BD1(20,96%:4%)/HB4(5)/ET4: Liq(20,50%: 50%)/Liq(1)/MgAg(15)/Cap1(65)

Example 7

The organic EL device in Example 7 was manufactured in the same manner as in Example 1 except that the compound HT1 was changed to the compound HT4 in the hole injecting layer and the compounds in the hole transporting layer, the electron blocking layer, the emitting layer, the hole blocking layer and the electron transporting layer were changed as shown in Table 6.

A device arrangement of the organic EL device in Example 7 is roughly shown as follows.

APC(100)/IZO(10)/HT4:HA1(10,97%:3%)/HT4(121)/ EB2(5)/BH2:BD1(20,96%:4%)/HB2(5)/ET4: Liq(20,50%: 50%)/Liq(1)/MgAg(15)/Cap1(65)

Example 8

The organic EL device in Example 8 was manufactured in the same manner as in Example 1 except that the compound HT1 was changed to the compound HT5 in the hole injecting layer and the compounds in the hole transporting layer, the emitting layer, the hole blocking layer and the electron transporting layer were changed as shown in Table 6.

A device arrangement of the organic EL device in Example 8 is roughly shown as follows.

APC(100)/IZO(10)/HT5:HA1(10,97%:3%)/HT5(121)/ EB1(5)/BH2:BD1(20,96%:4%)/HB5(5)/ET5: Liq(20,50%: 50%)/Liq(1)/MgAg(15)/Cap1(65)

Example 9

The organic EL device in Example 9 was manufactured in the same manner as in Example 1 except that the compound HT1 was changed to the compound HT3 in the hole injecting layer and the compounds in the hole transporting layer, the emitting layer, the hole blocking layer and the electron transporting layer were changed as shown in Table 6.

A device arrangement of the organic EL device in Example 9 is roughly shown as follows.

APC(100)/IZO(10)/HT3:HA1(10,97%:3%)/HT3(121)/
EB1(5)/BH2:BD1(20,96%:4%)/HB3(5)/ET4:Liq(20,50%:
50%)/Liq(1)/MgAg(15)/Cap1(65)

Example 10

The organic EL device in Example 10 was manufactured in the same manner as in Example 1 except that the compound HT1 was changed to the compound HT4 in the hole injecting layer and the compounds in the hole transporting layer, the emitting layer, the hole blocking layer and the electron transporting layer were changed as shown in Table 6.
A device arrangement of the organic EL device in Example 10 is roughly shown as follows.
APC(100)/IZO(10)/HT4:HA1(10,97%:3%)/HT4(121)/
EB1(5)/BH2:BD1(20,96%:4%)/HB3(5)/ET4:Liq(20,50%:
50%)/Liq(1)/MgAg(15)/Cap1(65)

Example 11

The organic EL device in Example 11 was manufactured in the same manner as in Example 1 except that the compound HT1 was changed to the compound HT4 in the hole injecting layer and the compounds in the hole transporting layer, the electron blocking layer, the emitting layer and the electron transporting layer were changed as shown in Table 6.
A device arrangement of the organic EL device in Example 11 is roughly shown as follows.
APC(100)/IZO(10)/HT4:HA1(10,97%:3%)/HT4(121)/
EB2(5)/BH2:BD1(20,96%:4%)/HB3(5)/ET4:Liq(20,50%:
50%)/Liq(1)/MgAg(15)/Cap1(65)

Example 12

The organic EL device in Example 12 was manufactured in the same manner as in Example 1 except that the compound HT1 was changed to the compound HT4 in the hole injecting layer and the compounds in the hole transporting layer, the emitting layer, the hole blocking layer and the electron transporting layer were changed as shown in Table 6.
A device arrangement of the organic EL device in Example 12 is roughly shown as follows.
APC(100)/IZO(10)/HT4:HA1(10,97%:3%)/HT4(121)/
EB1(5)/BH2:BD1(20,96%:4%)/HB3(5)/ET6:Liq(20,50%:
50%)/Liq(1)/MgAg(15)/Cap1(65)

Example 13

The organic EL device in Example 13 was manufactured in the same manner as in Example 1 except that the compound HT1 was changed to the compound HT4 in the hole injecting layer and the compounds in the hole transporting layer, the electron blocking layer, the emitting layer, the hole blocking layer and the electron transporting layer were changed as shown in Table 6.
A device arrangement of the organic EL device in Example 13 is roughly shown as follows.
APC(100)/IZO(10)/HT4:HA1(10,97%:3%)/HT4(121)/
EB2(5)/BH2:BD1(20,96%:4%)/HB3(5)/ET6:Liq(20,50%:
50%)/Liq(1)/MgAg(15)/Cap1(65)

Example 14

The organic EL device in Example 14 was manufactured in the same manner as in Example 1 except that the compound HT1 was changed to the compound HT4 in the hole injecting layer and the compounds in the hole transporting layer, the electron blocking layer, the hole blocking layer and the electron transporting layer were changed as shown in Table 6.
A device arrangement of the organic EL device in Example 14 is roughly shown as follows.
APC(100)/IZO(10)/HT4:HA1(10,97%:3%)/HT4(121)/
EB2(5)/BH1:BD1(20,96%:4%)/HB2(5)/ET6:Liq(20,50%:
50%)/Liq(1)/MgAg(15)/Cap1(65)

Example 15

The organic EL device in Example 15 was manufactured in the same manner as in Example 1 except that the compound HT1 was changed to the compound HT5 in the hole injecting layer and the compounds in the hole transporting layer, the electron blocking layer, the hole blocking layer and the electron transporting layer were changed as shown in Table 6.
A device arrangement of the organic EL device in Example 15 is roughly shown as follows.
APC(100)/IZO(10)/HT5:HA1(10,97%:3%)/HT5(121)/
EB2(5)/BH1:BD1(20,96%:4%)/HB3(5)/ET3:Liq(20,50%:
50%)/Liq(1)/MgAg(15)/Cap1(65)

Example 16

The organic EL device in Example 16 was manufactured in the same manner as in Example 1 except that the compound HT1 was changed to the compound HT5 in the hole injecting layer and the compounds in the hole transporting layer, the electron blocking layer, the hole blocking layer and the electron transporting layer were changed as shown in Table 6.
A device arrangement of the organic EL device in Example 16 is roughly shown as follows.
APC(100)/IZO(10)/HT5:HA1(10,97%:3%)/HT5(121)/
EB2(5)/BH1:BD1(20,96%:4%)/HB4(5)/ET4:Liq(20,50%:
50%)/Liq(1)/MgAg(15)/Cap1(65)

Example 17

The organic EL device in Example 17 was manufactured in the same manner as in Example 1 except that the compound HT1 was changed to the compound HT4 in the hole injecting layer and the compounds in the hole transporting layer, the electron blocking layer, the hole blocking layer and the electron transporting layer were changed as shown in Table 6.
A device arrangement of the organic EL device in Example 17 is roughly shown as follows.
APC(100)/IZO(10)/HT4:HA1(10,97%:3%)/HT4(121)/
EB2(5)/BH1:BD1(20,96:4%)/HB2(5)/ET4: Liq(20,50%:
50%)/Liq(1)/MgAg(15)/Cap1(65)

Example 18

The organic EL device in Example 18 was manufactured in the same manner as in Example 1 except that the compound in the electron blocking layer was changed as shown in Table 6.
A device arrangement of the organic EL device in Example 18 is roughly shown as follows.
APC(100)/IZO(10)/HT1:HA1(10,97%:3%)/HT1(121)/
EB2(5)/BH1:BD1(20,96%:4%)/HB1(5)/ET1:Liq(20,50%:
50%)/Liq(1)/MgAg(15)/Cap1(65)

Comparative 1

The organic EL device in Comparative 1 was manufactured in the same manner as in Example 1 except that the compound HT1 was changed to the compound HT3 in the hole injecting layer and the compounds in the hole transporting layer and the electron blocking layer were changed as shown in Table 6.

A device arrangement of the organic EL device in Comparative 1 is roughly shown as follows.

APC(100)/IZO(10)/HT3: HA1(10,97%:3%)/HT3(121)/EBC-1(5)/BH1:BD1(20,96%:4%)/HB1(5)/ET1:Liq(20, 50%:50%)/Liq(1)/MgAg(15)/Cap1(6 5)

Comparative 2

The organic EL device in Comparative 2 was manufactured in the same manner as in Example 1 except that the compound HT1 was changed to the compound HT3 in the hole injecting layer and the compounds in the hole transporting layer, the electron blocking layer and the emitting layer were changed as shown in Table 6.

A device arrangement of the organic EL device in Comparative 2 is roughly shown as follows.

APC(100)/IZO(10)/HT3: HA1(10,97%:3%)/HT3(121)/EBC-1(5)/BHC-1: BD1(20,96%:4%)/HB1(5)/ET1:Liq(20, 50%:50%)/Liq(1)/MgAg(15)/Cap1(65)

Comparative 3

The organic EL device in Comparative 3 was manufactured in the same manner as in Example 1 except that the compound HT1 was changed to the compound HT5 in the hole injecting layer and the compounds in the hole transporting layer and the electron blocking layer were changed as shown in Table 6.

A device arrangement of the organic EL device in Comparative 3 is roughly shown as follows.

APC(100)/IZO(10)/HT5:HA1(10,97%:3%)/HT5(121)/HT5(5)/BH1:BD1(20,96%:4%)/HB1(5)/ET1:Liq(20,50%:50%)/Liq(1)/MgAg(15)/Cap1(65)

Comparative 4

The organic EL device in Comparative 4 was manufactured in the same manner as in Example 1 except that the compound HT1 was changed to a compound EB2 in the hole injecting layer and the compounds in the hole transporting layer and the electron blocking layer were changed as shown in Table 6.

A device arrangement of the organic EL device in Comparative 4 is roughly shown as follows.

APC(100)/IZO(10)/EB2: HA1(10,97%:3%)/EB2(121)/EBC-1(5)/BH1:BD1(20,96%:4%)/HB1(5)/ET1:Liq(20, 50%:50%)/Liq(1)/MgAg(15)/Cap1(6 5)

Comparative 5

The organic EL device in Comparative 5 was manufactured in the same manner as in Example 1 except that the film thickness of the compound HT1 in the hole transporting layer was changed to 52 nm.

A device arrangement of the organic EL device in Comparative 5 is roughly shown as follows.

APC(100)/IZO(10)/HT1:HA1(10,97%:3%)/HT1(52)/EB1(5)/BH1:BD1(20,96%:4%)/HB1(5)/ET1:Liq(20,50%:50%)/Liq(1)/MgAg(15)/Cap1(65)

Comparative 6

The organic EL device in Comparative 5 was manufactured in the same manner as in Example 1 except that the film thickness of the compound HT1 in the hole transporting layer was changed to 96 nm.

A device arrangement of the organic EL device in Comparative 6 is roughly shown as follows.

APC(100)/IZO(10)/HT1:HA1(10,97%:3%)/HT1(96)/EB1(5)/BH1:BD1(20,96%:4%)/HB1(5)/ET1:Liq(20,50%:50%)/Liq(1)/MgAg(15)/Cap1(65)

Comparative 7

The organic EL device in Comparative 5 was manufactured in the same manner as in Example 1 except that the film thickness of the compound HT1 in the hole transporting layer was changed to 390 nm.

A device arrangement of the organic EL device in Comparative 7 is roughly shown as follows.

APC(100)/IZO(10)/HT1:HA1(10,97%:3%)/HT1(390)/EB1(5)/BH1:BD1(20,96%:4%)/HB1(5)/ET1:Liq(20,50%:50%)/Liq(1)/MgAg(15)/Cap1(65)

The organic EL devices manufactured in Examples 1 to 18 and Comparatives 1 to 7 were evaluated as follows. Evaluation results of Examples 1 to 18 and Comparatives 1 to 4 are shown in Table 6. Evaluation results of Example 1 and Comparatives 5 to 7 are shown in Table 7.

Drive Voltage

A voltage (unit: V) was measured when current was applied between the anode and the cathode such that a current density was 10 mA/cm². Moreover, the drive voltage was evaluated based on the following evaluation criteria.

Evaluation Criteria

A: drive voltage less than 4.5 V
B: drive voltage of 4.5 V or more

Value of Current Efficiency L/J and "L/J/CIEy"

Voltage was applied to the devices so that the current density was 10 mA/cm², where a spectral radiance spectrum was measured using a spectral radiance meter CS-1000 (manufactured by Konica Minolta). Chromaticities CIEx, CIEy, and a current efficiency (unit: cd/A) were calculated from the obtained spectral radiance spectrum.

A value of "L/J/CIEy" was calculated by dividing the value of the current efficiency L/J by the value of CIEy.

TABLE 6

| No. | Hole transporting layer HTL | Electron blocking layer EBL | Emitting layer BH | Hole blocking layer HBL | Electron transporting layer ETL | Drive Voltage [V] | Judgement <4.5 V | L/J [cd/A] | L/J/CIEy | CIEx | CIEy |
|---|---|---|---|---|---|---|---|---|---|---|---|
| Ex. 1 | HT1 | EB1 | BH1 | HB1 | ET1 | 3.7 | A | 8.9 | 178 | 0.14 | 0.05 |
| Ex. 2 | HT2 | EB1 | BH1 | HB1 | ET1 | 3.7 | A | 8.7 | 173 | 0.14 | 0.05 |
| Ex. 3 | HT3 | EB1 | BH1 | HB1 | ET1 | 3.6 | A | 8.5 | 170 | 0.14 | 0.05 |
| Ex. 4 | HT4 | EB2 | BH2 | HB2 | ET2 | 3.8 | A | 9.3 | 186 | 0.14 | 0.05 |
| Ex. 5 | HT5 | EB2 | BH2 | HB3 | ET3 | 4.1 | A | 9.3 | 186 | 0.14 | 0.05 |
| Ex. 6 | HT5 | EB2 | BH2 | HB4 | ET4 | 4.0 | A | 9.2 | 184 | 0.14 | 0.05 |
| Ex. 7 | HT4 | EB2 | BH2 | HB2 | ET4 | 3.8 | A | 9.2 | 183 | 0.14 | 0.05 |
| Ex. 8 | HT5 | EB1 | BH2 | HB5 | ET5 | 4.0 | A | 9.0 | 180 | 0.14 | 0.05 |
| Ex. 9 | HT3 | EB1 | BH2 | HB3 | ET4 | 3.6 | A | 9.1 | 181 | 0.14 | 0.05 |
| Ex. 10 | HT4 | EB1 | BH2 | HB3 | ET4 | 3.8 | A | 8.9 | 178 | 0.14 | 0.05 |
| Ex. 11 | HT4 | EB2 | BH2 | HB3 | ET4 | 3.8 | A | 8.9 | 178 | 0.14 | 0.05 |
| Ex. 12 | HT4 | EB1 | BH2 | HB3 | ET6 | 3.8 | A | 9.0 | 179 | 0.14 | 0.05 |
| Ex. 13 | HT4 | EB2 | BH2 | HB3 | ET6 | 3.8 | A | 8.9 | 178 | 0.14 | 0.05 |
| Ex. 14 | HT4 | EB2 | BH1 | HB2 | ET6 | 3.6 | A | 8.8 | 176 | 0.14 | 0.05 |
| Ex. 15 | HT5 | EB2 | BH1 | HB3 | ET3 | 4.0 | A | 9.2 | 183 | 0.14 | 0.05 |
| Ex. 16 | HT5 | EB2 | BH1 | HB4 | ET4 | 3.9 | A | 9.1 | 181 | 0.14 | 0.05 |
| Ex. 17 | HT4 | EB2 | BH1 | HB2 | ET4 | 3.5 | A | 8.7 | 174 | 0.14 | 0.05 |
| Ex. 18 | HT1 | EB2 | BH1 | HB1 | ET1 | 3.7 | A | 8.9 | 177 | 0.14 | 0.05 |
| Comp. 1 | HT3 | EBC-1 | BH1 | HB1 | ET1 | 3.6 | A | 8.0 | 160 | 0.14 | 0.05 |
| Comp. 2 | HT3 | EBC-1 | BHC-1 | HB1 | ET1 | 3.3 | A | 6.6 | 132 | 0.14 | 0.05 |
| Comp. 3 | HT5 | | BH1 | HB1 | ET1 | 3.5 | A | 7.8 | 155 | 0.14 | 0.05 |
| Comp. 4 | EB2 | EBC-1 | BH1 | HB1 | ET1 | 5.1 | B | 7.5 | 149 | 0.14 | 0.05 |

As shown in Table 6, the organic EL devices of Examples 1 to 18 exhibited higher values of the current efficiency and "L/J/CIEy" than those of the organic EL devices of Comparative 1 to 4.

In other words, it has been found that the organic EL device of Examples 1 to 18 can emit light with a high efficiency by adjusting the film thickness and the hole mobility of each of the hole transporting layer (first layer) and the electron blocking layer (second layer) to the respective specific ranges.

Further, it has been found that the organic EL devices of Examples 1 to 18 emit light with a high efficiency without significantly increasing the drive voltage since the organic EL device of Examples 1 to 18 were driven by the voltage of less than 4.5 V.

adjusting the film thickness and the hole mobility of the hole transporting layer (first layer) to the respective specific ranges, and by adjusting the film thickness and the hole mobility of the electron blocking layer (second layer) to the respective specific ranges.

Further, it has been found that the organic EL device of Example 1 emits light with a high efficiency without significantly increasing the drive voltage since the organic EL device of Example 1 was driven by the voltage of less than 4.5 V.

The invention claimed is:

1. A top emission organic electroluminescence device comprising:
   an anode;
   a cathode;

TABLE 7

| No. | Hole transporting layer HTL | Hole transporting layer film thickness [nm] | Electron blocking layer EBL | Emmitting layer BH | Hole blocking layer HBL | Electron transporting layer ETL | Drive voltage [V] | Judgement <4.5 V | L/J [cd/A] | L/J/CIEy | CIEx | CIEy |
|---|---|---|---|---|---|---|---|---|---|---|---|---|
| Ex. 1 | HT1 | 121 | EB1 | BH1 | HB1 | ET1 | 3.7 | A | 8.9 | 178 | 0.14 | 0.05 |
| Comp. 5 | HT1 | 52 | EB1 | BH1 | HB1 | ET1 | 3.5 | A | 8.5 | 19 | 0.20 | 0.45 |
| Comp. 6 | HT1 | 96 | EB1 | BH1 | HB1 | ET1 | 3.6 | A | 1.5 | 15 | 0.14 | 0.05 |
| Comp. 7 | HT1 | 390 | EB1 | BH1 | HB1 | ET1 | 5.3 | B | 6.5 | 130 | 0.14 | 0.05 |

In the organic EL devices of Example 1 and Comparatives 5 to 7, having the same structure except for a different film thickness of the hole transporting layer, the organic EL device of Example 1, in which the film thickness of the hole transporting layer was in a range from 100 nm to 300 nm, exhibited the values of the current efficiency and "L/J/CIEy" both higher than those of the organic EL devices of Comparatives 5 and 6, in which the film thickness of the hole transporting layer was less than 100 nm, and those of the organic EL device of Comparative 7, in which the film thickness of the hole transporting layer was more than 300 nm. Moreover, the organic EL device of Comparative 7 exhibited a higher drive voltage than that of Example 1.

In other words, it has been found that the organic EL device of Example 1 can emit light with a high efficiency by an emitting layer interposed between the anode and the cathode;
a hole transporting zone interposed between the anode and the emitting layer; and
an electron transporting zone interposed between the cathode and the emitting layer, wherein
the hole transporting zone comprises a first layer interposed between the anode and the emitting layer, and a second layer interposed between the first layer and the emitting layer,
the first layer comprises a first compound,
the second layer comprises a second compound,
a film thickness d1 of the first layer satisfies a formula (1),
a film thickness d2 of the second layer satisfies a formula (2), a hole mobility $\mu^{H1}$ of the first compound satisfies a formula (3), and a hole mobility $\mu^{H2}$ of the second compound satisfies a formula (4), $$100 \text{ nm} \leq d1 \leq 300 \text{ nm} \quad (1)$$

$$1 \text{ nm} \leq d2 \leq 20 \text{ nm} \quad (2)$$

$$1.0 \times 10^{-4} \text{ [cm}^2\text{/Vs]} \leq \mu^{H1} \leq 1.0 \times 10^{-1} \text{ [cm}^2\text{/Vs]} \quad (3)$$

$$1.0 \times 10^{-10} \text{ [cm}^2\text{/Vs]} \leq \mu^{H2} \leq 1.0 \times 10^{-6} \text{ [cm}^2\text{/Vs]} \quad (4).$$

2. The organic electroluminescence device according to claim 1, wherein
the second layer is adjacent to the emitting layer.

3. The organic electroluminescence device according to claim 1, wherein
the first layer is adjacent to the second layer.

4. The organic electroluminescence device according to claim 1, wherein
the hole transporting zone further comprises a third layer interposed between the first layer and the anode, the third layer comprising a third compound.

5. The organic electroluminescence device according to claim 1, wherein
the electron transporting zone comprises a fourth layer interposed between the cathode and the emitting layer, and a fifth layer interposed between the fourth layer and the emitting layer,
the four layer comprises a fourth compound,
the fifth layer comprises a fifth compound, and
an electron mobility $\mu^{E4}$ of the fourth compound is larger than an electron mobility $\mu^{E5}$ of the fifth compound.

6. The organic electroluminescence device according to claim 5, wherein
an electron affinity Af of the fourth compound is 2.0 eV or more.

7. The organic electroluminescence device according to claim 6, wherein
the electron affinity Af of the fourth compound is 2.2 eV or more.

8. The organic electroluminescence device according to claim 1, wherein
the emitting layer comprises a host material and a dopant material, and
the host material comprises a triplet exciton level of 2.0 eV or less.

9. The organic electroluminescence device according to claim 8, wherein
a ratio $\mu^{He}/\mu^{Hh}$ of an electron mobility $\mu^{He}$ the host material to a hole mobility $\mu^{Hh}$ of the host material is 10000 or more.

10. The organic electroluminescence device according to claim 8, wherein
the dopant material is a fluorescent material.

11. The organic electroluminescence device according to claim 10, wherein
the fluorescent material emits a blue light.

12. The organic electroluminescence device according to claim 10, wherein
a main peak wavelength of an emission spectrum of the fluorescent material is in a range from 400 nm to 700 nm.

13. The organic electroluminescence device according to claim 1, wherein
a content of the first compound accounts for 90 mass % or more in the entire first layer, and
a content of the second compound accounts for 90 mass % or more in the entire second layer.

14. The organic electroluminescence device according to claim 1, wherein
the organic electroluminescence device emits a blue light.

15. The organic electroluminescence device according to claim 1, wherein
the organic electroluminescence device comprises a main peak wavelength in a range from 430 nm to 480 nm.

16. An organic electroluminescence apparatus comprising:
a first device that is the top emission organic EL device according to claim 1;
a second device that is an organic electroluminescence device different from the fluorescent first device; and
a substrate, wherein the first device and the second device are mutually juxtaposed on the substrate, and at least one of the first layer or the second layer of the first device is a common layer provided over the first device and the second device in a shared manner.

17. An electronic device comprising: the top emission organic electroluminescence device according to claim 1.

18. An electronic device comprising the organic electroluminescence apparatus according to claim 16.

* * * * *

UNITED STATES PATENT AND TRADEMARK OFFICE
CERTIFICATE OF CORRECTION

PATENT NO. : 11,456,432 B2
APPLICATION NO. : 16/759788
DATED : September 27, 2022
INVENTOR(S) : Takayasu Sado et al.

It is certified that error appears in the above-identified patent and that said Letters Patent is hereby corrected as shown below:

In the Claims

Claim 8, Column 69, Line 45:
Please delete:
"the host material comprises a triplet exciton level of 2.0"
Please replace with:
the host material comprises a triplet exciton level T1 of 2.0

Claim 9, Column 70, Line 3:
Please delete:
"a ratio $\mu^{He}/\mu^{Hh}$ of an electron mobility $\mu^{He}$ the host"
Please replace with:
a ratio $\mu^{He}/\mu^{Hh}$ of an electron mobility $\mu^{He}$ of the host Signed and Sealed this
Twenty-eighth Day of February, 2023

Katherine Kelly Vidal
*Director of the United States Patent and Trademark Office*